(12) United States Patent
Imai et al.

(10) Patent No.: US 6,632,744 B2
(45) Date of Patent: Oct. 14, 2003

(54) MANUFACTURING METHOD OF SEMICONDUCTOR INTEGRATED CIRCUIT DEVICE

(75) Inventors: Akira Imai, Hachioji (JP); Katsuya Hayano, Akishima (JP); Norio Hasegawa, Nishitama (JP)

(73) Assignee: Hitachi, Ltd., Tokyo (JP)

( * ) Notice: Subject to any disclaimer, the term of this patent is extended or adjusted under 35 U.S.C. 154(b) by 105 days.

(21) Appl. No.: 09/903,580

(22) Filed: Jul. 13, 2001

(65) Prior Publication Data
US 2002/0006734 A1 Jan. 17, 2002

(30) Foreign Application Priority Data
Jul. 14, 2000  (JP) ........................................ 2000-215093

(51) Int. Cl.$^7$ ................................................. H01L 21/00
(52) U.S. Cl. .................... 438/692; 438/719; 438/725; 438/734; 438/736
(58) Field of Search ........................... 438/692, 712, 438/719, 723, 725, 734, 736, 743

(56) References Cited

U.S. PATENT DOCUMENTS 5,750,441 A * 5/1998 Figura et al. ............ 438/736 X
6,063,656 A * 5/2000 Clampitt ................. 438/734 X

FOREIGN PATENT DOCUMENTS

| JP | 5-19446 | 1/1993 |
| JP | 6-123963 | 5/1994 |
| JP | 6-289591 | 10/1994 |
| JP | 8-297359 | 11/1996 |
| JP | 11-84625 | 3/1999 |

* cited by examiner

Primary Examiner—William A. Powell
(74) Attorney, Agent, or Firm—Antonelli, Terry, Stout & Kraus, LLP

(57) ABSTRACT

Densely disposed patterns constituting a semiconductor integrated circuit device are divided into a first mask pattern and a second mask pattern 28B such that a phase shifter S can be disposed, and a predetermined pattern is transferred on a semiconductor substrate by multiple-exposure thereof. The second mask pattern 28B has a main light transferring pattern 26c1, a plurality of auxiliary light transferring patterns 26c2 disposed thereabout, and a phase shifter S disposed in the main light transferring pattern 26c1. The auxiliary light transferring patterns 26c2 are disposed such that respective distances from a center of each thereof to a center of the main light transferring pattern 26c1 are substantially equal. With this arrangement, a densely disposed pattern is transferred with sufficient process transfer margin.

42 Claims, 52 Drawing Sheets

*Fig. 54*
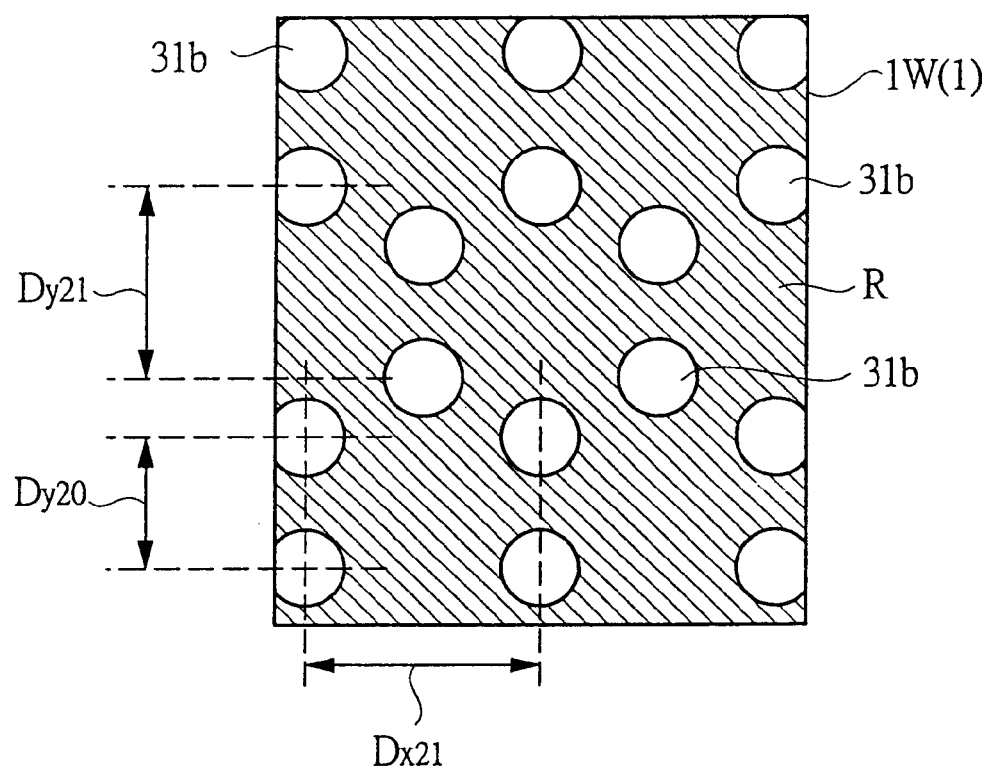
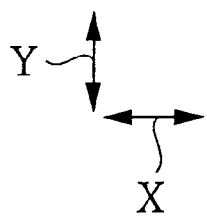

MANUFACTURING METHOD OF SEMICONDUCTOR INTEGRATED CIRCUIT DEVICE

TECHNICAL FIELD OF THE INVENTION

The present invention relates to a manufacturing technique of a semiconductor integrated circuit device and, more particularly, to a technique effectively applied to an exposure technique in a manufacturing process of the semiconductor integrated circuit device.

BACKGROUND OF THE INVENTION

An extremely fine pattern of a solid element such as large-scale semiconductor integrated circuit or the like is formed by using chiefly a reduction projection exposure method that is one of optical lithography methods. This method is a method of reducing and transferring a mask pattern formed by a photomask or a reticle (called a mask hereinafter), onto a substrate by use of an imaging optical system.

Improvement of resolution in the reduction projection exposure method is advanced by high numerical aperture in the imaging optical system and short wavelength of exposed light. However, since there are needs of more extreme fineness for least process size of the solid element than the above-mentioned improvement, a deformed illumination exposure method or a phase shift mask exposure method, so-called a super resolution exposure method is developed and applied.

The phase shift mask exposure method includes, for example, a Levenson type phase shift mask, a halftone type phase shift mask, an auxiliary pattern arrangement type phase shift mask, and the like. The Levenson type phase shift mask is a mask generating a phase difference of 180 degrees between light beams that permeate regions between adjacent apertures (light permeating region) on the mask. The Levenson type phase shift mask also has an effect on further improvement of the resolution thereof within regions in which pattern-arranged pitches are extremely fine. For example, if a Levenson type phase shift mask is used, a reduction projection exposure method using KrF excimer laser light can eminently improve resolving characteristics even within a size region less than a least process size whose sufficient resolution is difficult to obtain in the case of use of normal masks. Further, the halftone type phase shift mask is a mask in which a halftone film is formed on a mask substrate instead of a light shield film. The halftone film has functions of making exposed light beams be permeated some percents and of generating a phase difference of 180 degrees between exposed light beams permeating the halftone film and permeating apertures around which the halftone film is removed.

And, the auxiliary pattern arrangement type phase shift mask is a mask having such a size as not to resolve on a semiconductor wafer around a main aperture and arranging auxiliary patterns for generating a phase difference of 180 degrees between exposed light beams permeating the main aperture. The auxiliary pattern arrangement type phase shift mask can be used when mask patterns are not arranged densely. For example, in a mask pattern for transferring isolated hole patterns, there is a structure of arranging auxiliary patterns which have such a size as not to be transferred on the semiconductor wafer of a plane surface containing upper, lower, right and left side of the main aperture and which generate a shift difference of 180 degrees relative to exposed light beams permeating the main apertures. This results in improvement of a light intensity profile of the main aperture and enhancement the resolving characteristics. This method is described in Japanese Patent Laid-open No. 5-19446, which discloses a technique of disposing auxiliary patterns on an end of dense patterns and around isolated patterns in order to enhance resolution of the dense patterns end and the like. Further, for example, Japanese Patent Laid-open No. 6-123963 discloses a technique of disposing respective auxiliary patterns such that light beams permeating respective adjacent patterns do not interfere with one another, or a technique of disposing one auxiliary pattern relative to the main aperture when the auxiliary patterns are arranged between the adjacent patterns. And, for example, Japanese Patent Laid-open No. 6-289591 discloses a technique of disposing auxiliary patterns in a symmetrically shifted manner in order to enhance flexibility in arrangement of the main apertures. Further, for example, Japanese Patent Laid-open No. 8-297359 discloses a technique of making layouts of mask patterns such that one main aperture and one auxiliary pattern are handled as one unit in order to facilitate the layouts of the mask patterns. And, for example, Japanese Patent Laid-open No. 11-84625 discloses a structure of disposing main apertures, auxiliary patterns, and shifters arranged like zigzag at dense main apertures, and of arranging the auxiliary patterns at each end of memory mats.

SUMMARY OF THE INVENTION

However, the present inventors have found that the above optical lithography technique has the following problems.

That is, although a technique of the Levenson type phase shift mask as described above is effective to enhance the resolution of extremely fine pattern being dense, phase shifters must be disposed such that each of phase difference of light beams permeating respective main apertures adjacent to one another is 180 degrees. Therefore, there occurs the problem that the phase shifters can not be disposed appropriately owing to arrangement of the mask patterns.

In the technique of the auxiliary pattern arrangement type phase shift mask, if auxiliary shifter patterns are arranged in an upper, lower, left or right directions, or in an oblique direction of 45 degrees of the main aperture, light beams permeating the adjacent auxiliary patterns interfere with each other, so that there is the problem that the auxiliary patterns can not be disposed appropriately.

That is, as fine patterns becomes high dense, it is difficult to merely dispose the phase shifters and auxiliary patterns. Therefore, there is the problem that when the patterns are transferred, sufficient tolerance of process thereof can not be ensured, transfer characteristic badness such as pattern-shape badness, and size-precision deterioration, and the like are brought, and fineness and high density of the patterns are impaired.

An object of the present invention is to provide a technique capable of transferring a semiconductor integrated circuit pattern disposed densely with sufficient process tolerance.

And, an object of the invention is to provide a technique capable of enhancing the transfer characteristics of the semiconductor integrated circuit pattern.

And, an object of the invention is to provide a technique capable of achieving fineness and high density of the semiconductor integrated circuit pattern.

The above and other object and new features of the present invention will be apparent from the description of the specification and the accompanying drawings.

Of the inventions disclosed in the present application, outlines of typical inventions are briefly described as follows:

That is, in the present invention, dense patterns are divided into a plurality of mask patterns capable of disposing phase shifters, and a predetermined pattern is transferred onto a semiconductor substrate by multiple-exposure thereof.

Further, the present invention has: a step of depositing a positive type photoresist film on a semiconductor substrate; a first exposure step of exposing a first mask pattern on said positive type photoresist film; a second exposure step of exposing a second mask pattern on said positive type photoresist film so as to be superposed on said first mask pattern; a step of performing development treatment relative to said positive type photoresist film after said first and second exposure steps and thereby forming a photoresist pattern formed of a positive type photoresist film on said semiconductor substrate; and a step of performing etching treatment relative to said semiconductor substrate by using said photoresist pattern as a mask and thereby transferring a predetermined pattern on said semiconductor substrate, wherein said first mask pattern has: a pattern for transferring a line pattern; and wherein the second mask pattern has a plurality of main light transferring patterns for separating said line pattern; a plurality of auxiliary light transferring patterns disposed such that distances between each of said main light transferring patterns and each of the auxiliary light transferring patterns thereabout the same and formed at such a dimension as not to be transferred on said positive type photoresist film; and a phase shifter disposed in any one of the main light transferring patterns and the auxiliary light transferring patterns and generating a phase difference in each transmission light.

Additionally, the invention has: a step of depositing a positive type photoresist film on a semiconductor substrate; a first exposure step of exposing a first mask pattern on said positive type photoresist film; a second exposure step of exposing a second mask pattern on said positive type photoresist film so as to be superposed on said first mask pattern; a step of performing development treatment relative to said positive type photoresist film after said first and second exposure steps and thereby forming a photoresist pattern formed of a positive type photoresist film on said semiconductor substrate; and a step of performing etching treatment relative to said semiconductor substrate by using said photoresist pattern as a mask and thereby transferring a predetermined pattern on an insulative film of said semiconductor substrate, wherein said first mask pattern has a pattern for transferring a first hole pattern of said hole pattern; and wherein said second mask pattern has: a plurality of main light transferring patterns for transferring a second hole pattern of said hole pattern; a plurality of auxiliary light transferring patterns disposed such that a distance between each of said main light transferring patterns and each of the auxiliary light transferring patterns is the same thereabout and formed at such a dimension as not to be transferred on said positive type photoresist film; and a phase shifter disposed in any one of said main light transferring pattern and auxiliary light transferring pattern and generating a phase difference in each transferring light.

BRIEF DESCRIPTIONS OF THE DRAWINGS

FIG. 52A is a plane view of an essential portion of the photoresist pattern for forming contact holes shown in FIG. 11 and the like.

FIG. 53A is a plane view of an essential portion of a photoresist pattern having a first mask pattern for forming the contact holes shown in FIG. 11 and the like.

FIG. 54 is a plan view of an essential portion of the photoresist pattern schematically showing a case where only the first mask pattern shown in FIG. 53 is exposed onto a positive type photoresist film.

FIG. 57A is a plan view of an essential portion of photomask used for forming a word line (gate electrode) shown in FIG. 5 and the like.

FIG. 58A is plan view of an essential portion of a mask 26 used for forming through holes for data line shown in FIG. 17 and the like.

FIG. 59A is plan view of an essential portion of a mask 26 used for forming a data line DL shown in FIG. 21 and the like.

FIG. 60A is plan view of an essential portion of a mask used for forming through holes for information storage capacity element shown in FIG. 25 and the like.

FIG. 61A is plan view of an essential portion of a mask used for forming holes shown in FIG. 34 and the like.

DESCRIPTION OF THE PREFERRED EMBODIMENTS

Figure 1:
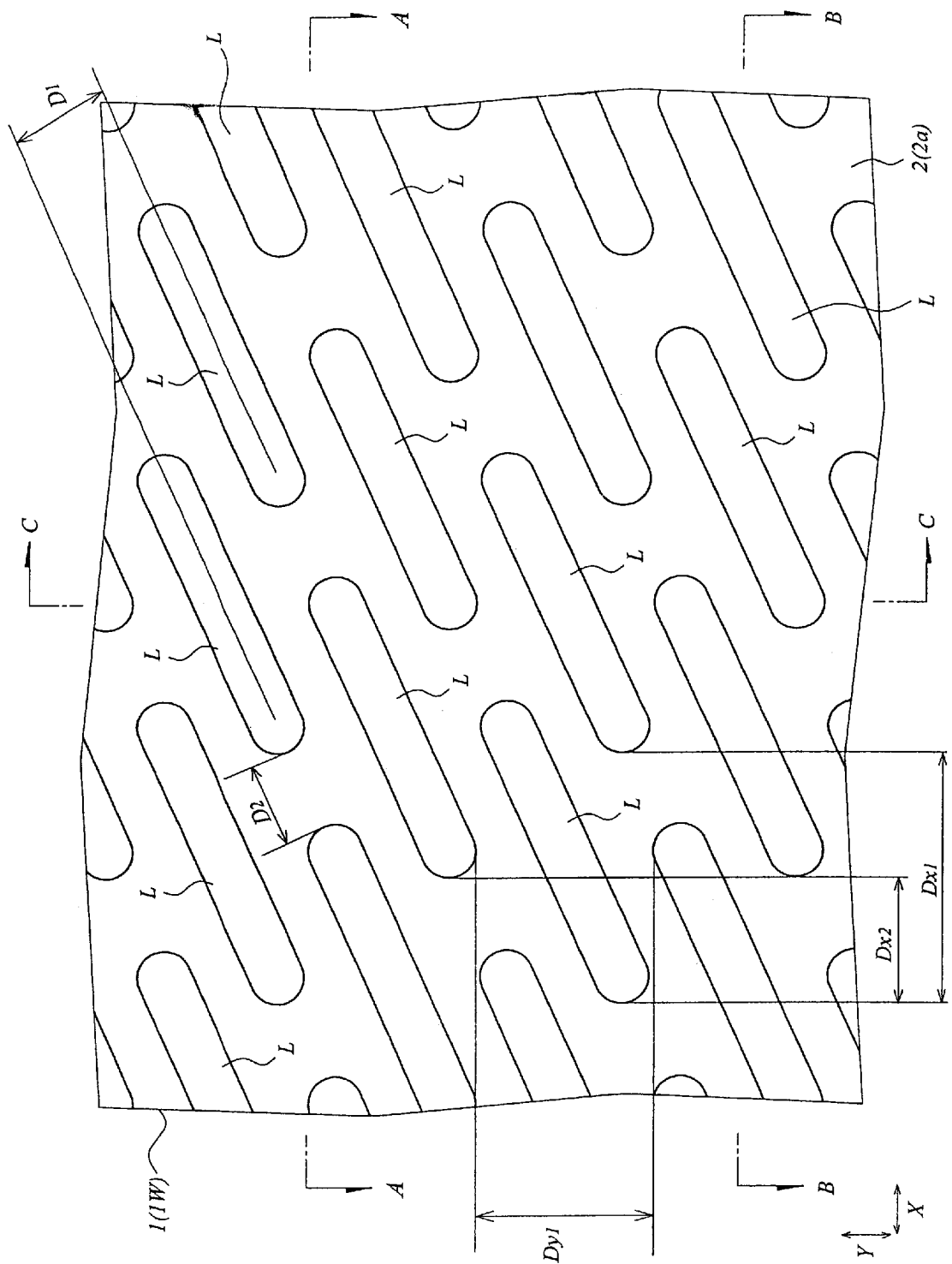
FIG. 1 is a plan view of an essential portion in a manufacturing process of a semiconductor integrated circuit device that is one embodiment of the present invention.

1. Ultraviolet light: In a semiconductor field, ultraviolet light means electromagnetic wave having wavelength of about 400 nm to short wavelength of about 50 nm. A region having long wavelength longer than 300 nm is called near-ultraviolet region, and a region having a short wavelength of 300 nm or less is called far-ultraviolet region, and a region having wavelength of 200 nm or less is particularly called vacuum-ultraviolet region. Examples of light source are i line (wavelength: 365 nm) such as mercury arc lamp or the like, KrF excimer laser (wavelength: 248 nm), ArF (wavelength: 193 nm) excimer laser, and $F_2$ (wavelength: 157 nm) excimer laser.

2. Scanning Exposure: Scanning exposure is an exposure method of transferring a circuit pattern on a photomask, to a desired portion on a semiconductor wafer, by moving (scanning) relatively and continuously a thin slit-like exposure band in a vertical direction relative to a longitudinal direction of slits (or may move diagonally), against a semiconductor wafer and a photomask (or reticle, and description of the photomask used in the present application means a broad notion including the reticle.).

3. Step and scan exposure: this is a method of exposing the entire portion to be exposed on a wafer, by combining the scanning exposure as mentioned above and stepping exposure, and corresponds to an inferior notion of the scanning exposure.

4. Photomask (optical mask): this is a mask having light shielding patterns or light phase changing patterns formed on a substrate. The term "on substrate" includes an upper surface of the substrate, and an inner or above region close to the upper surface of the substrate (or may be disposed on another substrate close to the upper surface). The term "normal photomask" (binary mask) means a general photomask having a mask pattern formed by light shielding patterns and light transferring patterns on the substrate. The photomask is simply called a mask hereinafter.

5. Substrate trench shifter: This is a phase shifter forming recesses in a surface of a transparent mask substrate itself such as quartz. The term "surface of the substrate itself" includes something forming a film similar to material of a substrate, on a surface of the substrate.

6. On-substrate thin film trench shifter: this is a thin shifter forming a shifter film having a thickness suitable for the purpose of functioning as a shifter, under a light shielding film of the substrate, and then being formed by utilizing or the like difference in etching speed of a backing substrate or the like.

7. Trench shifter: this is a superior notion containing the above-mentioned substrate trench shifter and on-substrate thin film trench shifter and the like, and is a general shifter forming recesses in a transparent film, a transparent substrate or the like that is at a layer lower than a light shield film. On the other hand, a system of arrangement of a shifter film on a light shielding film is called on-arrangement system of a shifter film or on-arrangement shifter.

8. A fine visor type trench shifter: this corresponds to a case of 40% or less ($P/\lambda=40\%$ is called "visor length") of a length P of a overhang-shaped (or visor-shaped) projecting portion that a light shielding film has from an upper end of a side wall of a recess which a quartz substrate or the like has, to an inner side of the recess around the trench shifter (in a cross-sectional direction of a narrow wideness) if a wavelength $\lambda$ of a monochromatic exposure light is set to a reference.

9. Shifter depth: depth of digging in a substrate of a shifter portion depends on exposure wavelength. A depth Z for inverting a phase by 180 degrees thereof is expressed as $$Z=\lambda/(2(n-1)),$$

where n represents index of refraction of a substrate relative to exposure light having a predetermined exposure wavelength, and $\lambda$ represents the exposure wavelength.

10. Phase shifter (phase shift mask pattern): this is a circuit pattern on a mask, which includes a mask aperture pattern having at least one phase shifter. The phase shifter is, for example, a group of circuit patterns provided on the mask, which correspond to a single shot region (an area to be exposed by one step) of a stepping exposure or a region exposed by a single scanning of the scanning exposure, and means, for example, an unit chip provided on the semiconductor wafer or a mask pattern (a circuit pattern) corresponding to integer times thereof on the mask substrate.

11. Auxiliary light transferring pattern (auxiliary mask pattern): this means, when generally projected onto a semiconductor wafer, an aperture pattern provided on a mask which does not form an independent image corresponding to the aperture pattern thereof.

12. Levenson type phase shift mask: this is also called a space frequency modulating type phase shift mask. This is a phase shift mask, which is generally isolated in a light shield region by a light shield film and is provided with a plurality of apertures close to each other and comprises an aperture group whose phases are alternately reversed. If roughly classified, this mask can be classified into a line-and-space pattern, and an alternately reversed hole pattern (also called a Levenson pattern for contact hole).

13. Auxiliary pattern arrangement type phase shift mask: if roughly classified, this can be classified into an independent line pattern and an aperture pattern. Typical examples of the former are a real aperture pattern and auxiliary shift patterns (this phase-reversed pattern is also an equivalence) provided on both sides thereof. A typical example of the latter is an outrigger type hole pattern (comprising a real aperture provided at center thereof and a plurality of auxiliary apertures provided around the real aperture). However, since an end or a periphery of the mask pattern of the Levenson type phase shift mask is provided with the auxiliary apertures and the auxiliary shifter, both patterns are mixed to be actually a mixed pattern in many cases.

14. Phase shift mask: a phase shift mask simply described in the present application means these masks.

15. Semiconductor wafer (described simply as wafer hereinafter) or a semiconductor substrate includes a silicon single crystal substrate, an SOI substrate (generally, substantially flat circular shape), a sapphire substrate, a glass substrate, other insulation or non-insulation or semiconductor substrate and the like, and a compound substrate thereof. Also, the term "semiconductor integrated circuit device" described in the present application includes a semiconductor such as silicon wafer or the sapphire substrate or the like, or something formed on an insulative substrate, or, in particular, something formed on other insulative substrate formed of glass or the like such TFT (Thin-Film-Transistor) and an STN (Super-Twisted-Nematic) liquid crystal except for a case of being specified otherwise.

16. The term "light shielding region, light shielding pattern, light shielding film or light shield" means to have optical characteristics of permeation less than 40% of exposure light radiated on regions thereof. Generally, one having the optical characteristics of permeation less than 30% of exposure light from some % is used. On the other hand, the term "light permeating region", "light transferring pattern", "transparent region", "transparent film" or "transparent" means to have optical characteristics of permeation more than 60% of exposure light radiating on regions thereof. Generally, one having the optical characteristics of permeation more than 90% of exposure light.

17. A photoresist pattern is a film pattern obtained by subjecting a light-sensitive organic film to patterning by a technique of photolithography. This pattern includes a simple resist film having no aperture on the corresponding portion.

18. Normal illumination means unchanging illumination, and illumination having relatively uniform light intensity distribution.

19. Changing illumination means illumination that reduces intensity thereof at center thereof, and includes diagonal illumination, band illumination, multiple illumination such as quadplex illumination or quintuple illumination or the like, and super resolution technique using pupil filter that is equivalence thereto.

20. Resolution: a pattern size can be expressed by standardizing numerical aperture NA of a projection lens and exposure wavelength $\lambda$. The present embodiments mainly use KrF excimer laser of exposure wavelength of 248 nm, and the projection lens NA of 0.68. Therefore, in the case of use of different wavelength and different lens NA, the resolution R is expressed as $R = K1 \cdot \lambda / NA$ (K1 is a certain constant determined as depending upon process), so that the resolution may be converted and used. However, a focus depth D is also expressed as $D = K2 \cdot \lambda / (NA)^2$ (K2 is a certain constant determined as depending upon process), so that the depth is also different therefrom.

21. Transfer pattern: this is a pattern transferred onto a wafer by a mask, and more specifically means the above-mentioned photoresist pattern and a pattern provided on a wafer really forming a photoresist pattern as a mask.

22. Hole pattern: this means a fine pattern such as a contact hole and a through hole having two dimensional size equal to or smaller than exposure wavelength on a wafer. In generally, shape thereof is square, or rectangle close to the square, or octagon on a mask, or the like, but is circular on the wafer in many cases.

23. Line pattern: this means a band-like pattern extending in a predetermined direction.

Embodiments will be described by dividing a plurality of sections or sub groups if necessary for the sake of expediency, but, except for a case of being particularly specified, relationship between the plurality of sections or sub groups has nothing to do with one another but one of them has something to do with modified, detailed or supplemented explanations, or the like of a part or all parts of the other.

And, in the case where the number (including numbers, numerical values, amounts, ranges or the like) of elements is referred to in the following embodiments, except for cases of being specified particularly and of restricting in principle and evidently the specified number and the like, the embodiments are not limited to the specified number, and may have more or less than the specified number.

Moreover, needless to say, constituent elements (also including elemental steps or the like) in the following embodiments are not necessary essential, except for cases of be specified particularly, and thought as essential in principle and evidently, and the like.

Similarly, in the following embodiment, when shapes, positional relations and the like of the constituent elements are referred to, other shapes and the like close or similar to the above-mentioned shapes and the like are substantially included therein too, except for cases of being specified particularly and of not being in principle and evidently thought so, and the like. These are similarly true of the above-mentioned numerical values and ranges.

And, in all of the drawings used for explaining the embodiments, members having the same functions are designated with the same symbols, and repetitive explanation thereof will be omitted.

And, in the drawings used for explaining the embodiments, even plan views schematically showing a mask or its data have light shielding patterns and phase shifters that are hatched, in order to see easily the drawing thereof.

Embodiment 1

In the embodiment 1, one example, in which the present invention is applied to a manufacturing process of large-scale semiconductor integrated circuit elements in 1 G (giga) bit DRAM (Dynamic Random Access Memory) class having minimum design size of about 130 nm, will be explained.

First, one example of a manufacturing method of the DRAM will be explained. Here, a structure thereof in the manufacturing process of the DRAM will be mainly explained, and an exposure technique (including a structure of the above-mentioned mask) for forming the structure will be explained hereinafter. The explanation will be made such that a right and left horizontal direction is defined as an X direction and an up and down direction is defined as a Y direction in plan views used here. An imaginary axis extending in the X direction is defined as an X axis, and an imaginary axis extending in the Y direction is defined as a Y axis. As a memory cell pattern, a pattern layout of one intersecting point memory cell type (or open bit line type) is illustrated.

Figure 2:
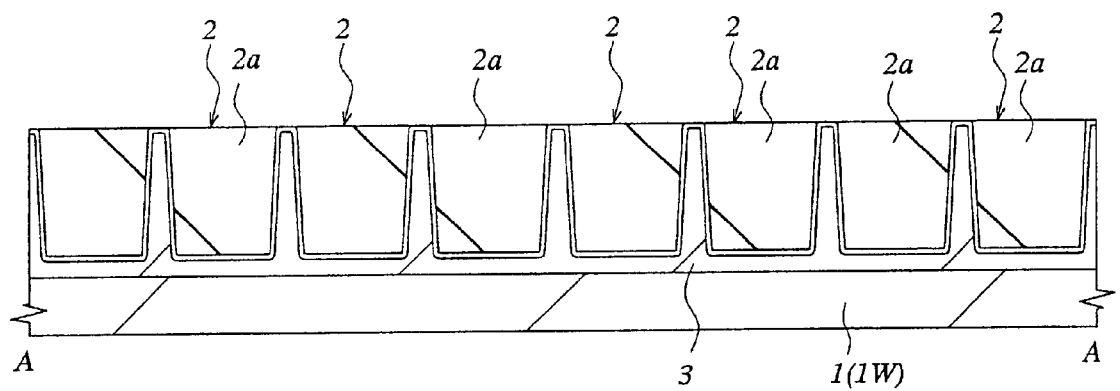
FIG. 2 is a cross-sectional view taken along A—A line of FIG. 1.
Figure 3:
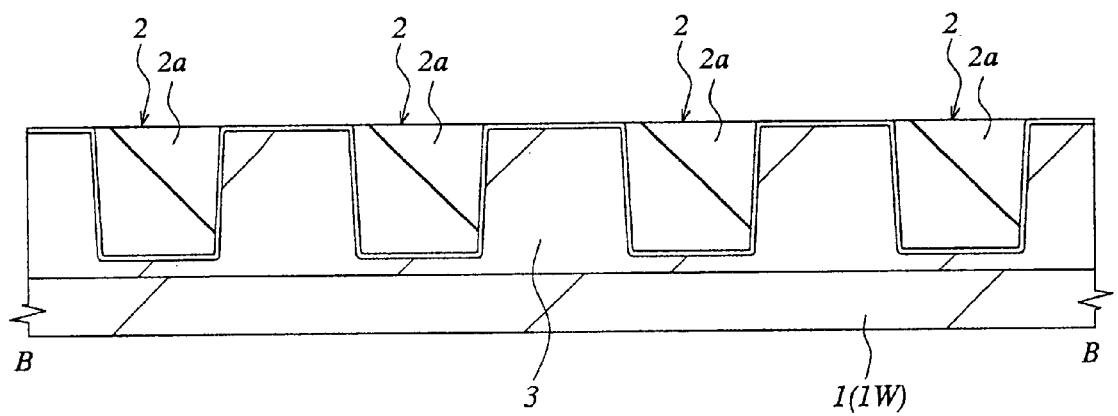
FIG. 3 is a cross-sectional view taken along B—B line of FIG. 1.
Figure 4:
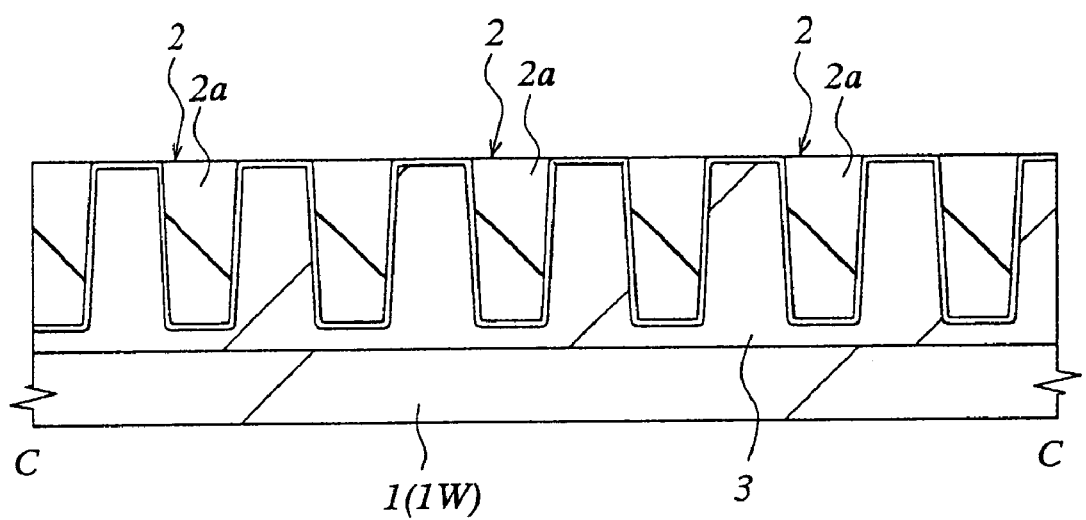
FIG. 4 is a cross-sectional view taken along C—C line of FIG. 1.

FIG. 1 is a plan view of an essential portion of a memory array in the manufacturing process of the DRAM. FIGS. 2 to 4 are cross-sectional views taken along lines A—A, B—B and C—C of FIG. 1, respectively. A semiconductor substrate (simply called substrate hereinafter) 1 constituting a wafer 1W comprises a p-type single crystal silicon. In a separating region of a main surface of the substrate 1, for example, a separating portion (a trench isolation) 2 of a groove type is formed. The separating portion 2 is formed by embedding an insulative film into a trench dug in the substrate 1. In the substrate 1, a plurality of active regions L are formed by the separating portion 2. As shown in FIG. 1, a periphery of each active region L is formed like a flat-surface-island-shaped pattern extending thin and long in a diagonal direction relative to left-right and upper-lower (horizontal and vertical: XY) directions of FIG. 1. In each active region L, for example, two memory sell selecting MIS•FETs are formed such that one of respective sources and drains thereof is used commonly with the other.

An arrangement pitch (a pitch: a distance between centers of objective patterns) Dy1 extending in the Y direction of each active region L is about 420 nm (converted to wafer size), for example. An arrangement pitch Dx1 between the active regions L extending in the X direction is about 520 nm (converted to wafer size), for example. A dimension Dx2 in which each active region L is shifted in the X direction per row of the Y direction is about 260 nm (converted to wafer size), for example. An arrangement pitch D1 between the active regions L extending in a short direction (a wide direction: a direction perpendicular to a longitudinal direction) is about 250 nm (converted to wafer size), for example. An arrangement interval (an interval: a distance between one end of objective pattern and the other end of pattern adjacent to the objective pattern) D2 of the active regions L extending in the longitudinal direction is about 160 to 180 nm (converted to wafer size), for example.

A forming method of the above-mentioned separating portion 2 of a trench type is as follows, for example. First, a photoresist pattern for forming the active region is formed on a main surface of the substrate 1. This photoresist pattern is formed such that forming regions of the active regions L are covered and other region except for the forming regions is exposed. This photoresist pattern will be explained in detail hereinafter. Next, by using the photoresist pattern as an etching mask to perform etching treatment of the substrate 1, a portion of the substrate 1 exposed from the photoresist pattern is removed by etching. This results in formation of trenches (transfer patterns), for example, having a depth of about 300 to 400 nm in the substrate 1. Then, on the substrate 1 including each inside of the trenches, for example, insulative films 2a formed of a silicon oxide film are deposited to a thickness of about 600 nm by using a CVD (Chemical Vapor Deposition) method. Each insulative film 2a is formed in such a manner that, for example, oxygen (or ozon) and tetraethoxysilane (TEOS) are deposited by a plasma CVD method using source gas, and then dry oxidization of about 1000° C. is performed to densify each film. Thereafter, each insulative film 2a is polished by a chemical mechanical polishing (CMP) method. At this time, a surface of each insulative film 2a deposited in each trench is flattened such that height thereof becomes substantially the same as that of each surface of the active regions L. The trench-shaped separating portion 2 is formed in this manner.

Then, boric acid (B) is ion-implanted into the substrate 1 to form a p-type well 3, and then a surface of the p-type well 3 is cleaned with cleaning liquid of hydrogen fluoride (HF) system. Thereafter, the substrate 1 is thermally oxidized to form a clean gate insulative film 4 of a silicon oxide system on each surface of the active regions L of the p-type well 3. A thickness of the gate insulative film 4 is, for example, about 6 nm according to conversion to silicon dioxide film thickness. The gate insulative film 4 may be a silicon-nitride-system insulative film or a metal-oxide-system insulative film (tantalum oxide film, titanium oxide film or the like) having higher permittivity than a silicon-oxide-system insulative film. These insulative films are formed by making a film grow on the substrate 1 by the CVD method or a sputtering method.

Figure 5:
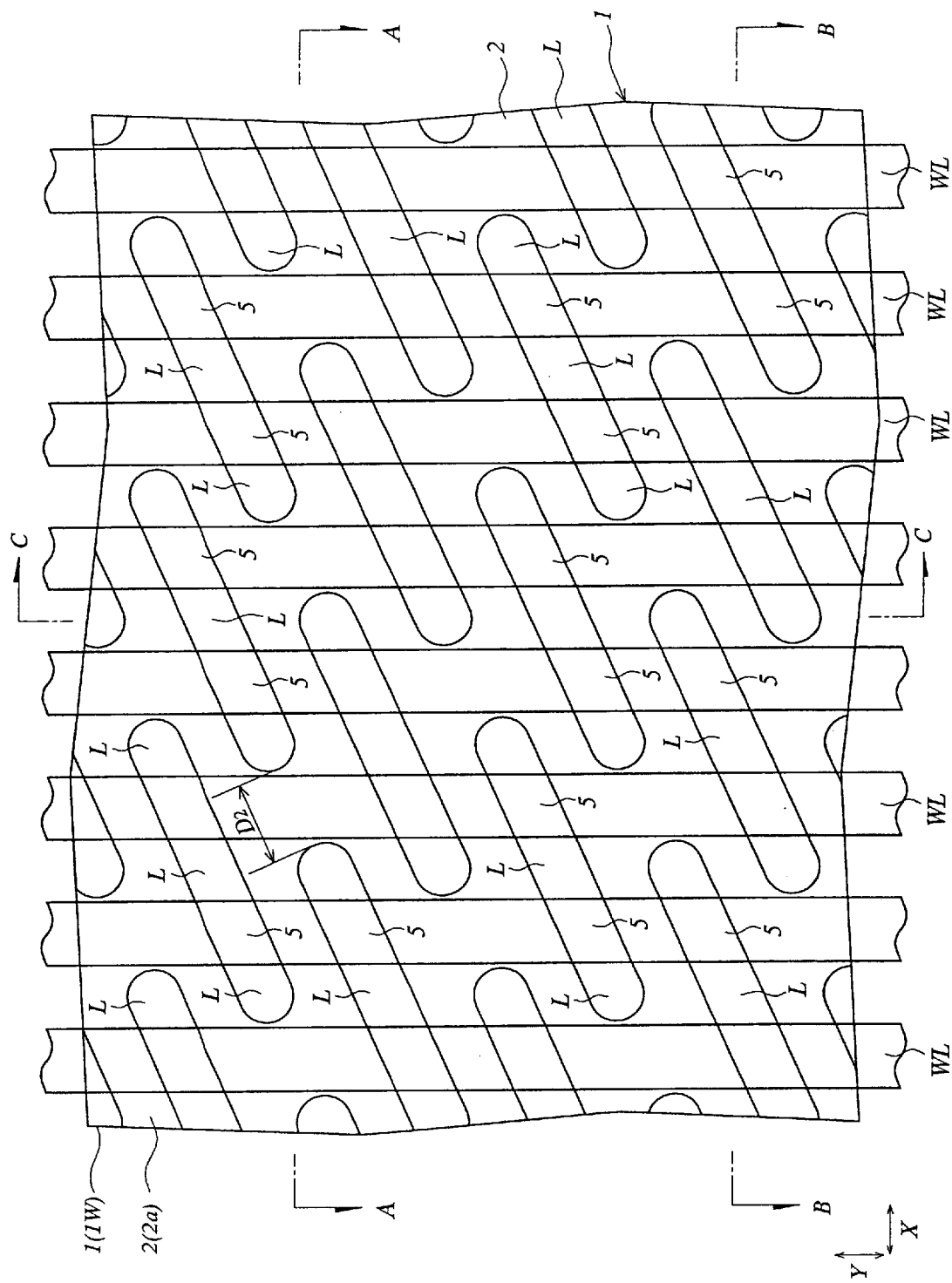
FIG. 5 is a plan view of an essential portion in the manufacturing process of the semiconductor integrated circuit device, which is subsequent to FIG. 1.
Figure 6:
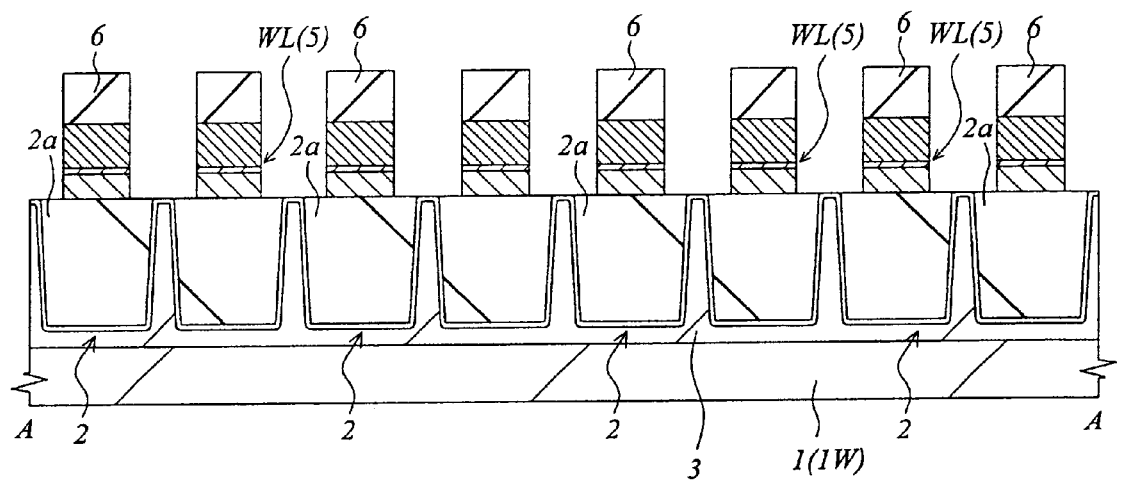
FIG. 6 is a cross-sectional view taken along A—A line of FIG. 5.
Figure 7:
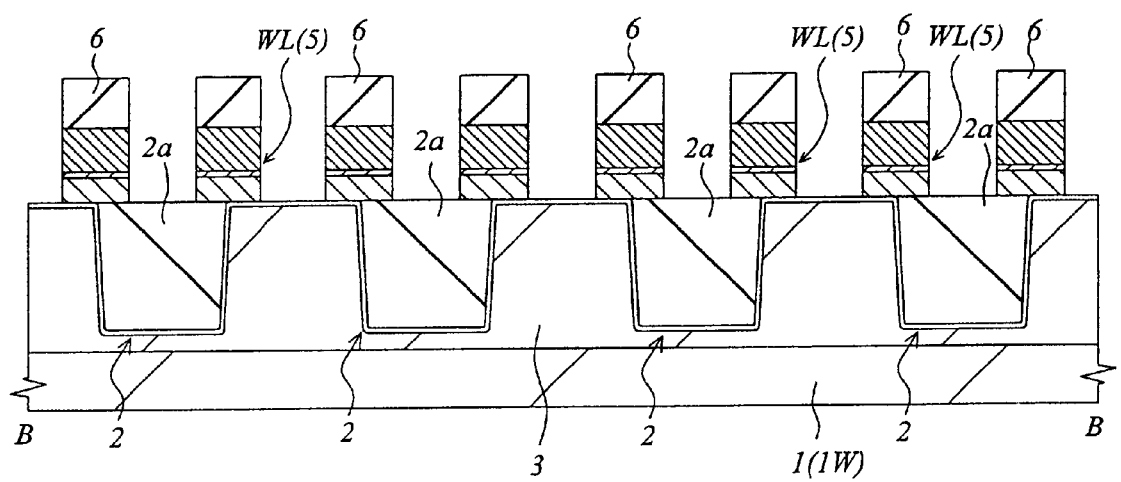
FIG. 7 is a cross-sectional view taken along B—B line of FIG. 5.

Subsequent steps are shown in FIGS. 5 to 7. FIG. 5 is a plan view of the same essential portion as FIG. 1 in the manufacturing process of the DRAM. FIGS. 6 and 7 are cross-sectional views taken along lines A—A and B—B of FIG. 5, respectively. In this step, a plurality of word lines WL (gate electrodes 5) are formed on the main surface of the substrate 1. That is, on the main surface of the substrate 1, for example, an n-type polycrystalline silicon film (having film thickness of about 70 nm) doped with phosphorus (P) or the like, a barrier metal film (having film thickness of about 5 to 10 nm) formed of tungsten nitride (WN) or titanium nitride (TiN), a tungsten (W) film (having film thickness of about 100 nm), and a gap insulative film 6 (having film thickness of about 150 nm) are deposited in this order. Then, by using as a mask photoresist patterns for forming word lines to perform dry etching of these films, the word lines WL (gate electrodes 5) are formed. The polycrystalline silicon film and the cap insulative film 6 are deposited by the CVD method, and the barrier metal film and the W film are deposited by the sputtering method. The cap insulative film 6, for example, comprises a silicon nitride film.

As shown in FIG. 5, the word lines WL are formed like flat-surface band-shaped patterns extending along the Y direction of FIG. 5, and are arranged to extend along the X direction of FIG. 5 and have a predetermined interval between the adjacent to word lines parallel to one each. These word lines WL and the above-mentioned active regions L are arranged to intersect diagonally at each other. Flat-surface superposing portions between the word lines WL and the active regions L become the gate electrodes 5 of the memory cell selecting MIS•FETs. As described above, since two memory cell selecting MIS•FETs are disposed in each active region L, two word lines WL are superposed on each active region L in two dimensions. And, in the DRAM of this structure, the arrangement interval D2 extending in the longitudinal direction of each active region L only has only a dimension enough to dispose only one word line WL.

Figure 8:
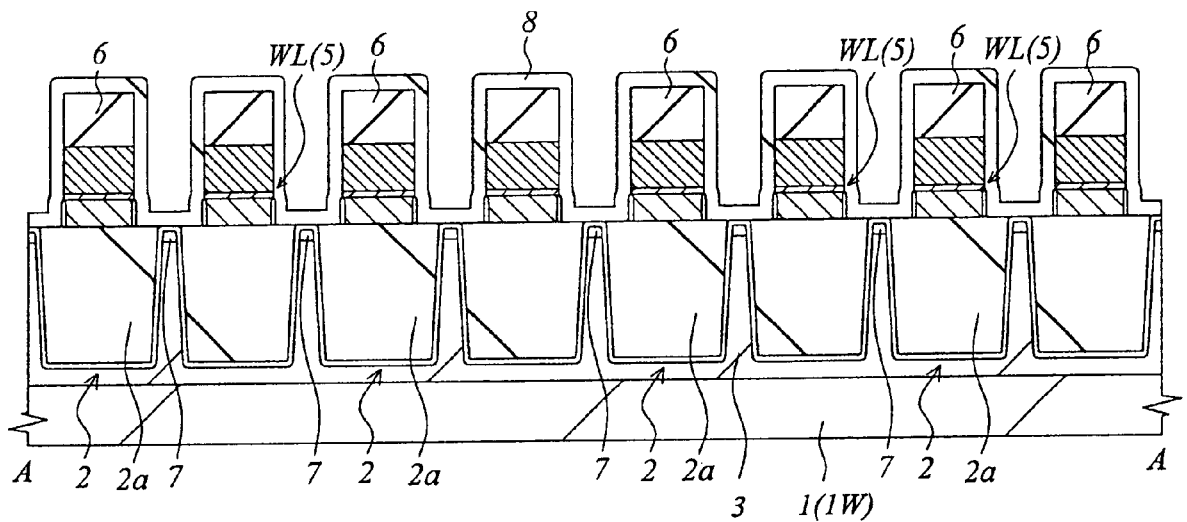
FIG. 8 is a cross-sectional view of an essential portion in the manufacturing process of the semiconductor integrated circuit device of the portion corresponding to the A—A line of FIG. 1, which is subsequent to FIG. 5.
Figure 9:
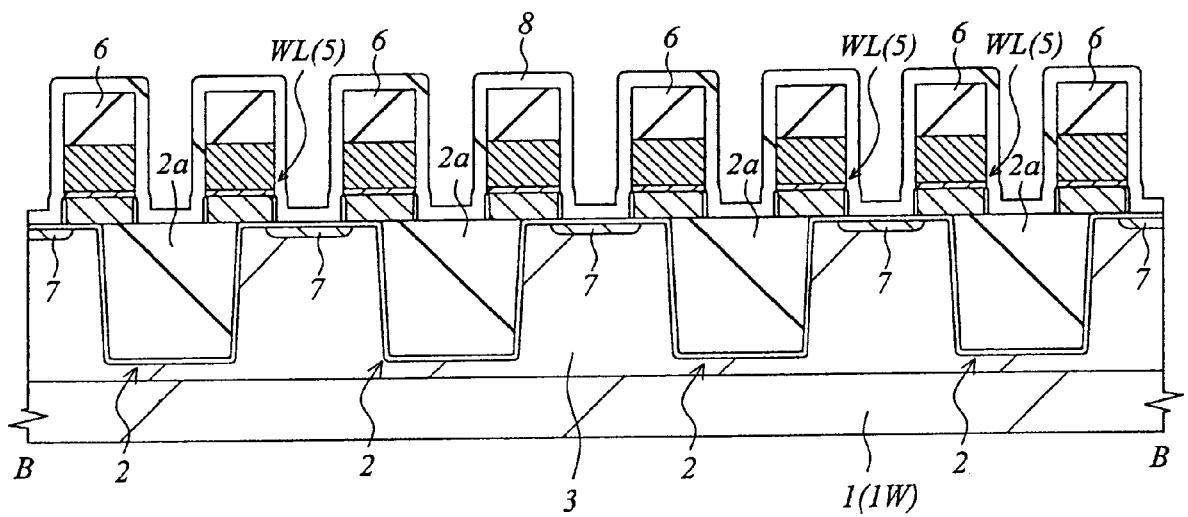
FIG. 9 is a cross-sectional view of an essential portion in the manufacturing process of the semiconductor integrated circuit device of the portion corresponding to the B—B line of FIG. 1, which is subsequent to FIG. 5.
Figure 10:
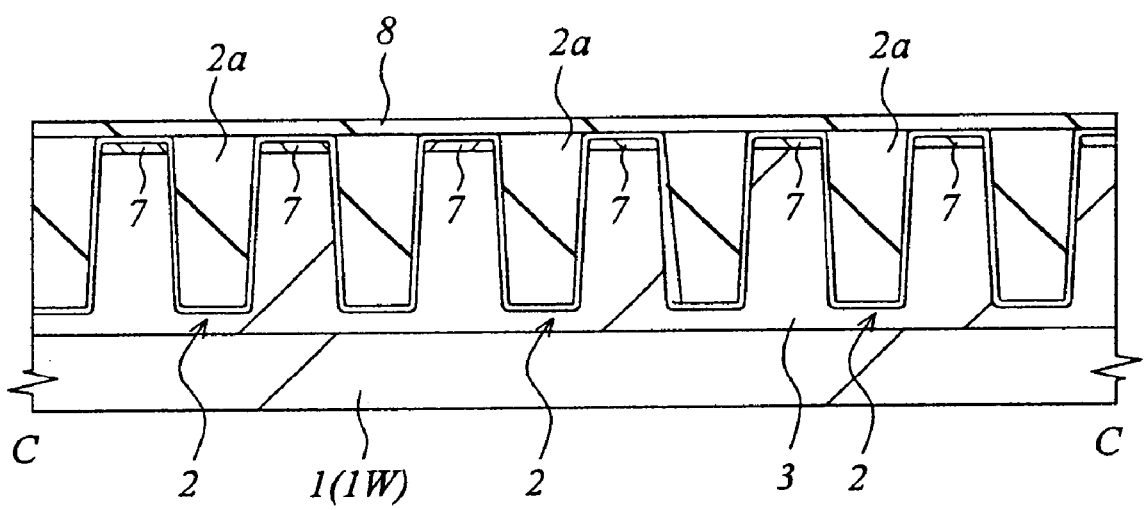
FIG. 10 is a cross-sectional view of an essential portion in the manufacturing process of the semiconductor integrated circuit device of a portion corresponding to the C—C line of FIG. 1, which is subsequent to FIG. 5.

Subsequent steps are shown in FIGS. 8 to 10. FIGS. 8 to 10 are cross-sectional views taken along lines A—A, B—B and C—C of FIG. 1, respectively. In this step, arsenic (As) or phosphorus (P) is ion-implanted into p-type wells 3 to form n-type semiconductor regions 7 (source and drain) in each of the p-type wells 3 on both sides of the gate electrodes 5. By these steps, the memory cell selecting MIS•FETQs are substantially completed. Then, an insulative film 8 formed of silicon nitride or the like is deposited on the substrate 1 to a thickness of about 50 nm by using the CVD method. The insulative film 8 is thinly coated on the surface of each word line WL without being buried between the adjacent word lines WL.

Subsequent steps are shown in FIGS. 11 to 14. FIGS. 11 to 14 are cross-sectional views taken along lines A—A, B—B and C—C of FIG. 1, respectively. In this step, after insulative film 9 is deposited in the substrate 1, substantially flat-surface-circle-shaped contact holes (first hole patterns) 10a and contact holes (second hole patterns) 10b are formed in the insulative films 9 such that each n-type semiconductor region 7 is exposed from a bottom surface. That is, firstly, the insulative films 9 formed of silicon nitride or the like are deposited on the substrate 1 to a thickness of about 600 nm by using the CVD method, and then a surface of each insulative film 9 is flattened by the chemical mechanical polishing method or the like. Then, a photoresist pattern for forming each contact hole is formed on each insulative film 9. This photoresist pattern is a pattern such that contact hole forming regions are exposed and a region other than the contact hole forming regions is covered. This photoresist pattern will be explained in detail later. Thereafter, by using the photoresist pattern as an etching mask and performing dry etching, portions of the insulative films 9 and 8 exposed from the photoresist pattern are removed by etching. This results in formation of the contact holes 10a and 10b such that each n-type semiconductor region 7 (source and drain) of the memory cell selecting MIS•FETQs is exposed from the bottom surface. This etching treatment is performed under the condition that the etching of each insulative film 9 formed of silicon oxide or the like is great in etching selection ratio to the silicon nitride film and the etching of each insulative film 8 formed of the silicon nitride is great in etching selection ratio to the silicon or silicon oxide film. By this, the contact holes 10a and 10b can be formed as self-aligns relative to the gate electrodes 5 (word lines WL).

Among the contact holes 10a and 10b, each contact hole 10a disposed at a center of each active region L is a hole pattern (a transfer pattern) for electrically connecting each n-type semiconductor region 7 and each data line. And, each contact hole 10b disposed on both sides of each active region L is a hole pattern (a transfer pattern) for electrically connecting each n-type semiconductor region 7 and each lower electrode (a storage electrode) of an information storage capacity element.

The contact holes 10a and 10b are, for example, densely disposed like a honeycomb. An arrangement pitch Dy2 between the contact holes 10a and 10b in the Y direction is about 280 nm (converted to wafer size), for example. A dimension Dy3 in which the respective contact holes 10a and 10b are shifted in the Y direction per row of the X direction is about 140 nm (converted to wafer size), for example. An arrangement pitch Dx3 between the contact holes 10a and 10b extending in the X direction is about 260 nm (converted to wafer size), for example.

And, an arrangement pitch Dy4 between the contact holes 10a and 10b extending in the Y direction is about 420 nm (converted to wafer size), for example. An arrangement pitch Dx4 between the contact holes 10a and 10b extending in the X direction is about 520 nm (converted to wafer size), for example.

And, an arrangement pitch Dy5 between the contact holes 10a and 10b extending in the Y direction is about 280 nm (converted to wafer size), for example. An arrangement pitch Dy6 between the contact holes 10a and 10b extending in the Y direction is about 420 nm (converted to wafer size), for example. Further, an arrangement pitch Dx5 between the contact holes 10a and 10b extending in the X direction is about 520 nm (converted to wafer size), for example.

Figure 15:
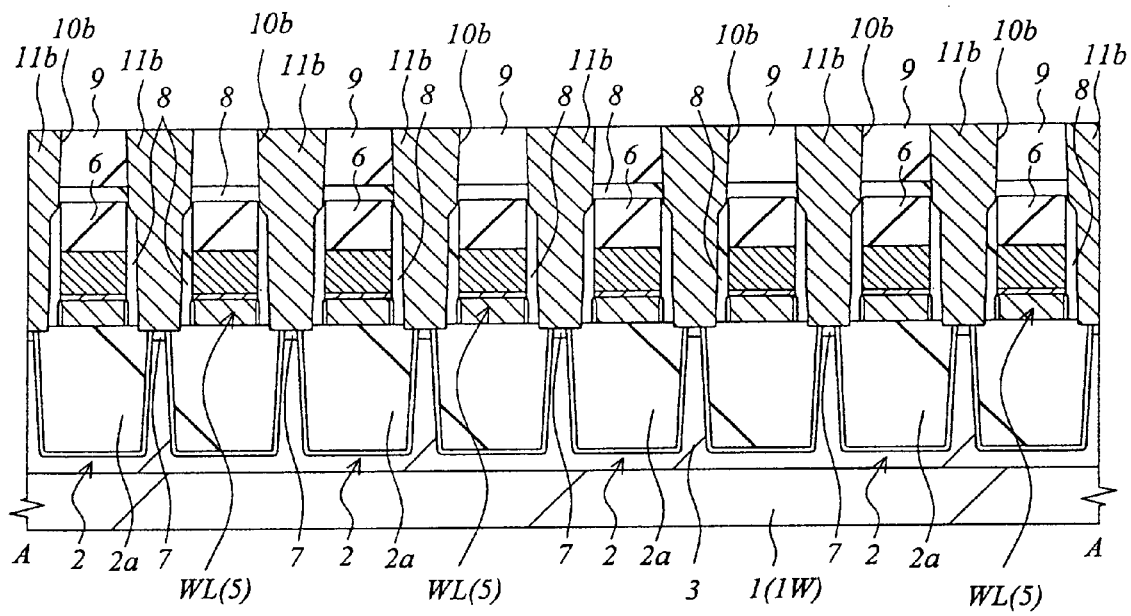
FIG. 15 is a cross-sectional view of an essential portion in the manufacturing process of the semiconductor integrated circuit device of a portion corresponding to the A—A line of FIG. 1, which is subsequent to FIG. 11.
Figure 16:
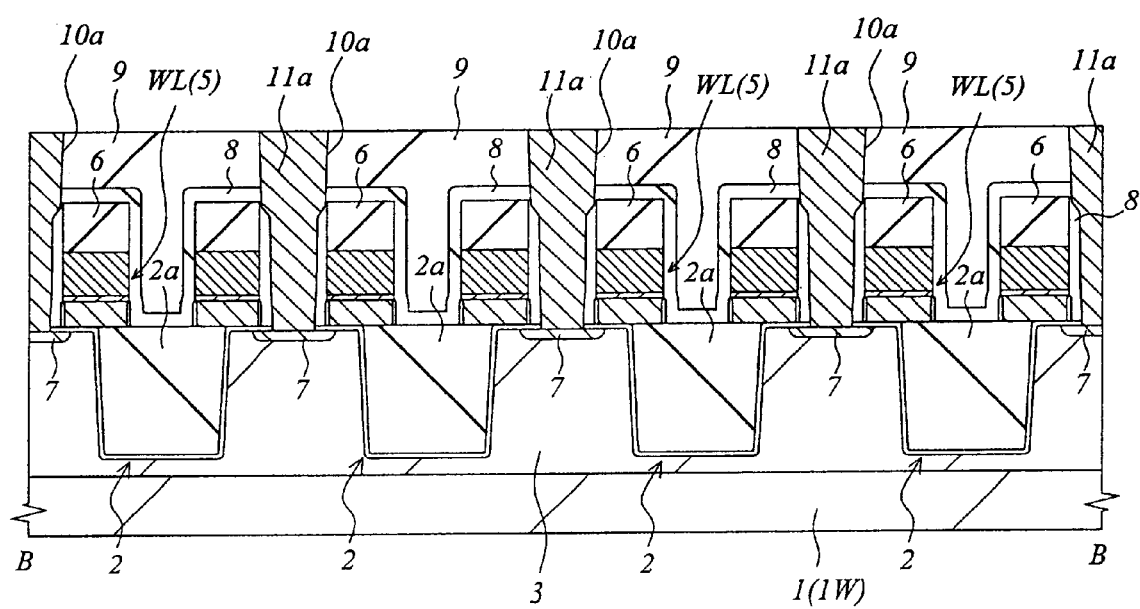
FIG. 16 is a sectional view of an essential portion in the manufacturing process of the semiconductor integrated circuit device of a portion corresponding to the B—B line of FIG. 1, which is subsequent to FIG. 11.

A subsequent step is shown in FIGS. 15 and 16. FIGS. 15 and 16 are cross-sectional views corresponding to sectional portions taken along lines A—A and B—B of FIG. 1, respectively. In this step, as shown in FIGS. 15 and 16, plugs 11a and 11b are formed inside the respective contact holes 10a and 10b. To form the plugs 11a and 11b, an n-type polycrystalline silicon film doped with phosphorus (P) is deposited on each insulative film 9, and thereby this n-type polycrystalline silicon film is embedded inside the contact holes 10a and 10b, and thereafter the n-type polycrystalline silicon film deposited on outer sides of the contact holes 10a and 10b is removed by a chemical mechanical polishing method or an etching back method.

Figure 17:
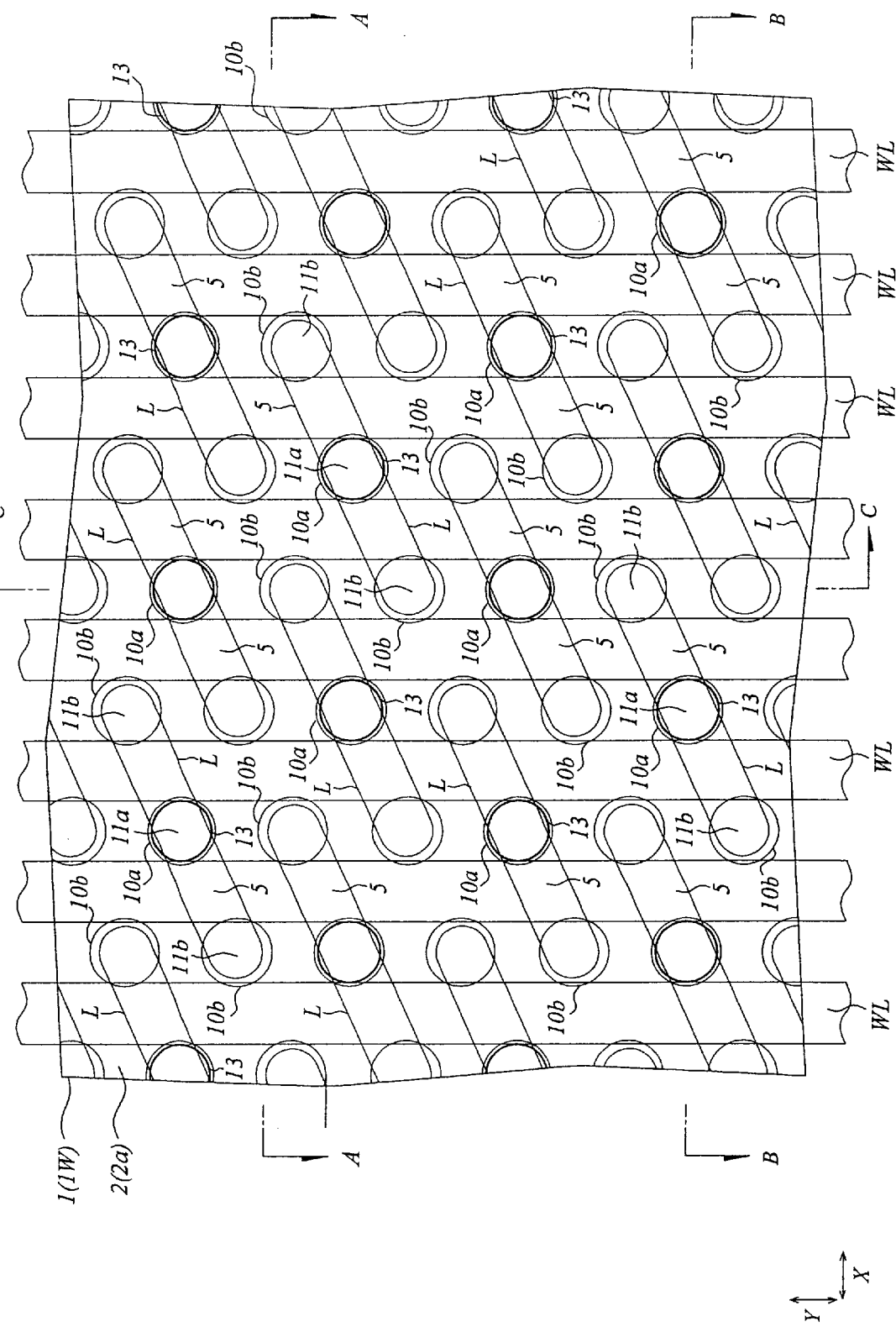
FIG. 17 is a plan view of an essential portion in the manufacturing process of the semiconductor integrated circuit device, which is subsequent to FIGS. 15 and 16.
Figure 18:
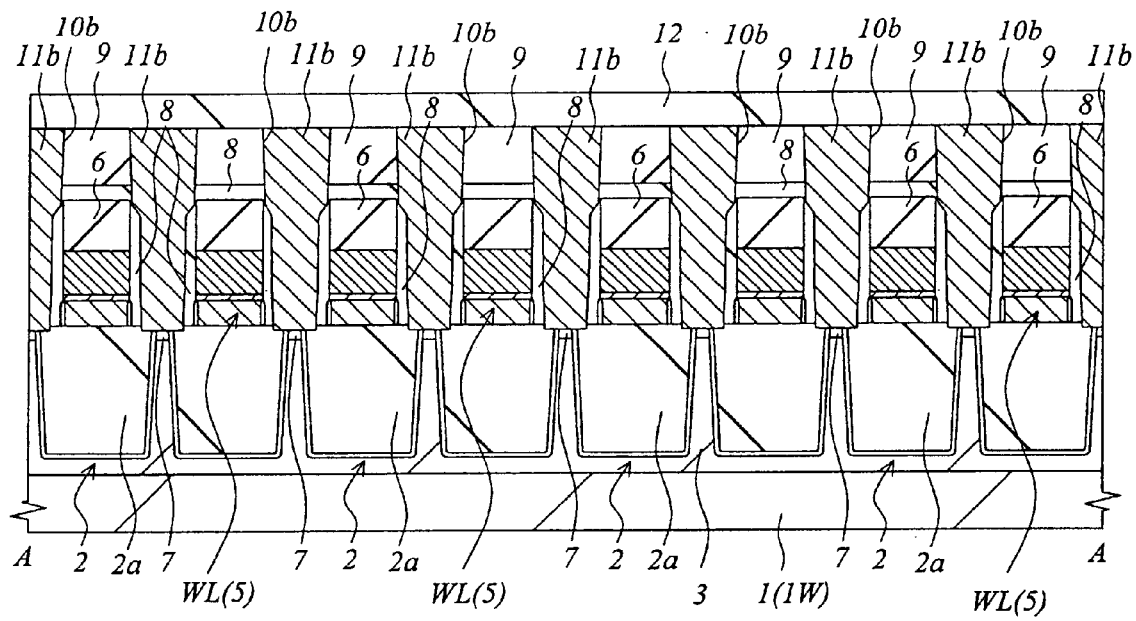
FIG. 18 is a cross-sectional view taken along A—A line of FIG. 17.
Figure 19:
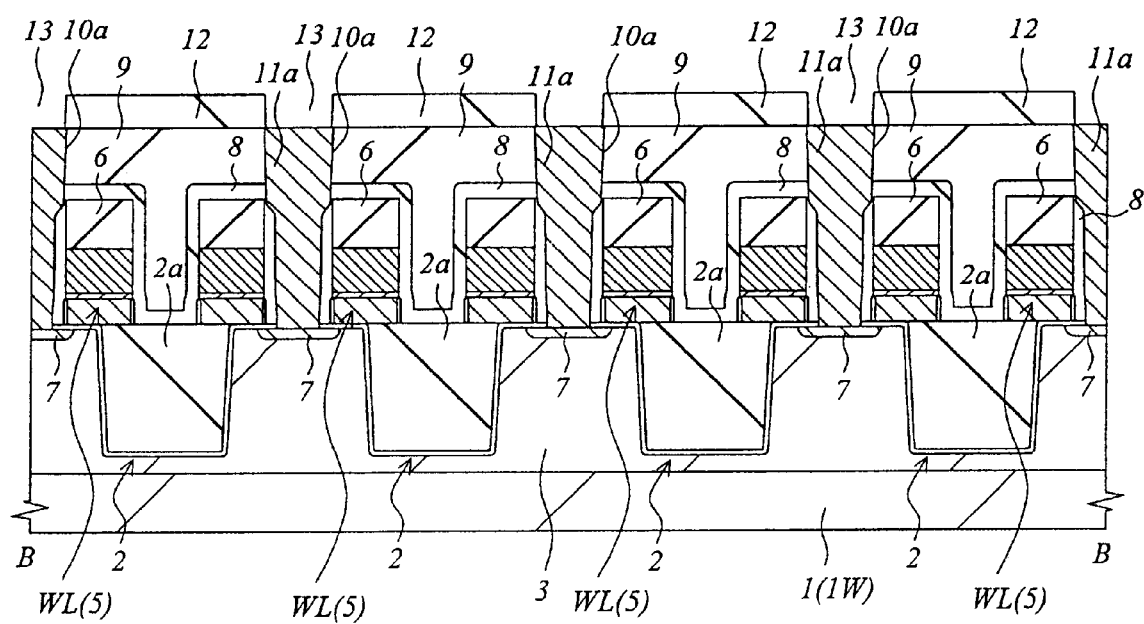
FIG. 19 is a cross-sectional view taken along B—B line of FIG. 17.
Figure 20:
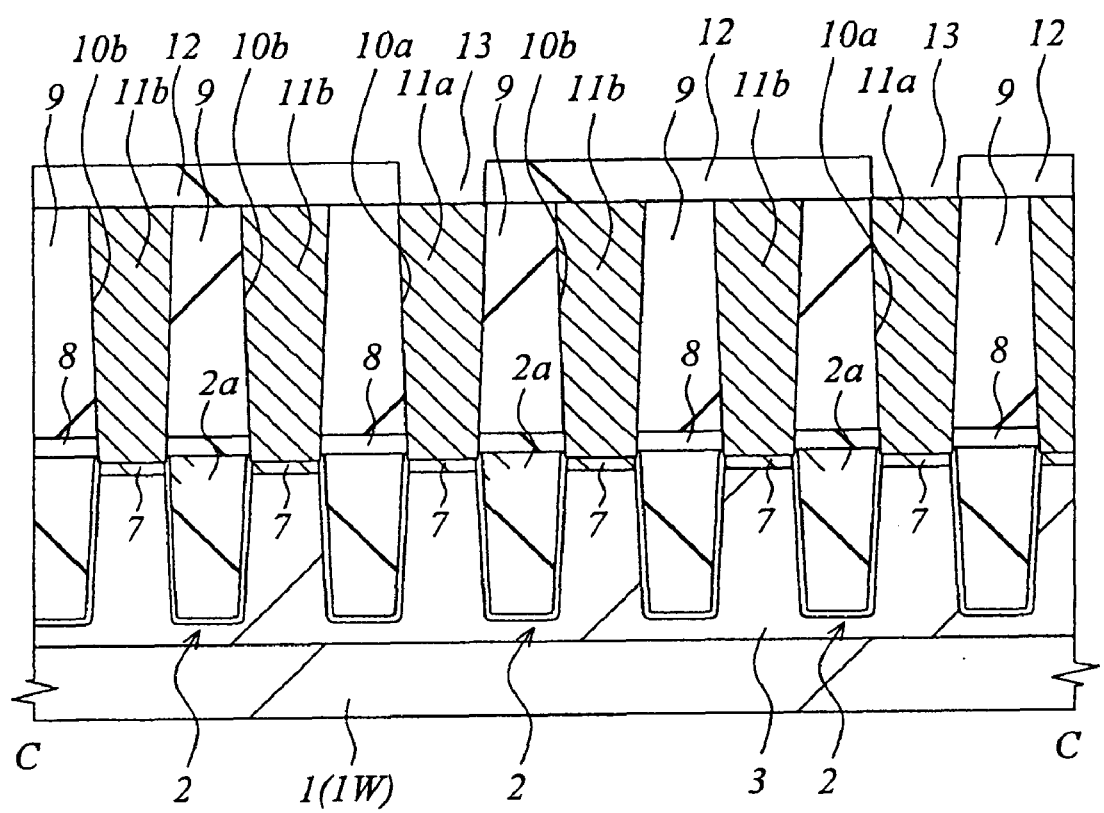
FIG. 20 is a cross-sectional view taken along C—C line of FIG. 17.

A subsequent step is shown in FIGS. 17 to 20. FIG. 17 is a plane view of the same essential portion as that of FIG. 1, and FIGS. 18 to 20 are cross-sectional views taken along lines A—A, B—B and C—C of FIG. 17, respectively. In this step, after an insulative film 12 is deposited on the substrate 1, through holes 13 like a substantially flat-surface circle are formed in the insulative film 12 such that a portion of the plug 11a is exposed from the bottom thereof. That is, firstly, the insulative film 12, for example, formed of silicon oxide or the like is deposited on the substrate 1 (upper surfaces of the insulative film 9 and the plugs 11a and 11b) by the CVD method or the like to a thickness of about 50 nm. Then, a photoresist pattern for forming through holes for the data line is formed on the insulative film 12. This photoresist pattern is a pattern such that a through hole forming region for connecting the data line and each plug 11a is exposed, and a region other than the through hole forming region is covered. Then, as shown in FIGS. 17, 19 and 20, by using the photoresist pattern as the etching mask and removing a portion of the insulative film 12 exposed therefrom by etching, the through holes 13 are formed. A plane arrangement pitch between the through holes 13 is relatively wider than a plane arrangement pitch between each contact holes 10 and each contact hole 10b. Therefore, the photoresist pattern for forming each through hole 13 can be formed by a halftone type phase shift mask under the exposure condition of coherence ($\sigma$)=0.3 (or a normal exposure condition in a phase shift method) in which interference of the illumination is high.

Figure 21:
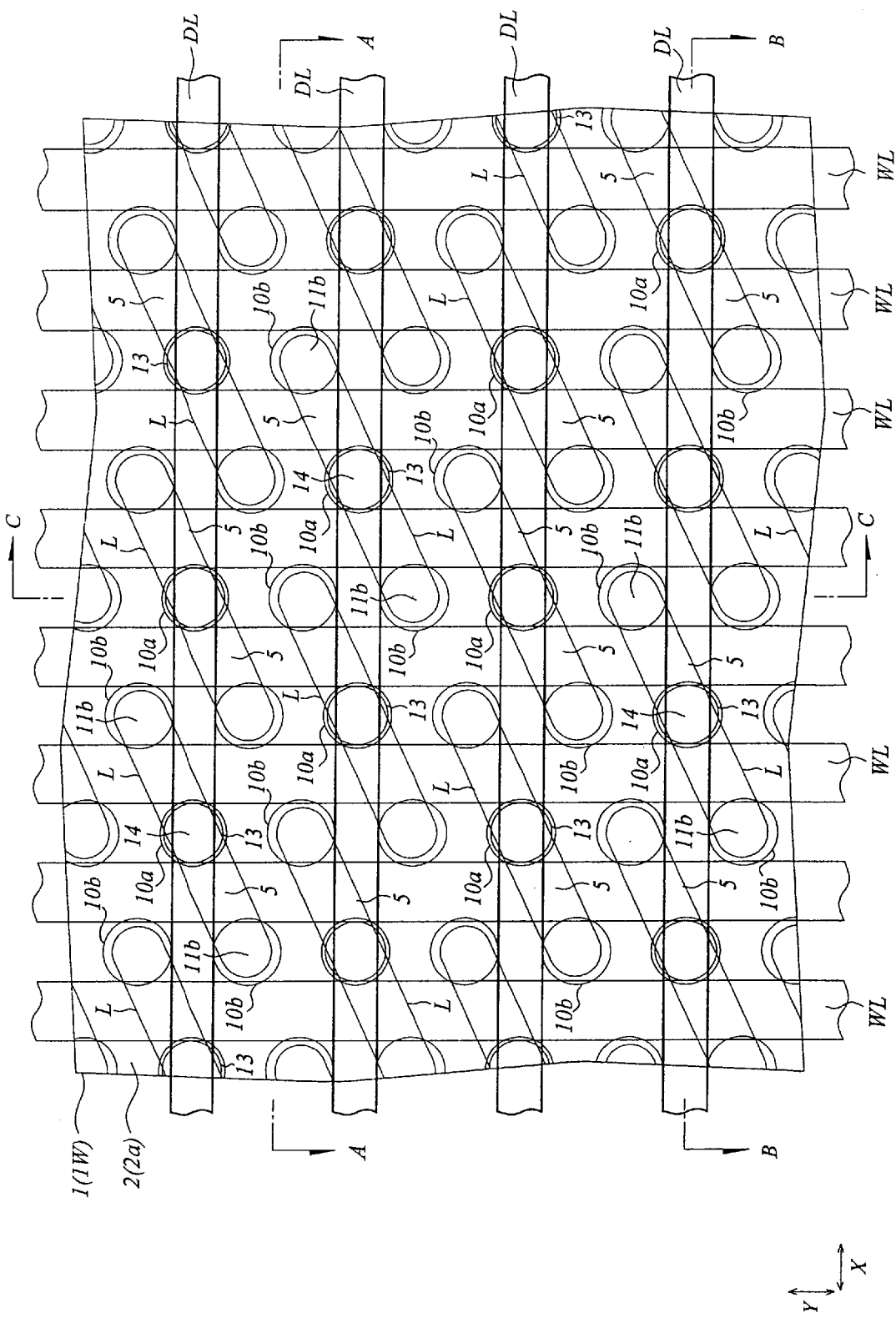
FIG. 21 is a plan view of an essential portion in the manufacturing process of the semiconductor integrated circuit device, which is subsequent to FIG. 17.
Figure 22:
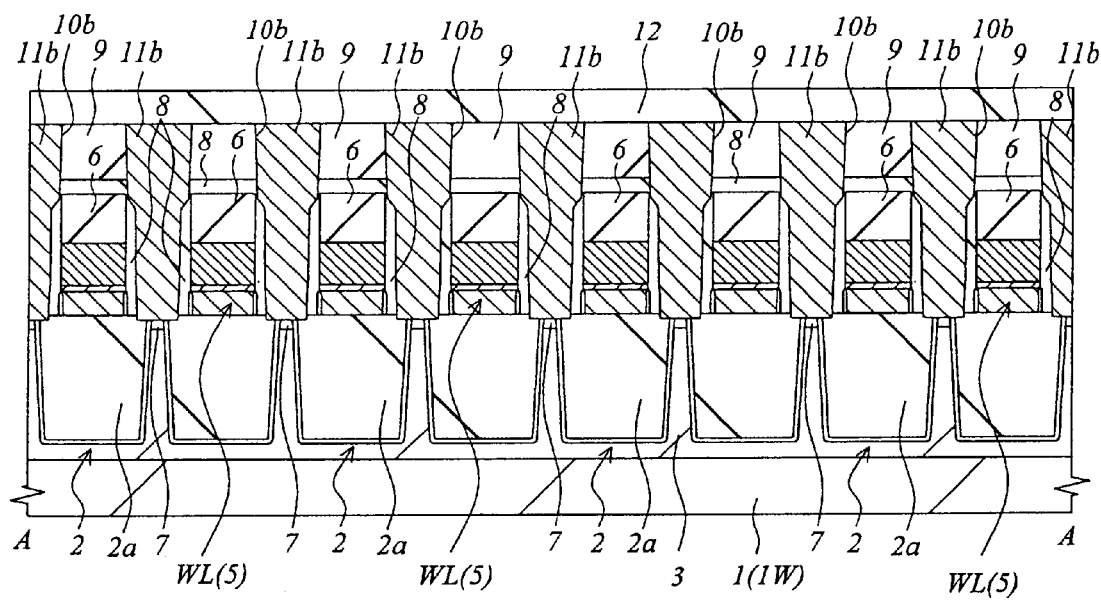
FIG. 22 is a cross-sectional view taken along A—A line of FIG. 21.
Figure 23:
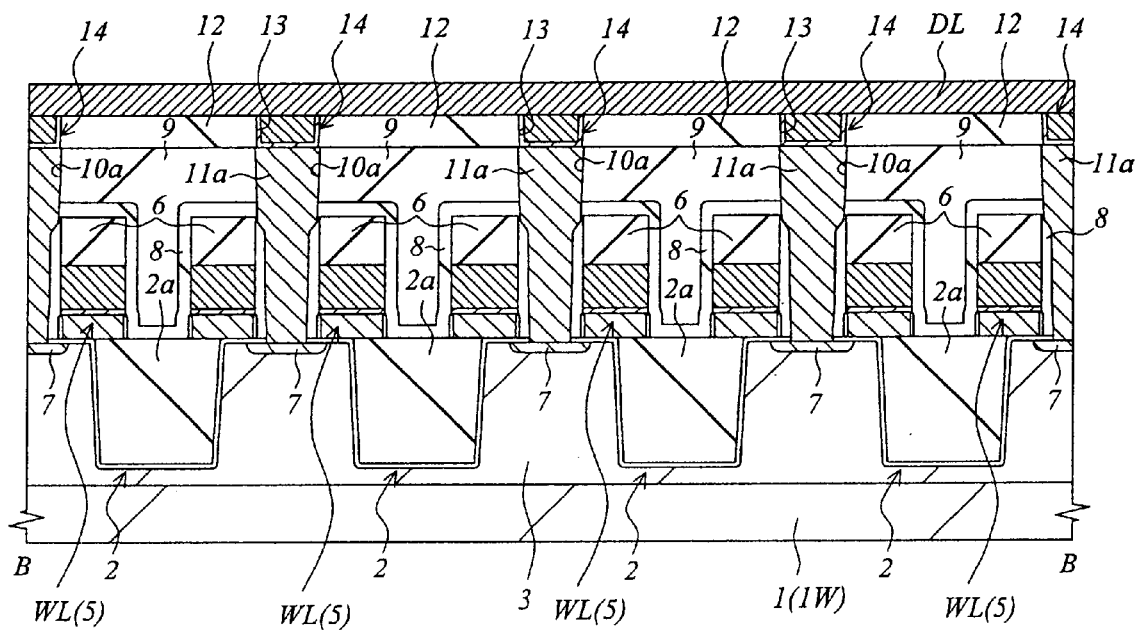
FIG. 23 is a cross-sectional view taken along B—B line of FIG. 21.
Figure 24:
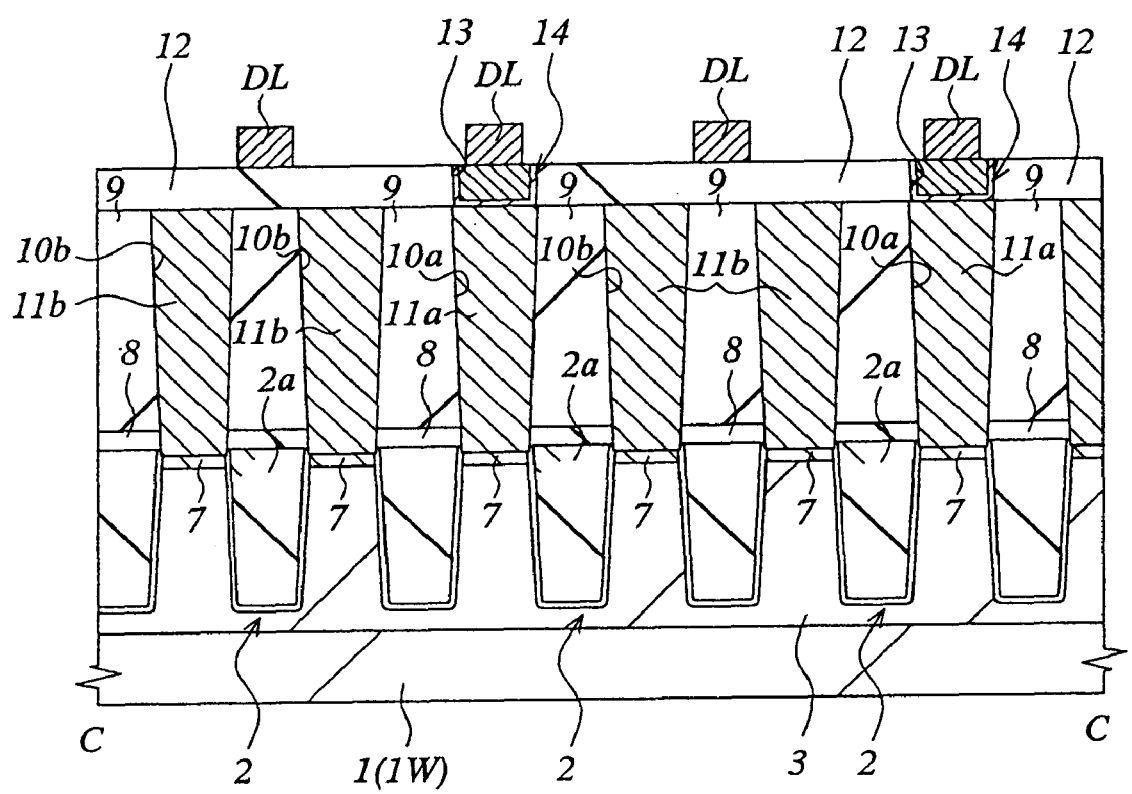
FIG. 24 is a cross-sectional view taken along C—C line of FIG. 21.

A subsequent step is shown in FIGS. 21 to 24. FIG. 21 is a plane view of the same essential portion as that of FIG. 1, and FIGS. 22 to 24 are cross-sectional views taken along lines A—A, B—B and C—C of FIG. 21, respectively. In this step, after a plug 14 is formed in each through hole 13, a data line DL to be connected to each plug 14 is formed. First, to form each plug 14, a barrier metal film formed of a laminated film of titanium (Ti) film and titanium nitride (TiN) film is deposited on the insulative film 12 by the sputtering method. Then, tungsten (W) film is deposited on the barrier metal film by the CVD method, and thereby these films inside each through hole 13 are embedded. Thereafter, these films deposited on the outer side of each through hole 13 are removed by the chemical mechanical polishing method. Then, to form the data lines DL, a titanium (TiN) film (having a film thickness of about 10 nm) is deposited on the insulative film 12 by the sputtering method. Then, tungsten (W) film (film thickness is about 50 nm) is deposited on the titanium nitride (TiN) film by the CVD method. Thereafter, these films are dry-etched by using the photoresist pattern as a mask.

Figure 25:
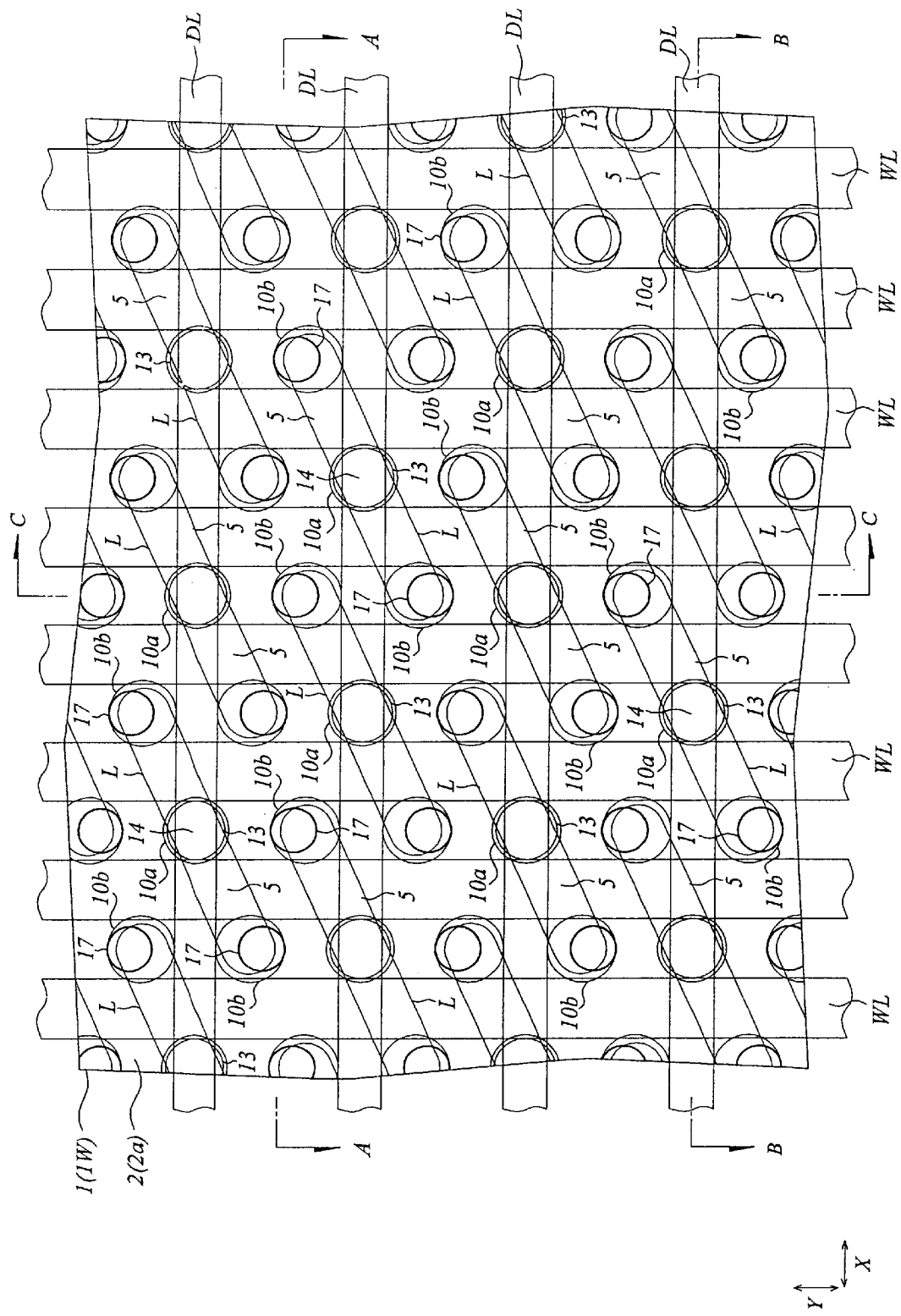
FIG. 25 is a plan view of an essential portion in the manufacturing process of the semiconductor integrated circuit device, which is subsequent to FIG. 21.

A subsequent step is shown in FIGS. 25 to 28. FIG. 25 is a plane view of the same essential portion as that of FIG. 1, and FIGS. 26 to 28 are cross-sectional views taken along lines A—A, B—B and C—C of FIG. 25, respectively. In this step, after an insulative film 15 and an insulative film 16 are deposited on the substrate 1, each through hole 17 like a substantially flat-surface circle is formed on the insulative films 15 and 16 and the insulative film 12 such that a portion of each plug 11b is exposed from the bottom thereof.

Figure 26:
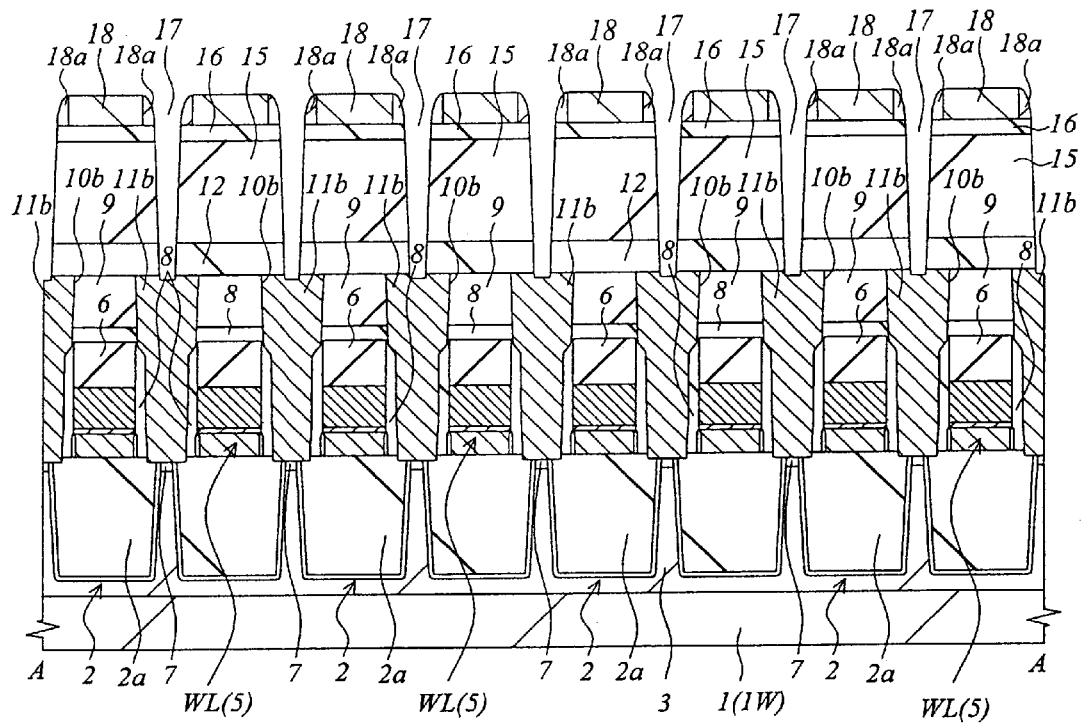
FIG. 26 is a cross-sectional view taken along A—A line of FIG. 25.
Figure 27:
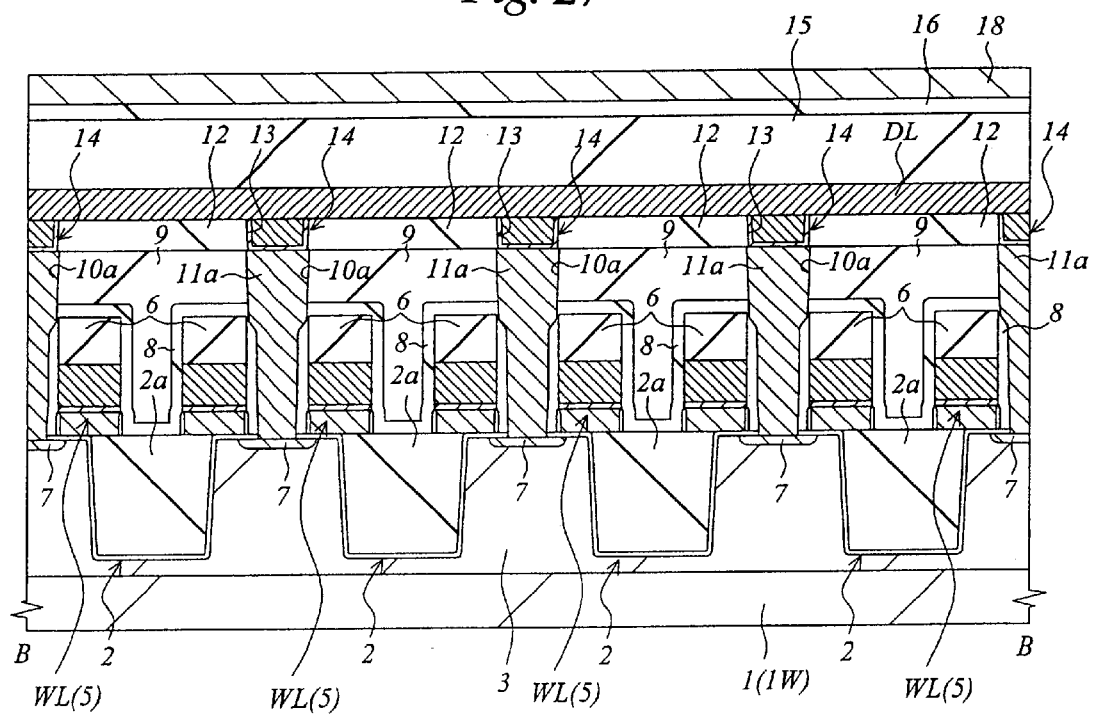
FIG. 27 is a cross-sectional view taken along B—B line of FIG. 25.
Figure 28:
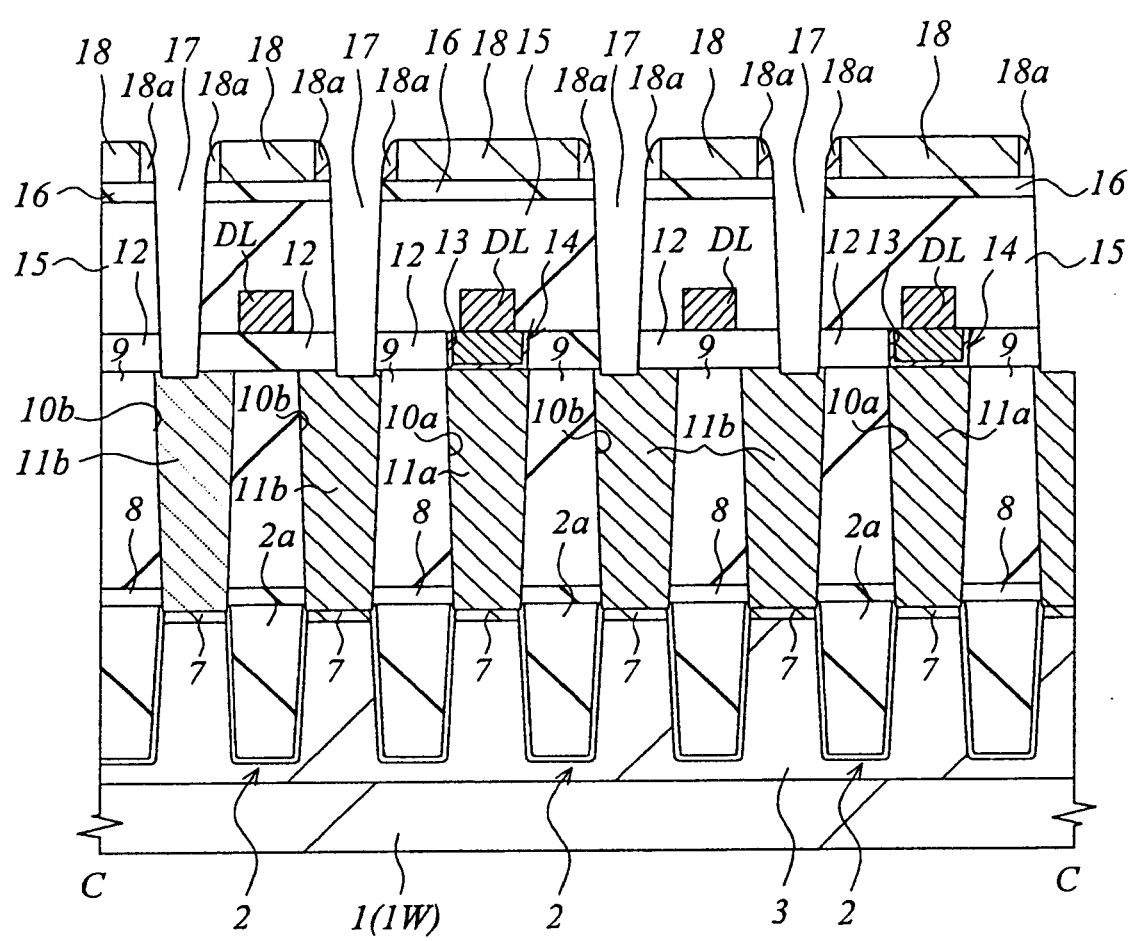
FIG. 28 is a cross-sectional view taken along C—C line of FIG. 25.

That is, first, each insulative film 15 formed of silicon oxide or the like, for example, is deposited on the substrate 1 (an upper surface of each insulative film 12 and a surface of each data line DL) by the CVD method or the like to a thickness of about 300 nm. Then, after the insulative film 16 formed of silicon nitride is, for example, deposited on the insulative film 15 to a film thickness of about 50 nm by the CVD method or the like. Then, for example, polycrystalline film is deposited on the insulative film 16 by the CVD method. Thereafter, after each photoresist pattern is formed on the polycrystalline silicon film in order to form though holes for the information storage capacity element, each hard mask 18 is formed by using each photoresist pattern as an etching mask and forming holes in the though hole formation region of the polycrystalline silicon film. Each photoresist pattern is a pattern such that the through hole formation region for connecting each plug 11b and a lower electrode of the information storage capacity element is exposed and a region other than the through hole formation region is covered. A plane arrangement pitch between the through holes in this case is relatively wider than a plane arrangement pitch between each contact hole 10a and each contact hole 10b. Therefore, the photoresist pattern can be formed under the normal exposure condition by the phase shift method using the Levenson type phase shift mask. After each hard mask 18 is formed, a polycrystalline silicon film is further deposited on the substrate 1 by the CVD method or the like. By etching back this by an anisotropic dry etching method or the like, side walls 18a are formed on an inner surface of a hole of each hard mask 18. Then, as shown in FIGS. 25, 26 and 28, by using each hard mask 18 and each side wall 18a as a etching mask and removing portions of the insulative films 16, 15 and 12 exposed therefrom by the etching, the through holes 17 are formed.

Each through hole 17 is formed such that its diameter is smaller than that of each lower contact hole 10b. Further, each through hole 17 is offset in such a direction that a center thereof is separated from each data line DL further than a center of each contact hole 10b. By making the diameter of each through hole 17 smaller than that of each lower contact hole 10b and by offsetting each through hole 17 in such a direction that the center of each through hole 17 is separated from each data line DL, even if the memory cell size is reduced, it is possible to prevent shortcircuit between each through hole 17 (plug embedded therein) and each data line DL without using a self-align contact (SAC) technique. Further, since the diameter of each through hole 17 is smaller than that of each lower contact hole 10b, even if respective centers of both the holes are offset from each other, contact areas occupied by both the holes can sufficiently be ensured.

Figure 29:
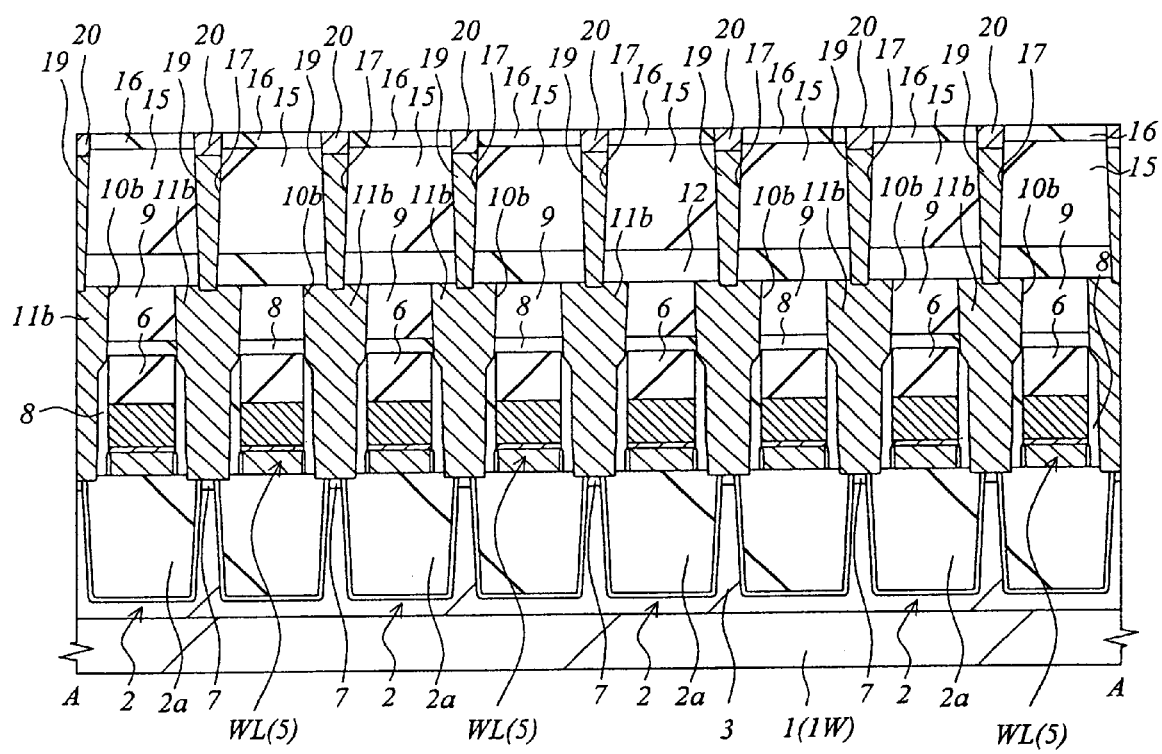
FIG. 29 is a cross-sectional view of an essential portion in the manufacturing process of the semiconductor integrated circuit device of a portion corresponding to the A—A line of FIG. 1, which is subsequent to FIG. 25.
Figure 30:
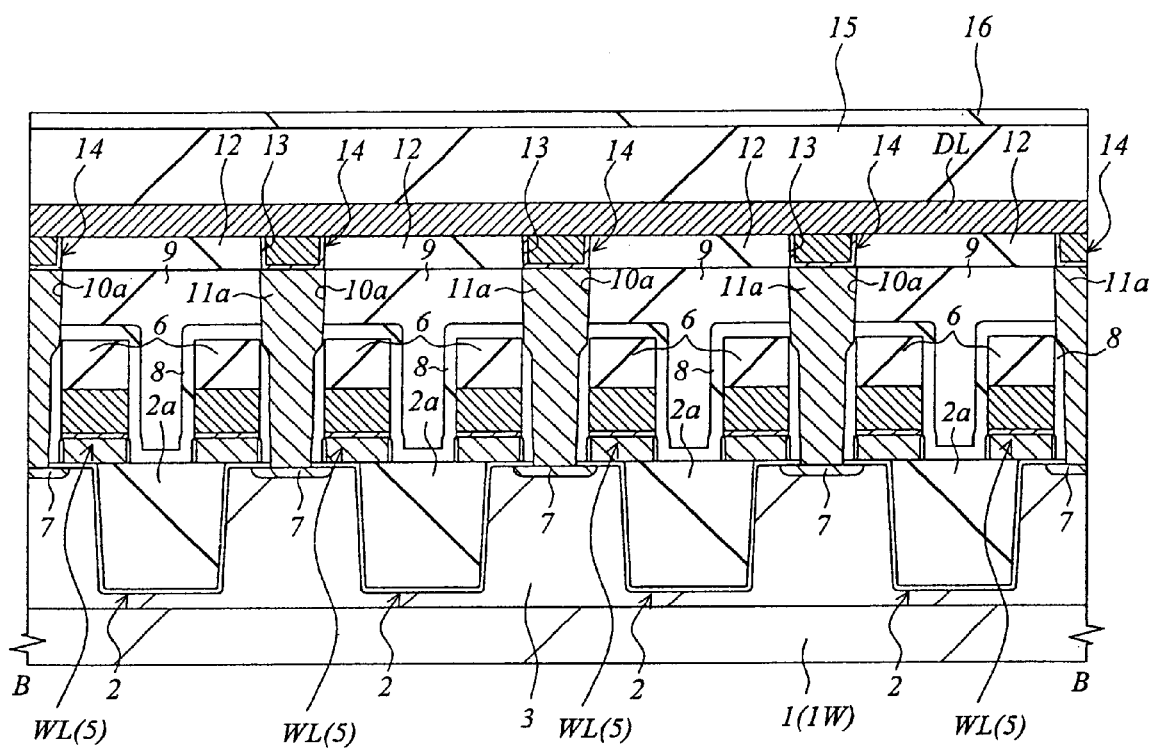
FIG. 30 is a cross-sectional view of an essential portion in the manufacturing process of the semiconductor integrated circuit device of a portion corresponding to the B—B line of FIG. 1, which is subsequent to FIG. 25.
Figure 31:
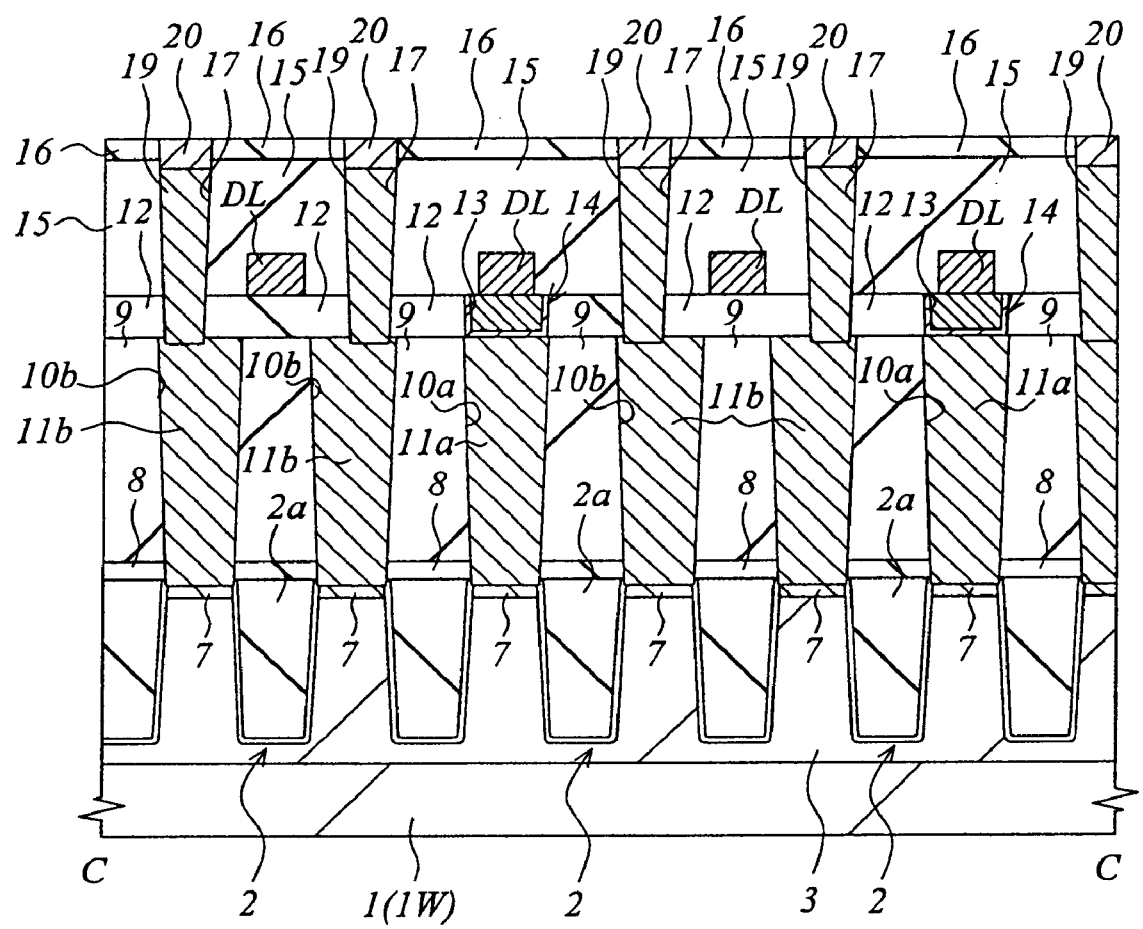
FIG. 31 is a cross-sectional view of an essential portion in the manufacturing process of the semiconductor integrated circuit device of a portion corresponding to the C—C line of FIG. 1, which is subsequent to FIG. 25.

A subsequent step is shown in FIGS. 29 to 31. FIGS. 29 to 31 are cross-sectional views showing portions corresponding to sectional portions taken along lines A—A, B—B and C—C of FIG. 1, respectively. In this step, after each hard mask 18 and each side wall 18a are removed by the dry etching, a plug 19 is formed in each through hole 17, and further a barrier metal film 20 is formed on a surface of each plug 19. To form each plug 19 and each barrier metal film 20, first, a n-type polycrystalline silicon film doped with phosphorus (P) is deposited on the insulative film 16 by the CVD method, and thereby the n-type polycrystalline silicon film is embedded inside each through hole 17. Thereafter, the n-type polycrystalline silicon film deposited outside of each through hole 17 is removed by the chemical mechanical polishing method (or etch back). And, at this time, the n-type polycrystalline silicon film deposited in each through hole 17 is over-polished (over-etched) to retreat the surface of each plug 19 downward from a surface of the insulative film 16. Thereby, each space for embedding the barrier metal film 20 is secured in an upper portion of each plug 19. Next, by depositing a TiN film on an upper portion of the insulative film 16 by the sputtering method, the TiN film embedded into each through hole 17 on the upper portion of each plug 19. Thereafter, the TiN film deposited outside each through hole 17 is removed by the chemical mechanical polishing method (or etch back). As this kind of barrier metal material, ruthenium (Ru) polycide, titanium (Ti)—aluminum (Al)—silicon (Si) alloy or the like can be used in addition to TiN.

Figure 32:
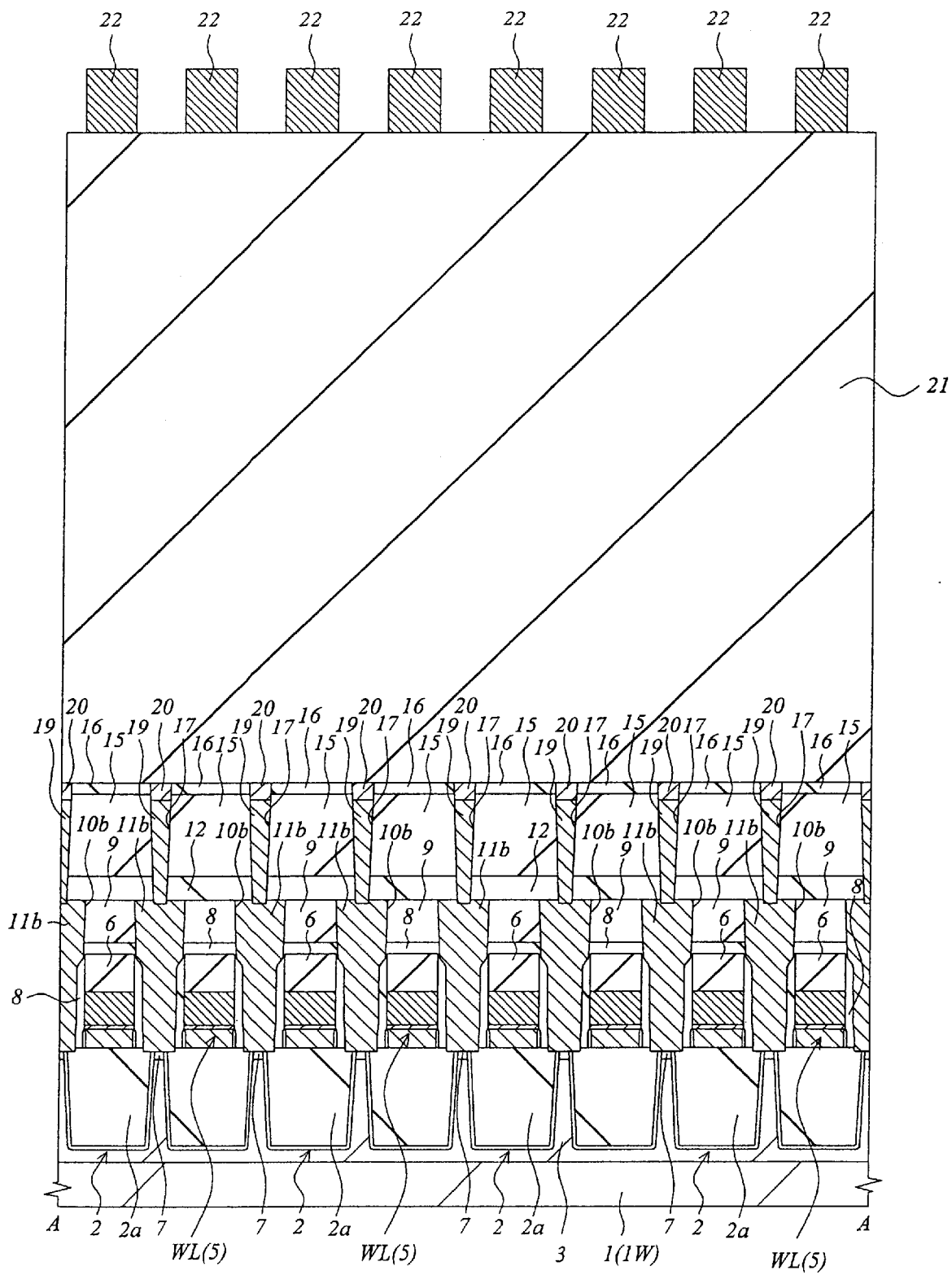
FIG. 32 is a cross-sectional view of an essential portion in the manufacturing process of the semiconductor integrated circuit device of a portion corresponding to the A—A line of FIG. 1, which is subsequent to FIGS. 29 to 31.
Figure 33:
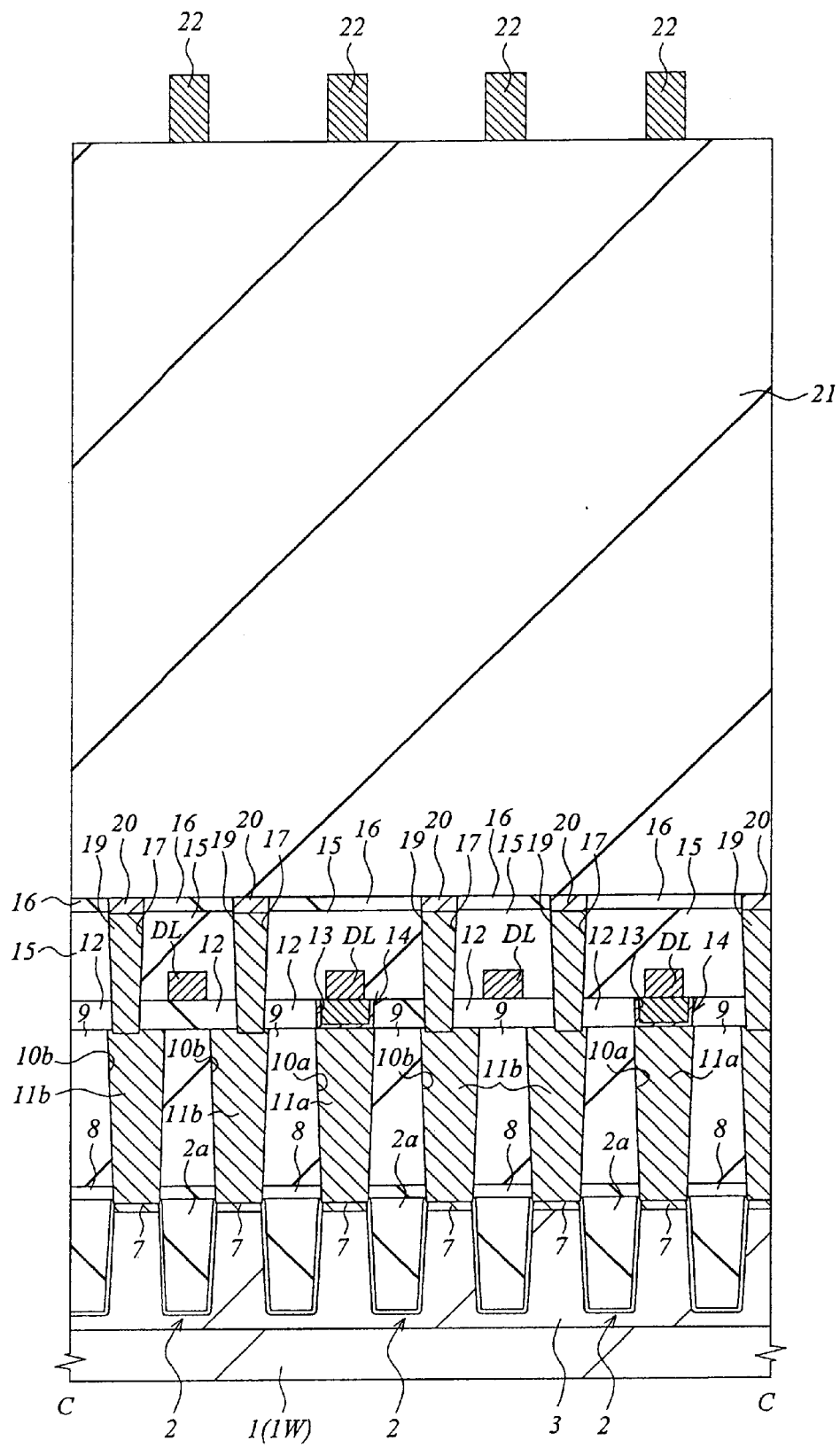
FIG. 33 is a cross-sectional view of an essential portion in the manufacturing process of the semiconductor integrated circuit device of a portion corresponding to the C—C line of FIG. 1 at the same process as that shown in FIG. 32.

A subsequent step is shown in FIGS. 32 and 33. FIGS. 32 and 33 are cross-sectional views showing portions corresponding to the sectional portions taken along lines A—A and C—C of FIG. 1, respectively. In this step, after an insulative film 21 formed of silicon oxide or the like, for example, is deposited on the insulative film 16 and the barrier metal film 20 by the CVD method, a reflection preventing film and a photoresist film are applied thereon in a spinning manner, and this results in formation of photoresist patterns 22 for forming each capacitor hole.

A lower electrode of the information storage capacity element constituting the DRAM memory cell is formed inside each hole (recess) to be formed in the insulative film 21 by the following steps. Therefore, the film thickness of the insulative film 21 becomes equal to a height of this lower electrode, so that, in order to enlarge a surface area of the lower electrode and thereby increase amount of electric charge stored therein, it is necessary to deposit the insulative film 21 by a thick film (having about 0.8 $\mu$m in thickness). The insulative film 21 is deposited by the plasma CVD method using oxygen and tetraethoxysilane (TEOS) as source gas. Then, a surface of the insulative film 21 is flattened by the chemical mechanical polishing method if necessary.

Further, each photoresist pattern 22 is constituted by a reflection preventing film and the photoresist film provided thereon. Because etching the thick insulative film 21, this photoresist film is set to about 480 nm in thickness by taking into consideration of a film thickness reduced in etching process. By performing pattering of the photoresist film by exposure development, and then using photoresist pattern thereof as an etching mask to perform dry etching treatment, the reflection preventing film disposed under the photoresist film has already patterned. In the case where the film thickness of the insulative film 21 is about 0.8 $\mu$m, the etching can be performed by using the photoresist pattern 22 as an etching mask. But, in the case where the insulative film 21 is thicker than the above value, it is necessary to transfer the hard mask formed of tungsten or the like as an etching mask.

Figure 34:
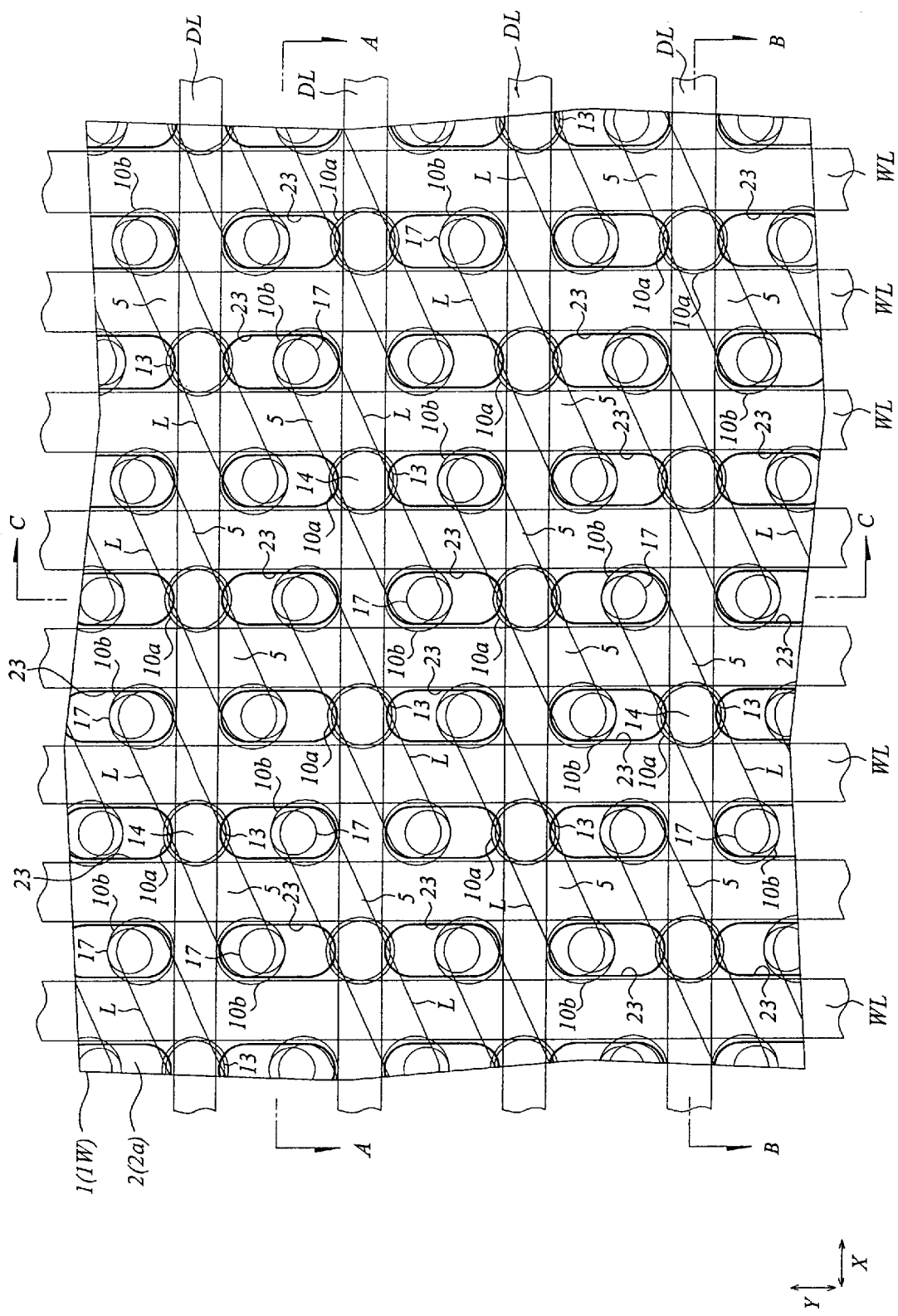
FIG. 34 is a plane view of an essential portion in the manufacturing process of the semiconductor integrated circuit device, which is subsequent to FIGS. 32 and 33.
Figure 35:
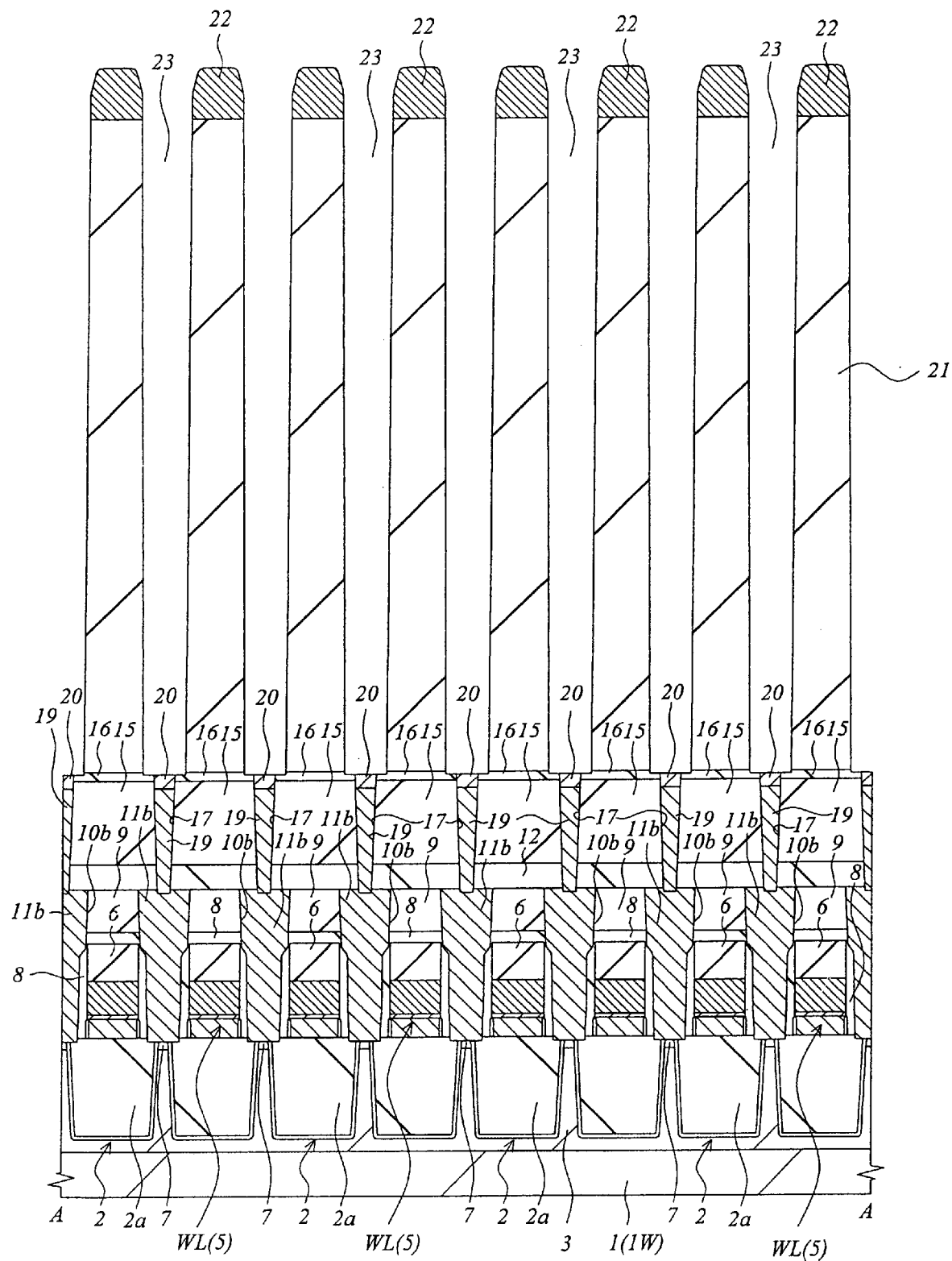
FIG. 35 is a cross-sectional view taken along A—A line of FIG. 34.
Figure 36:
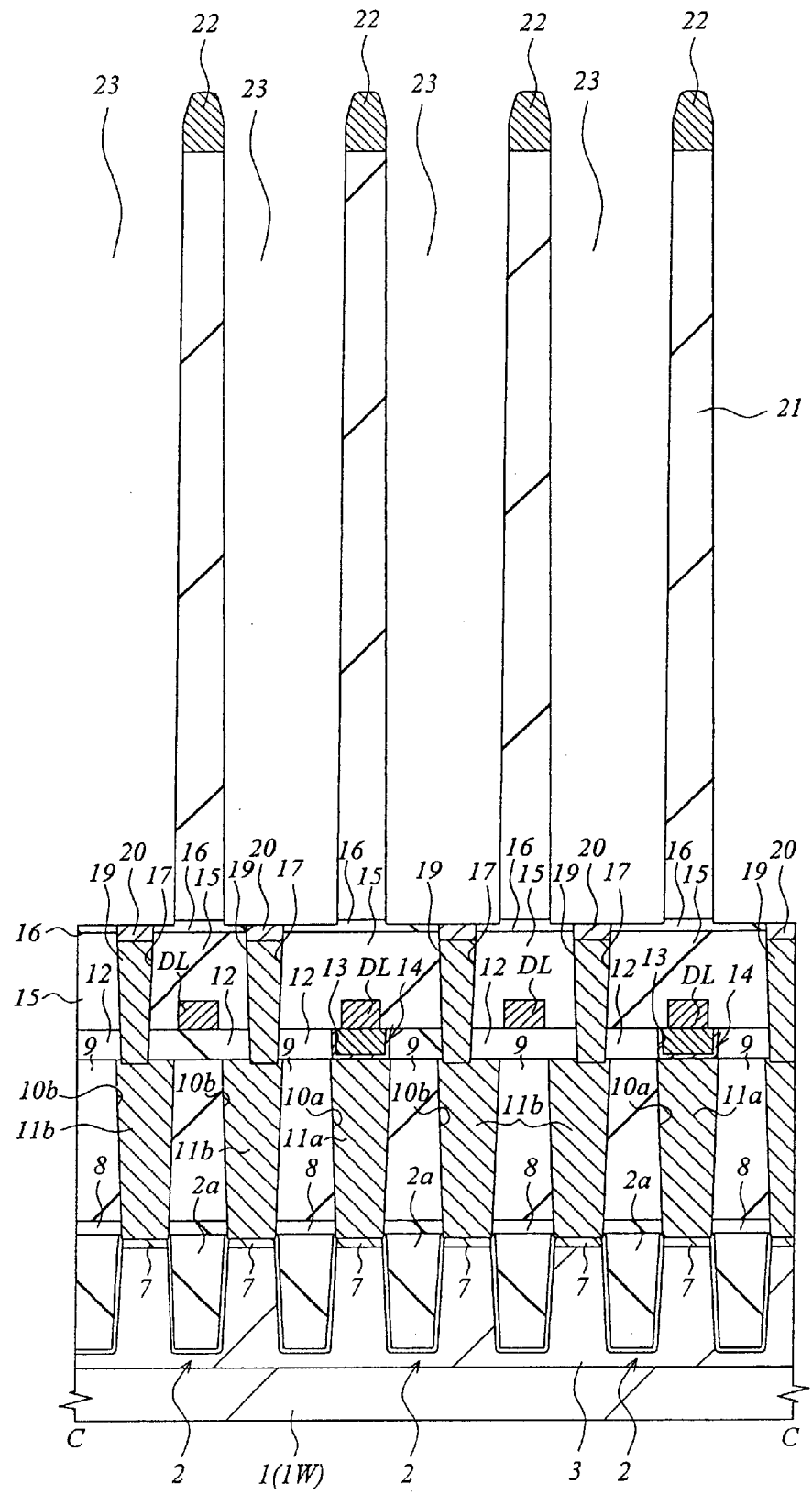
FIG. 36 is a cross-sectional view taken along C—C line of FIG. 34.

A subsequent step is shown in FIGS. 34 to 36. FIG. 34 is a plane view of the same essential portion as that of FIG. 1, and FIGS. 35 and 36 are cross-sectional views taken along lines A—A and C—C of FIG. 34, respectively. In this step, by using the photoresist pattern 22 as a mask to perform dry etching of the insulative film 21 disposed at a lower layer thereof, each deep hole (recess) 23 is formed in a bottom surface of the insulative film 21 such that a surface of the barrier metal film 20 in each through hole 17 is exposed. Each hole 23 comprises a rectangle-shaped plane pattern having long sides in an extending direction of each word line WL and short sides in an extending direction of each data line DL. A diameter of the long side direction is, for example, about 220 nm, and a diameter of the short side direction is, for example, about 130 nm. An interval between the adjacent holes 23 of the long side direction and an interval between the adjacent holes 23 of the short side direction are respectively 130 nm, for example.

Figure 37:
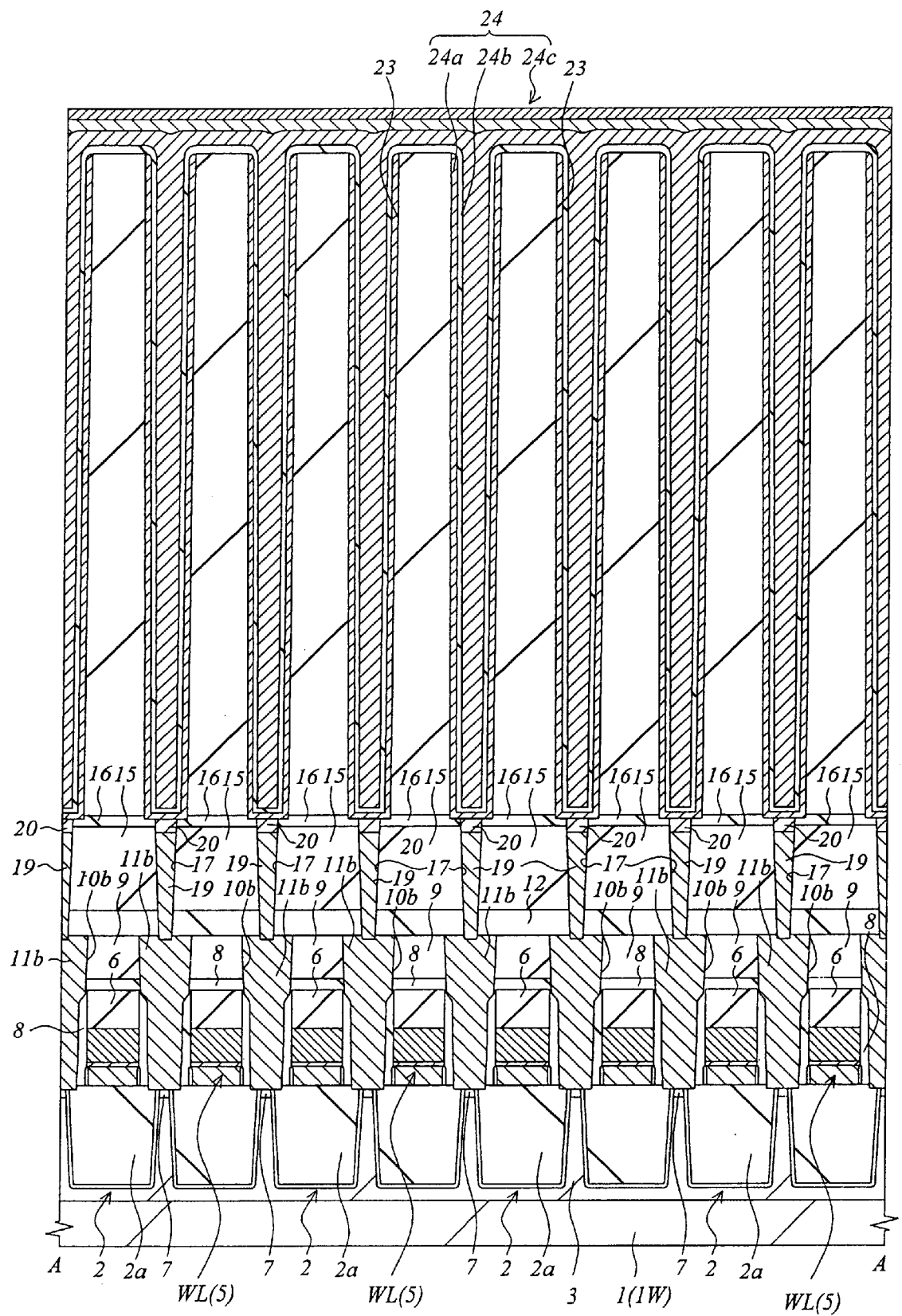
FIG. 37 is a cross-sectional view of an essential portion in the manufacturing process of the semiconductor integrated circuit device of a portion corresponding to the A—A line of FIG. 1, which is subsequent to FIG. 34.

FIG. 37 shows a cross-sectional view of the information storage capacity element 24 that is formed in the holes 23. The information storage capacity element 24 includes a lower electrode 24a, a capacity insulative film 24b, and a plate electrode 24c. The lower electrode 24a is formed, for example, of a doped polysilicon film, and is electrically connected to one end of each n-type semiconductor region 7 of the memory cell selecting MISQs through the plugs 19 and 10b. The capacity insulative film 24b is formed, for example, of a silicon nitride film, a laminated film of a silicon nitride film and a silicon oxide film, tantalum oxide (TaO$_5$), or the like. The plate electrode 24c has a doped polysilicon film to be filled in the capacitor holes 23, and a metal film such as tungsten deposited thereon. Since the plate electrode 24c is formed by filling the inside of the capacitor holes 23 with the doped silicon film having good embedded characteristics thereinto, it is possible to embed securely the capacitor holes 23 having a high aspect ratio.

The capacity insulative film 24b may be constituted, for example, by high (strong) dielectric comprising perovskite type metal oxide such as BST film, $BaTiO_3$ (barium titanate), $PbTiO_3$ (lead titanate), PZT ($PbZrXTi1-XO_3$), PLT ($PbLaXTi1-XO_3$), PLZT or the like in addition to the above-mentioned materials. In this case, it is preferable to use ruthenium or the like for the lower electrode 24a. It is preferable that each plate electrode 24c is formed by depositing a ruthenium, titanium nitride, and tungsten films on each capacity insulative film 24b. The tungsten film constituting each plate electrode 24c has a function to lower contact resistance between each plate electrode 24c and each upper layer wiring. And, the titanium nitride film has a function to prevent resistance from being increased by dispersion of gas (oxygen or hydrogen) from the capacity insulative film 24b to the tungsten film.

By the steps described heretofore, the information storage capacity element 24 is completed, and the DRAM memory cell constituted by the memory cell selecting MIS•FETQs and the information storage capacity element 24 serially connected thereto is substantially completed. Thereafter, about two layer wirings between which an interlayer insulative film is put are formed at an upper portion of the information storage capacity element 24, and a passivasion film is formed on an upper portion of the uppermost layer wiring. But, the about two layer wiring and the interlayer insulative film are not illustrated.

Next, an exposure technique used in the manufacturing process of the above-mentioned DRAM described in the present embodiment will be explained.

Figure 38:
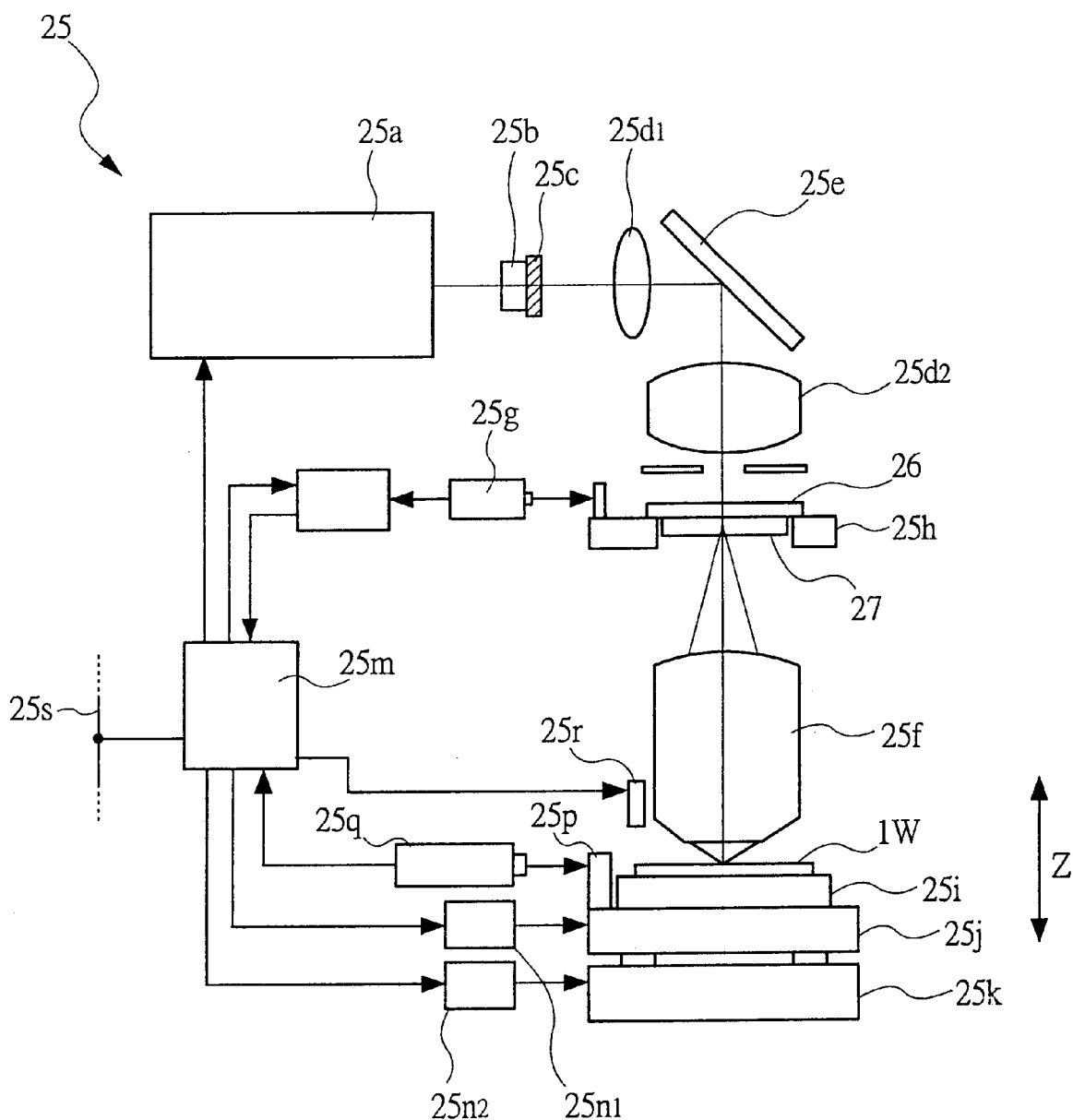
FIG. 38 is an explanatory view of an exposure apparatus used in the manufacturing process of the semiconductor integrated circuit device that is one embodiment of the invention.

First, FIG. 38 shows one example of an exposure apparatus used in multiple exposure treatment described in the present embodiment. An exposure apparatus 25 is a scanning type reduction projection exposure apparatus (also called scanner hereinafter), for example, having reduction ratio of 4:1. Exposure conditions of the exposure apparatus 25 are as follows, for example. That is, for example, KrF excimer laser light (exposure wavelength $\lambda=248$ nm) is used as exposure light, and these exposure conditions is the number of aperture NA of optical lens being equal to 0.68 (NA=0.68), and in order to obtain higher phase shift effect, coherence ($\sigma$; sigma) value=0.3 which is an illumination condition for improving interference of the exposure light. However, the exposure conditions of the exposure light is not limited to the above-described conditions, and may be changed variously. For example, ArF excimer laser having a wavelength of 193 nm or $F_2$ laser having a wavelength of 157 nm may also be used.

Light emitted from an exposure light source 25a illuminates a mask 26 through a fly-eye lens 25b, an aperture 25c, capacitor lens 25d1 and 25d2, and a mirror 25e. The coherence of the optical conditions was adjusted by changing an opening size of the aperture 25c. A pellicle 27 is provided on the mask 26 for preventing pattern-transfer badness or the like which is caused by foreign matter attached thereon. A mask pattern formed on the mask 26 is projected through a projection lens 25f onto a wafer 1W (substrate 1) which is a sample substrate. The mask 26 is put on a mask stage 25h controlled by a mask position control means 25g, and a center of the mask stage 25h precisely positions an optical axis of the projection lens 25f.

The wafer 1W is vacuum-absorbed on a wafer stage 25i. The wafer stage 25i is placed on a Z stage 25j which is movable in an optical axis direction of the projection lens 25f, i.e., in a Z direction, and is further placed on an XY stage 25k. The Z stage 25j and the XY stage 25k are respectively driven by driving means 25n1 and 25n2 in accordance with control commands given by a main control system 25m, and thereby can move to desired exposure positions. Such positions are precisely monitored by a laser measuring apparatus 25q as positions of a mirror 25p fitted to the Z stage 25j. And, an on-surface position of the wafer 1W (substrate 1) is measured by focus position detecting means that a normal exposure apparatus has. Driving the Z stage 25j in accordance with results of the measurement can make the surface of the wafer 1W coincide with an image forming surface of the projection lens 25f.

In the case where a circuit pattern on the mask 26 is superposed on another circuit pattern formed on the wafer 1W and then is exposed, positions of the mark pattern formed on the wafer 1W are detected by using an alignment detecting optical system 25r, and the wafer is positioned in accordance with the detected results and is superposed and transferred. The main control system 25m is electrically connected to a network apparatus 25s, and can remote-monitor or the like a state of the exposure apparatus 25.

Figure 39:
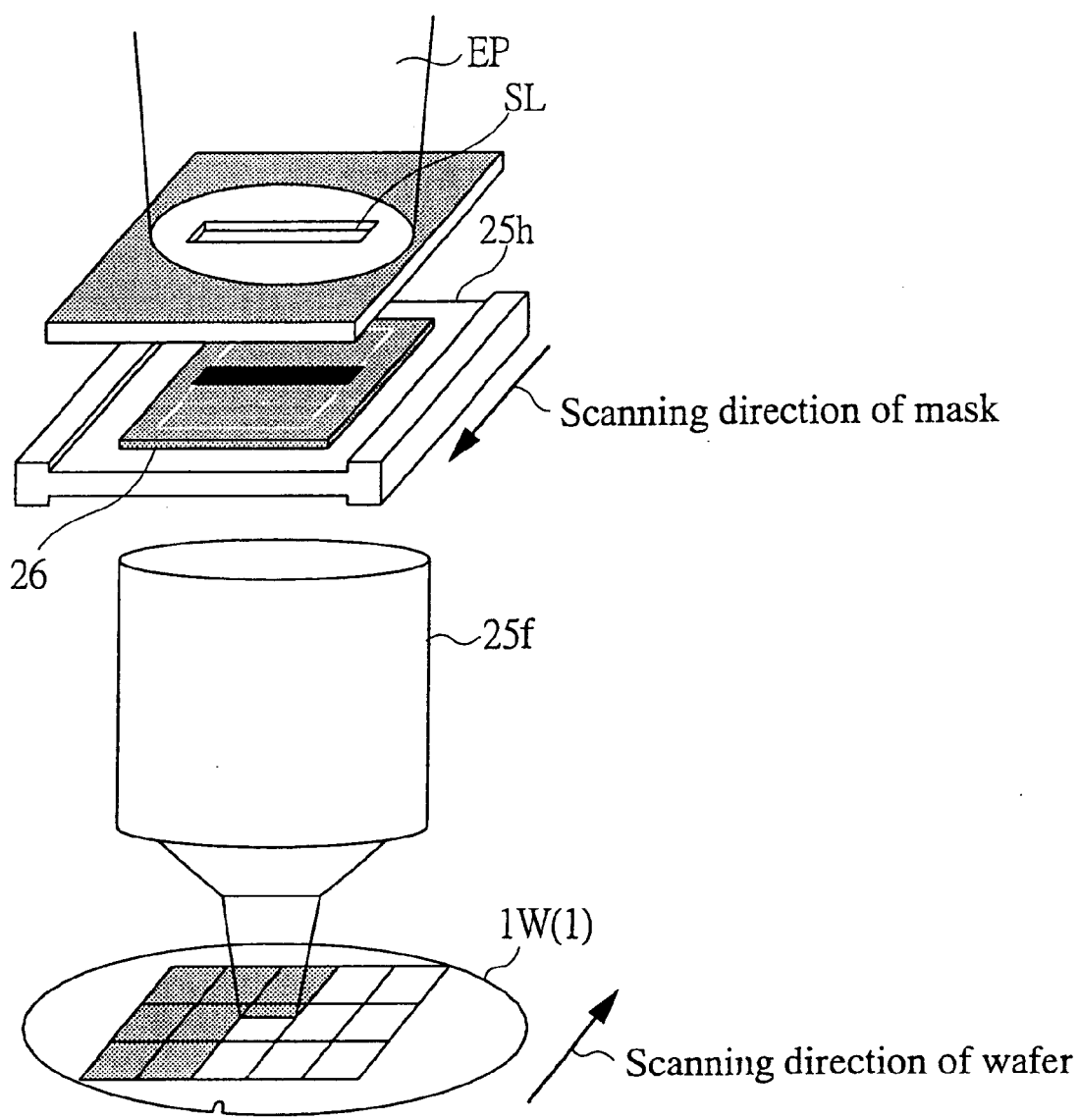
FIG. 39 is a view schematically showing the exposure operation of the exposure apparatus shown in FIG. 38.

FIG. 39 is a view schematically showing exposure operation of the above-mentioned exposure apparatus 1. Since a relationship between the mask 26 and the wafer 1W is mirror-symmetric, a scanning direction of the mask 26 and a scanning direction of the wafer 1W are opposite to each other during exposure treatment. The mask 26 disposed on the mask stage 25h and the wafer 1W disposed on the wafer stage 25i are precisely synchronized with each other at a predetermined driving ratio and are scan-driven. Since the mainstream of the reduction ratio of the scanner is 4:1, when a driving distance of the wafer 1W is 1, a driving distance of the mask 26 becomes 4. Since a slit-like exposure region formed by pass of an exposure light EP through a slit SL is scanned on the mask 26 in accordance with scanning operation of the mask 26, a mask pattern on the mask 26 is exposed and transferred onto a main surface of the wafer 1W (this is an explanation of the above-mentioned scanning exposure.).

However, in the case where the mask pattern is transferred onto the substrate through an image forming optical system, shape deterioration of the transfer pattern, transfer position shift (deviation) and the like are affected by aberration which is an error of an optical system. The aberration of the image forming optical system exists and is distributed within an exposure filed. This amount of aberration can be expressed by a Zernike aberration function, and a size of each aberration component thereof corresponds to a coefficient of each term. It is known that, among the aberration components, a Trefoil aberration constituted by a tertiary and quintic coma aberrations results from the shape deterioration or the positional deviation of the transferred pattern.

In the case of the above-mentioned scanner, for example, when a pattern is transferred by scanning in a wide (short) direction of the above-mentioned slit-like exposure region, the lens aberration is basically distributed only in a longitudinal direction of the slit-like exposure region. Therefore, in the case of disposing a plurality of patterns along the wide direction (i.e., in a scanning direction) of the above-mentioned slit-like exposure region on the mask 26 and by performing multiple exposure of this, each amount of lens aberration by which each pattern is affected becomes the same between patterns transferred to the same position on the substrate. That is, if the transfer patterns are the same, the transfer pattern position caused by aberration is the same relative to the scanning direction. Therefore, the shape deterioration and positional deviation and the like as described above can be reduced or eliminated.

The transfer position shift amount of each transfer pattern changes to depend not only on the aberration amount but also the pattern arrangement. For example, the transfer position shift amount changes to depend on each arrangement pitch, but the shift amount in the scanner is linearly distributed relative to the longitudinal direction of the slit-like exposure region. Therefore, since each position of the mask pattern may be linearly corrected, the correction thereof is easier than a stepper.

In the case of the scanner, the maximum exposure field becomes greater, for example, 25×33 mm in size in comparison with the stepper whose size is 22×22 mm, and there is thereby the advantage of disposition of a greater semiconductor chip onto one mask 26. By this, a size of each maximum chip for a double exposure capable of being disposed on one mask 26 can be enlarged, for example, to 25×16.5 mm which is greater than 22×11 mm of a sequentially moving type reduction projection exposure apparatus (called stepper hereinafter).

In FIGS. 38 and 39, only portions necessary for explaining functions of the exposure apparatus have shown, and other portions necessary for using a normal exposure apparatus (scanner or stepper) are similar within a normal range used. And, the technical idea of the present invention can be applied to an exposure technique using the stepper. In the case of the stepper, an exposure chip, for example, of 22×22 mm is once exposed to transfer the mask pattern onto the substrate. However, since the aberration is distributed in this exposure chip and exists thereon, if the stepper is used, the transfer pattern shape is varied as depending on the position thereof in the exposure chip, or the transfer pattern position is transferred so as to deviate from ideal position having no aberration. For example, in the case where two kinds of mask patterns are disposed on the same mask and are superposed and multiple-exposed, since the patterns to be multiple-exposed on the substrate have aberration amount different from each other, the shift amount of each transfer pattern position is also different at transference of each pattern onto the substrate. Since this results in difference of the transfer position shift amount between respective patterns, it is likely that relatively superposed deviation between patterns of two kinds is caused due to effects of the position shift.

In the case of the stepper, since the aberration amount is two-dimensionally distributed in the exposure chip, correction of the transfer pattern position on the mask becomes complicated in order to correct the transfer pattern position shift. Further, since mask patterns for two shots are disposed on the same mask substrate, throughput derived from restriction of chip size capable of being exposed and increase of number of exposure shots per substrate may be reduced. Further, in the case of use of two masks, the amount of aberration that each pattern to be multiple-transferred on the substrate is affected is the same, but since the masks are replaced and multiple-exposed on the same substrate as described above, throughput may be reduced. By taking the above description into consideration, use of the scanner can perform double exposure treatment easier and more precisely.

Next, the mask used in the present embodiment will be explained.

First, the exposure technique for forming the photoresist patterns used in forming the active regions L (trench isolations 2) shown in FIG. 1 and the like, will be explained.

Figure 40A:
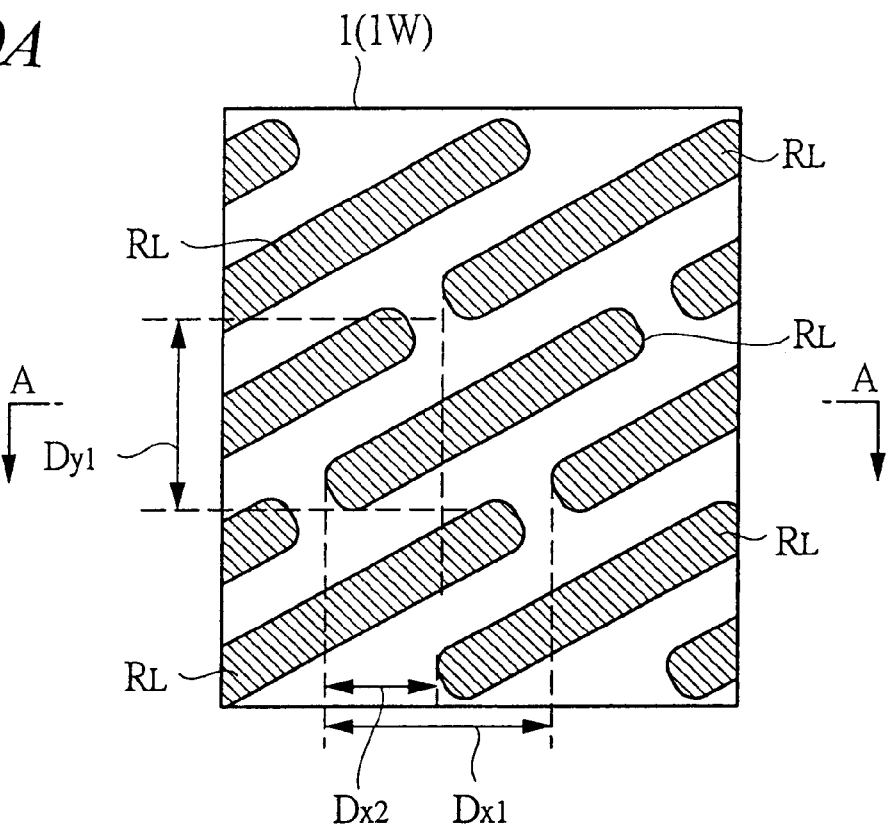
FIG. 40A is a plane view of an essential portion of a photoresist pattern for forming an active region shown in FIG. 1.
Figure 40B:
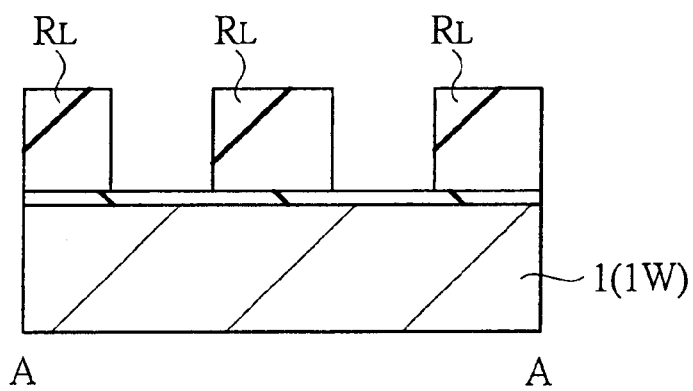
FIG. 40B is a cross-sectional view taken along A—A line of FIG. 40A.

FIG. 40A is a plan view of each essential portion of photoresist patterns RL for forming the active regions L shown in FIG. 1 and the like. FIG. 40B is a cross-sectional view taken along line A—A of FIG. 40A. FIG. 40A is a plan view in which the photoresist patterns RL are hatched for easy understanding the drawing.

Each photoresist pattern RL is required that an adjacent interval D2 between adjacent photoresist patterns RL extending in the longitudinal direction of each active region L is set for the photoresist patterns to be extremely close to each other, for example, at 160 to 180 nm (such an interval as to be able to dispose one word line WL described above). That is, an arrangement pitch of the required pattern is fine. Due to this, in an exposure treatment using a normal mask, because slops of the light intensity become smoothened and a retreating amount of each photoresist pattern becomes great after the development, and sufficient light intensity can not be obtained from the longitudinal direction of each pattern, it is extremely difficult to form each pattern under such a state as to keep the above-described fine arrangement pitch. This results in requirement for using the Levenson type phase shift mask as a mask for transferring each photoresist pattern RL.

As performed in a technique of a normal Levenson type phase shift mask, consider the case where each photoresist pattern RL is transferred onto a negative type photoresist film by using the Levenson type phase shift mask. As described above, use of the Levenson type phase shift mask requires that a phase difference of each light that permeates adjacent light permeating regions is set at 180 degrees. However, in the layout of the photoresist patterns RL, since three patterns or more among the light permeating regions for transferring this are respectively arranged close at a distance required to dispose the phase shifters, the phase shifters can be arranged such that each transferring light has a phase difference of 180 degrees between all the light permeation regions close thereto. That is, there certainly occurs the case that each of at lease one pair among the transferring lights passing through the light permeation regions close thereto, has the same phase.

Now, in the present embodiment, when each photoresist pattern RL for forming a pattern of each active region L shown in FIG. 1 is formed, a positive type photoresist film is used as a photoresist film and a multiple exposure method in which a plurality of mask patterns are superposed and exposed on the same position of the positive type photoresist film on the wafer 1W (substrate 1) is employed. Each active region L is separated into a band-like pattern extending diagonally and a hole pattern which cuts predetermined portions thereof.

Figure 41A:
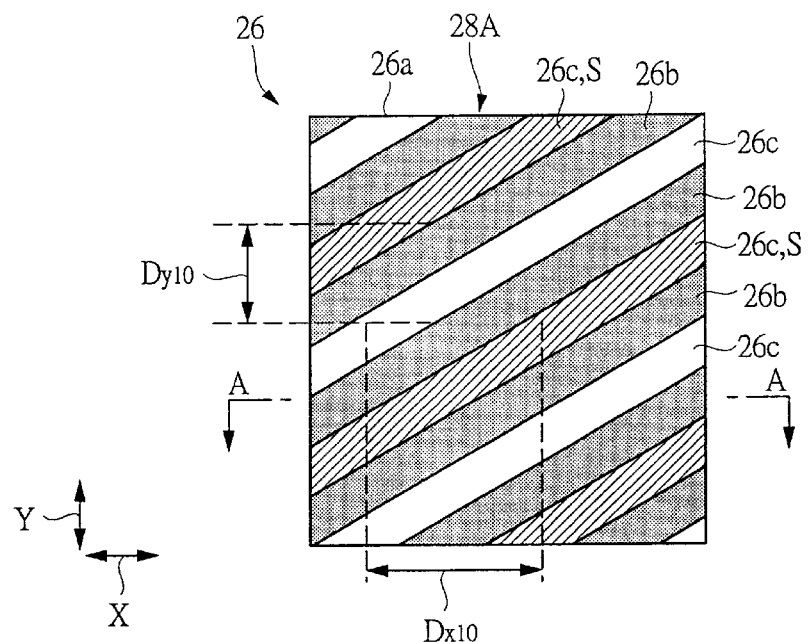
FIG. 41A is a plane view of an essential portion of a mask pattern for transferring the photoresist pattern shown in FIG. 40.
Figure 41B:
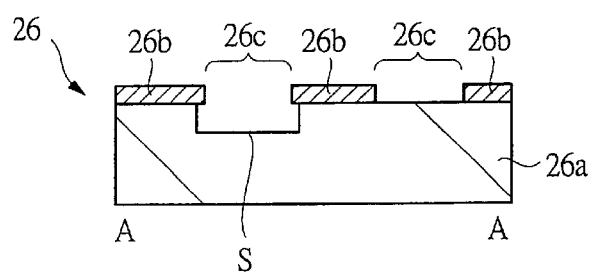
FIG. 41B is a cross-sectional view taken along A—A line of FIG. 41A.
Figure 41C:
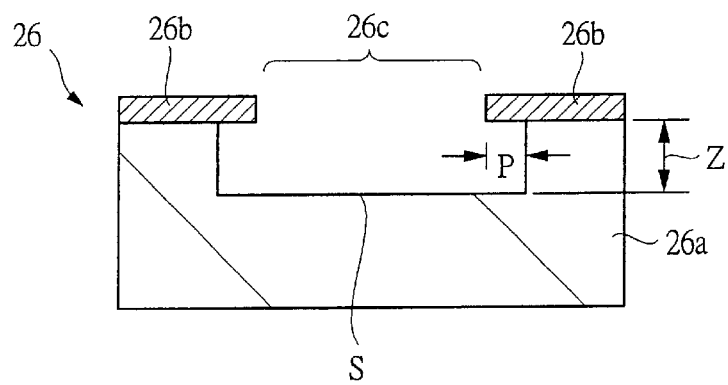
FIG. 41C is an enlarged cross-sectional view of a phase shifter portion of FIG. 41B.

FIGS. 41A to 41C show a first mask pattern 28A of the mask 26 for forming a photoresist pattern for forming each active region described above. FIG. 41A is a plan view of an essential portion thereof, FIG. 41B is a cross-sectional view taken along line A—A of FIG. 41A, and FIG. 41C is an enlarged cross-sectional view of a phase shifter of FIG. 41B.

A mask substrate 26a constituting the mask 26 of FIGS. 41A to 41C comprises, for example, transparent synthetic quartz glass, and a mask pattern 28A shown in FIG. 40A is formed on a main surface of the substrate 26a. This mask pattern 28A is a pattern for exposing a line/space pattern extending diagonally relative to the XY direction, and has band-shaped light shield patterns 26b extending diagonally (inclination of about 28 degrees in the X direction, for example) in the XY direction, and light transferring patterns 26c. Each light shield pattern 26b and each light transferring pattern 26c are alternately arranged along a wide (short) direction of the pattern. A phase shifter S is disposed in one of the light transferring patterns 26c and 26c which are disposed in both sides of each light shield pattern 26b and which are adjacent to each other. Due to this, lights that have passed through the permeation patterns 26c and 26c adjacent to each other have a phase difference of 180 degrees different from each other. That is, each light is inverted at 180 degrees. A dimension Dx10 is about 520 nm, for example (converted to wafer size). A dimension Dy10 is about 280 nm, for example (converted to wafer size).

Each light shield pattern 26b constituting the mask pattern 28A is formed of a light shield film such as chromium, chromium oxide or a laminated film thereof. Each light transferring pattern 26c is formed after the light shield film is removed. As shown in FIGS. 41B and 41C, the phase shifter S is, for example, a trench shifter. That is, the phase shifter S is formed by digging a trench having a predetermined depth (satisfying the equation of the above-mentioned Z) in the mask substrate 26a. In the above example, the depth Z of the phase shifter S is, for example, about 245 nm by use of the KrF having an exposure wavelength of about 248 nm.

Here, a case in which the trench shifter is the above-mentioned fine visor type trench shifter is shown. That is, the mask substrate 26a is overhung in the wide direction of the trench in a periphery of the phase shifter S (in a cross-sectional direction having narrow width). As a result, each light shield pattern 26b to face the phase shifter S has a structure of having an end thereof projecting like a visor. An optimal value P about length of the visor projecting from each light shield pattern 26b depends on pattern pitch thereof, optical conditions and the like, and, in the case of using a mask for a scanner having a reduction ratio of 4:1, the optical value thereof is about 0.15 μm. Since the visor structure of this like results in restriction of waveguide effect of light, light intensity of the transferring light can be prevented from being weakened by effects caused from side walls of the phase shifter S. Therefore, when multiple-exposure treatment is performed by using the mask 26, it is possible to enhance dimensional precision of each pattern to be transferred onto the wafer 1W.

Figure 42:
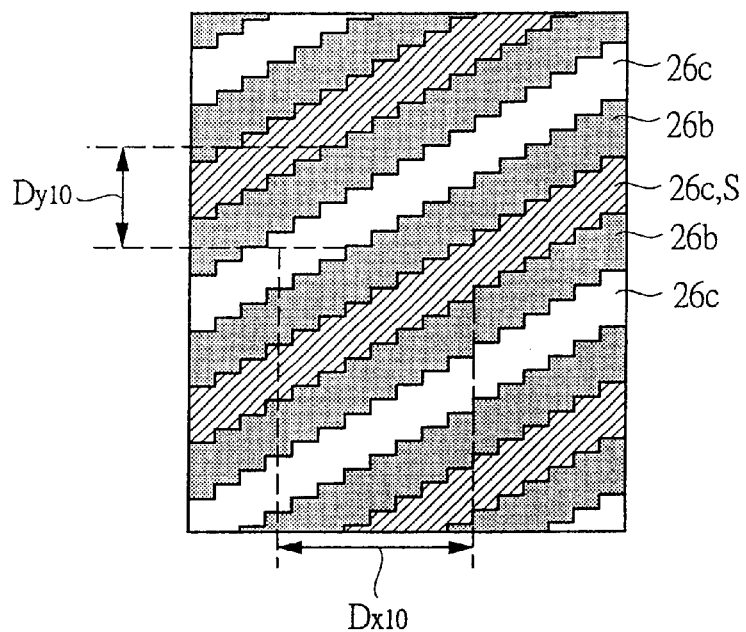
FIG. 42 is a plan view of an electron beam drawing data of the mask pattern shown in FIG. 41.
Figure 43:
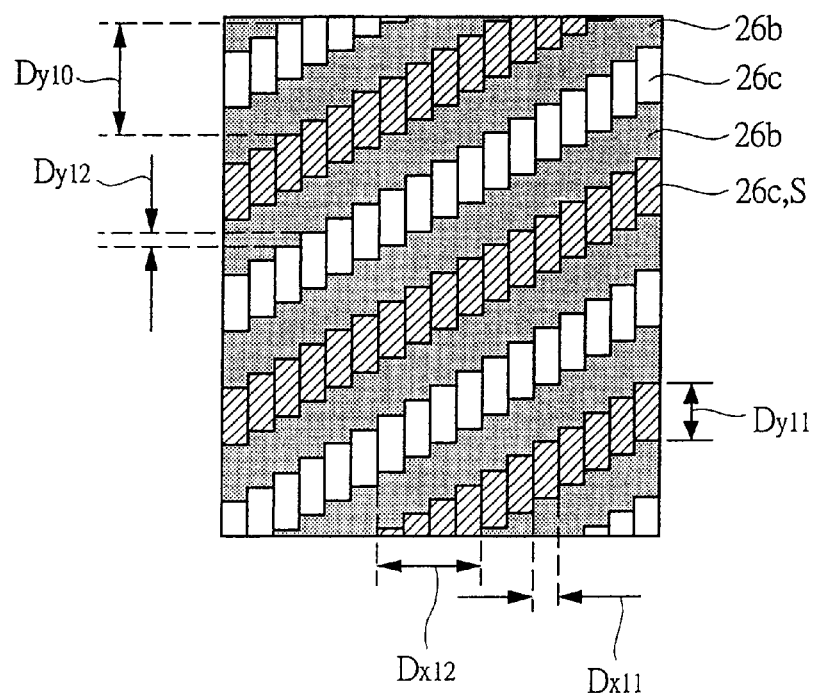
FIG. 43 is a plan view showing an example of a mask pattern layout having a stairs-shaped pattern within a range capable of obtaining sufficiently resolving characteristics by wafer process.

The mask pattern 28A shown in FIG. 41 is a line/space pattern inclining about 28 degrees in the X direction. Therefore, in the case where this pattern is drawn by electron beam exposure apparatus having a vector-scan type of variable rectangular beams, the inclined pattern is divided into a large number of rectangular-shaped patterns to draw the inclined pattern by approximation. That is, a mask pattern layout shown in FIG. 41A becomes fine step-shaped patterns as schematically shown in FIG. 42 in terms of electron beam drawing data. This has caused a problem of increase of both the number of the electron beam shots during a mask pattern drawing and time necessary for drawing operation. Therefore, regarding the layout of the mask pattern for transferring such inclined patterns, it is preferable to layout the mask pattern such that the number of the exposure shots is reduced in drawing the mask pattern. FIG. 43 shows one example of a mask pattern layout using step-shaped patterns having a size included within such a range as to be able to obtain sufficient resolution during wafer process. In this case, each light transferring pattern 26c is divided into a plurality of fine rectangular patterns, for example, of 65 nm (=Dx11)×135 nm (Dy11), and these rectangular patterns are arranged along the X direction while offsetting 35 nm (=Dy12) from one another in the Y direction. At this time, dimension of the rectangular pattern is 260×540 nm on the mask which is four times greater, but value of this dimension is within dimensional range capable of drawing on shot when the drawing is performed by the electron beam exposure apparatus. A deviating amount Dy12=35 nm relative to the Y direction is set to a value multiplying the pitch Dy10=280 nm by ⅛, and a size 65 nm of a rectangular extending in the X direction is a value multiplying the pitch Dx12=260 nm by ¼. The reason why each cut of the X direction is greater than that of the Y direction is that the cut angle of each inclined pattern is inclined about 28 degrees from the X direction. When a raster scan type electron beam (EB) drawing apparatus is used, since a drawing system thereof is different, the pattern layout may employ patterns having a diagonal direction. And, in a type EB drawing apparatus, such a method or the like can be used that portions of each inclined pattern are linked together and drawn as a cell configuration. Additionally, it is also possible to draw not only the rectangular-shaped patterns but also the inclined patterns (e.g., triangular-shaped patterns) by using aperture having transmittable opening portions.

Figure 44:
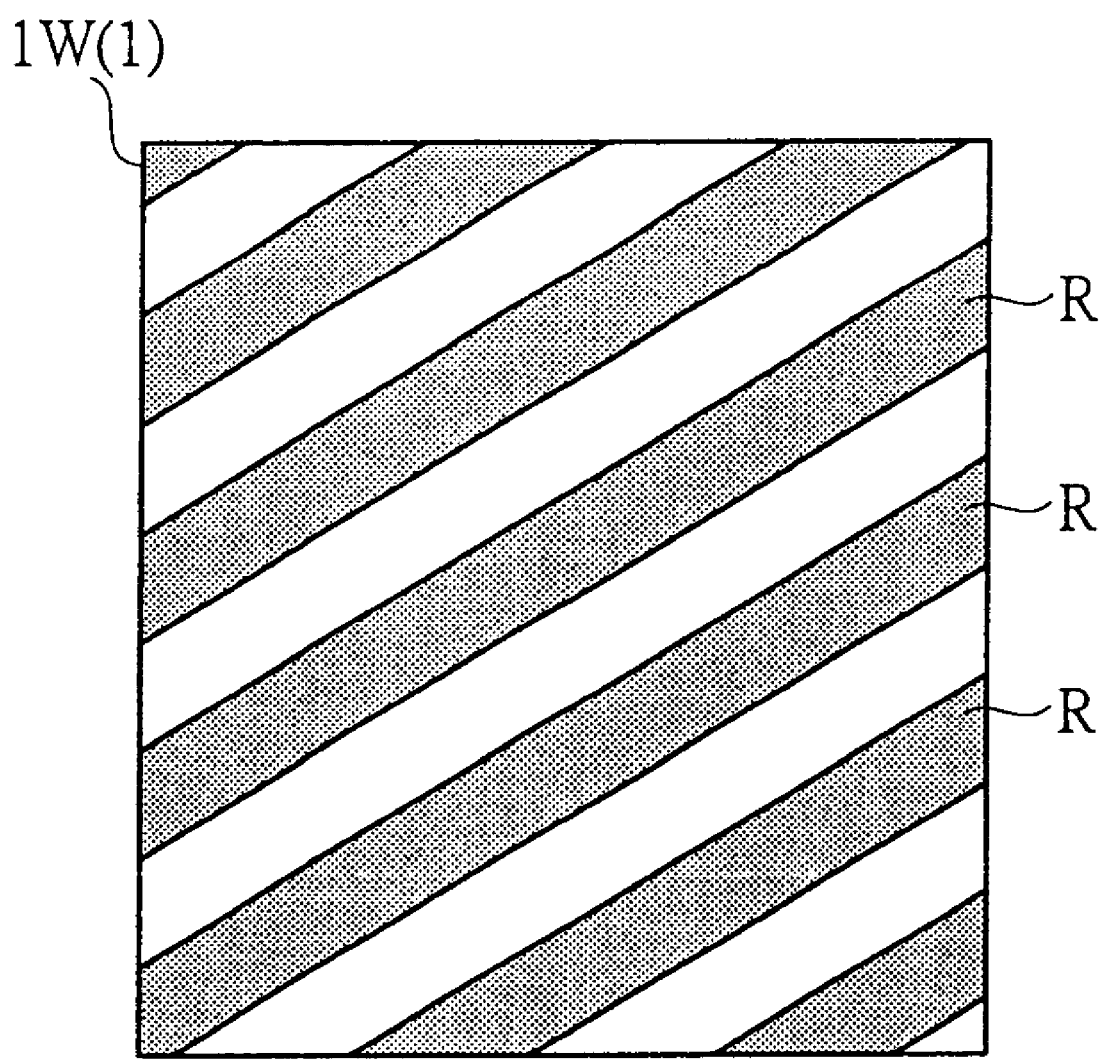
FIG. 44 is a plane view of an essential portion of the photoresist pattern when only the mask pattern shown in FIG. 41 is transferred to a photoresist film.

FIG. 44 schematically shows a case in which only the mask pattern 28A is exposed on a positive type photoresist film. Regions in which exposure light is illuminated are shown as hollow portions. On the other hand, other regions in which the exposure light is not illuminated are shown as hatched portions. Since each photoresist film R is a positive type, if it is developed (in actual case, it is developed after the multiple-exposure), then the exposed regions (hollow regions) are removed. Use of only this mask pattern 28A forms band-shaped photoresist patterns R (i.e., photoresist patterns for forming line patterns) extending in the inclined direction shown in FIG. 44, but can not form island-shaped photoresist pattern. Therefore, by partially removing predetermined portions of the band-shaped photoresist patterns R, it is necessary to prepare a second mask pattern for forming the island-shaped photoresist patterns and to superposition-expose the second mask pattern.

Figure 45A:
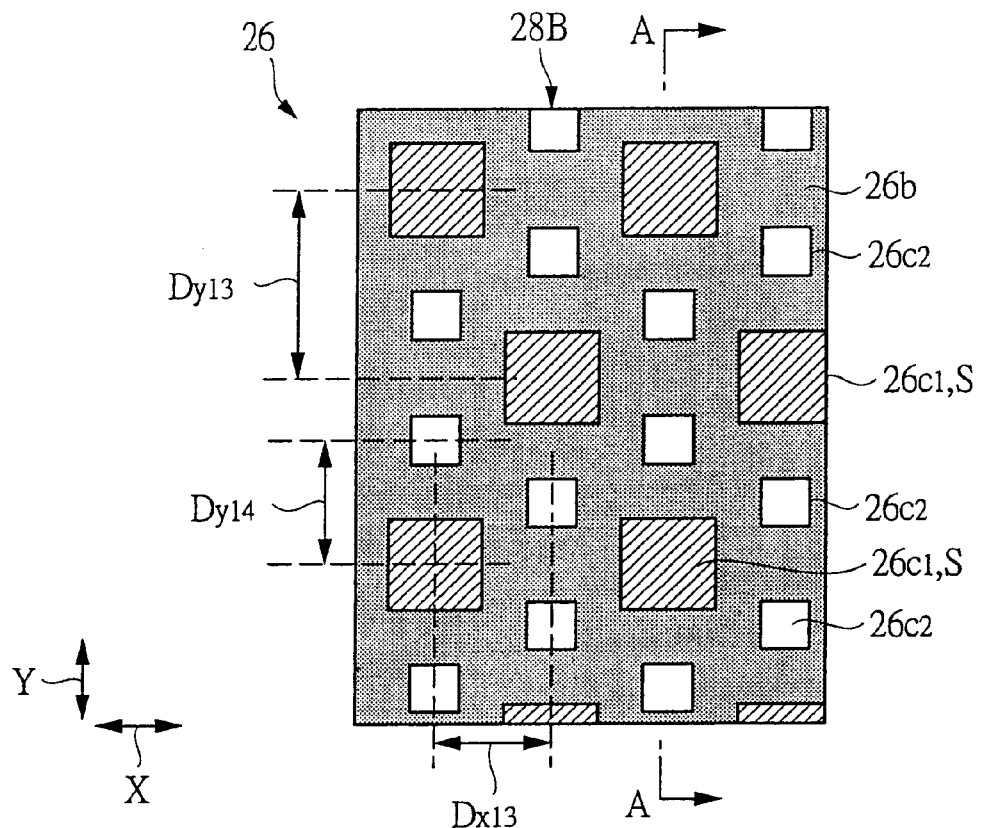
FIG. 45A is a plane view of an essential portion of a second mask pattern in the photomask for transferring the photoresist pattern shown in FIG. 40.
Figure 45B:
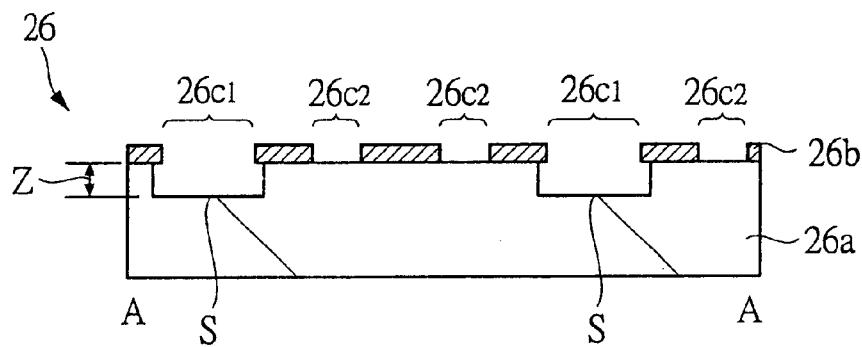
FIG. 45(b) is a cross-sectional view taken along A—A line of FIG. 45A.

FIGS. 45A and 45B show a second mask pattern 28B of the mask 26 for forming the photoresist patterns for forming the above-mentioned active regions used for superposition-exposure, and FIG. 45A is a plan view of an essential portion of thereof, and FIG. 45B is a cross-sectional view taken along line A—A of FIG. 45A.

The mask pattern 28B formed on a main surface of the mask substrate 26a shown in FIGS. 45A and 45B is a pattern for forming the island-shaped photoresist patterns by exposing a region having an adjacent interval between the adjacent active regions L in the longitudinal direction of each active region L, in each band-shaped photoresist pattern R of FIG. 43, which remains without being exposed in the mask pattern 28A of FIG. 41.

This mask pattern 28B has each main light transferring pattern 26c1 and each auxiliary light transferring pattern 26c2 arranged in peripheral regions thereof. Each main light transferring pattern 26c1 and each auxiliary light transferring pattern 26c2 are formed like a flat-surface square. A plane dimension of each main light transferring pattern 26c1 is, for example, about 200×200 nm (converted to wafer size). And a plane dimension of each auxiliary light transferring pattern 26c2 is relatively smaller than that of the main light transferring pattern 26c1, and has such no size that as to be transferred onto the photoresist film, and is, for example, about 100×100 nm (converted to wafer size). Here, the phase shifters S are disposed on the main light transferring patterns 26c1, respectively. This results in generating of a phase difference of 180 degrees between respective lights having passed through each main light transferring pattern 26c1 and the auxiliary light transferring pattern 26c2. Each phase shifter S is, for example, the above-mentioned fine visor type trench shifter similar to the above-mentioned mask pattern 28A. A depth of the trench of the phase shifter S is the same as that of the trench of the phase shifter S of the above-mentioned mask pattern 28A.

In the second mask pattern 28B, a pitch Dx13 between the main light transferring patterns 26c1 and 26c1 adjacent to each other in the X direction (a second direction) is a minimum approach pitch of the pattern, and its distance is, for example, about 2×0.33×(λ/NA) to 2×0.45× (λ/NA) nm, and is in a range of about 120 to 160 nm on the wafer. Here, a pitch Dx13 between the main light transferring patterns 26c1 adjacent to each other in the X direction is, for example, about 260 nm (converted to wafer size). An adjacent pitch between the main light transferring patterns 26c1 and 26c1 adjacent to each other in the Y direction (a first direction) is longer than an adjacent pitch between the main light transferring patterns 26c1 and 26c1 adjacent to each other in the X direction. Here, a pitch Dy13 between the main light transferring patterns 26c1 and 26c1 adjacent to each other in the Y direction is, for example, about 420 nm (converted to wafer size). A pitch Dy14 between each main light transferring pattern 26c1 and each auxiliary light transferring pattern 26c2 adjacent to each other in the Y direction is, for example, about 280 nm (converted to wafer size).

However, generally, for designing the mask pattern 28B, only the main light transferring pattern is disposed, and a phase shifter might be disposed in only one of the adjacent main light transferring patterns. But, in the case of the mask pattern 28B, since the phase shifters are closely disposed in the Y direction, a distance of each disposing arrangement requiring to dispose each phase shifter is to narrow to dispose each phase shifter in a normal manner. Therefore, in the present embodiment, the auxiliary light transferring patterns are disposed around each main light transferring pattern, and the light which has passed through each auxiliary light transferring pattern is reversed to an angle of 180 degrees, so that the resolution thereof can be enhanced. In this case, since merely disposition of the auxiliary light transferring patterns causes inconvenience, a method of illuminating the inconvenience is added. A method of arranging the auxiliary light transferring patterns is explained below.

Figure 46A:
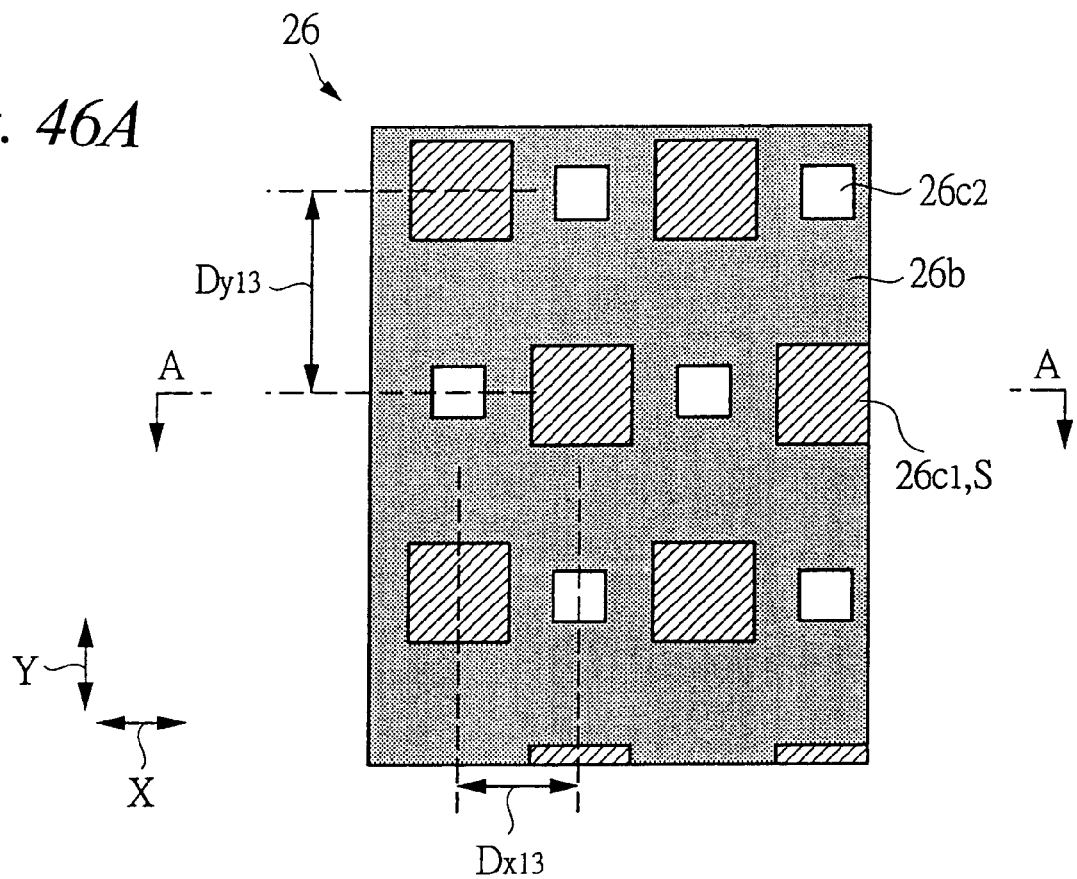
FIG. 46A is a plane view of an essential portion of a photomask that the present inventors have considered.
Figure 46B:
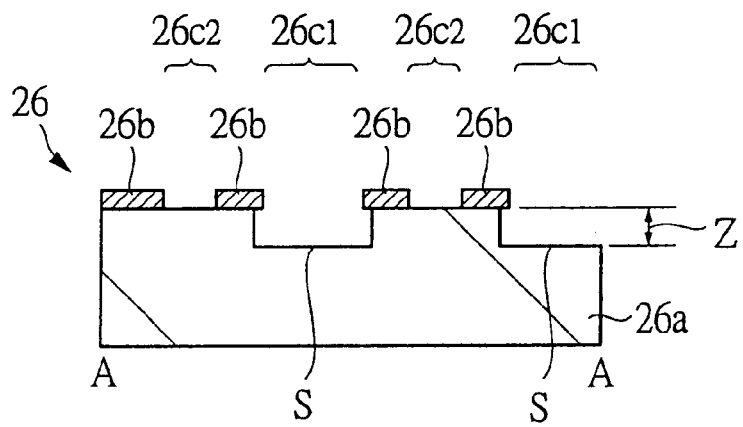
FIG. 46B is a cross-sectional view taken along A—A line of FIG. 46A.

As an arrangement method of the auxiliary patterns, as shown in FIGS. 46A to 46B, there is a method for disposing each auxiliary pattern in an intermediate position between the main light transferring patterns 26c1 in the respective X and Y directions. In this case, since a distance between each main light transferring pattern 26c1 and each auxiliary light transferring pattern 26c2 is slightly different, the phase shift effect is also different in the X direction and the Y direction. Therefore, the optical image projected on the wafer 1W (substrate 1) becomes oval in shape, and there is an adverse possibility that a portion of each photoresist pattern RL located below and above a portion between adjacent regions extending in the longitudinal direction of each photoresist pattern RL shown in FIG. 40 becomes thinner due to effects of light which passed through each main light transferring pattern 26c1 of the second mask pattern 28B.

Figure 47A:
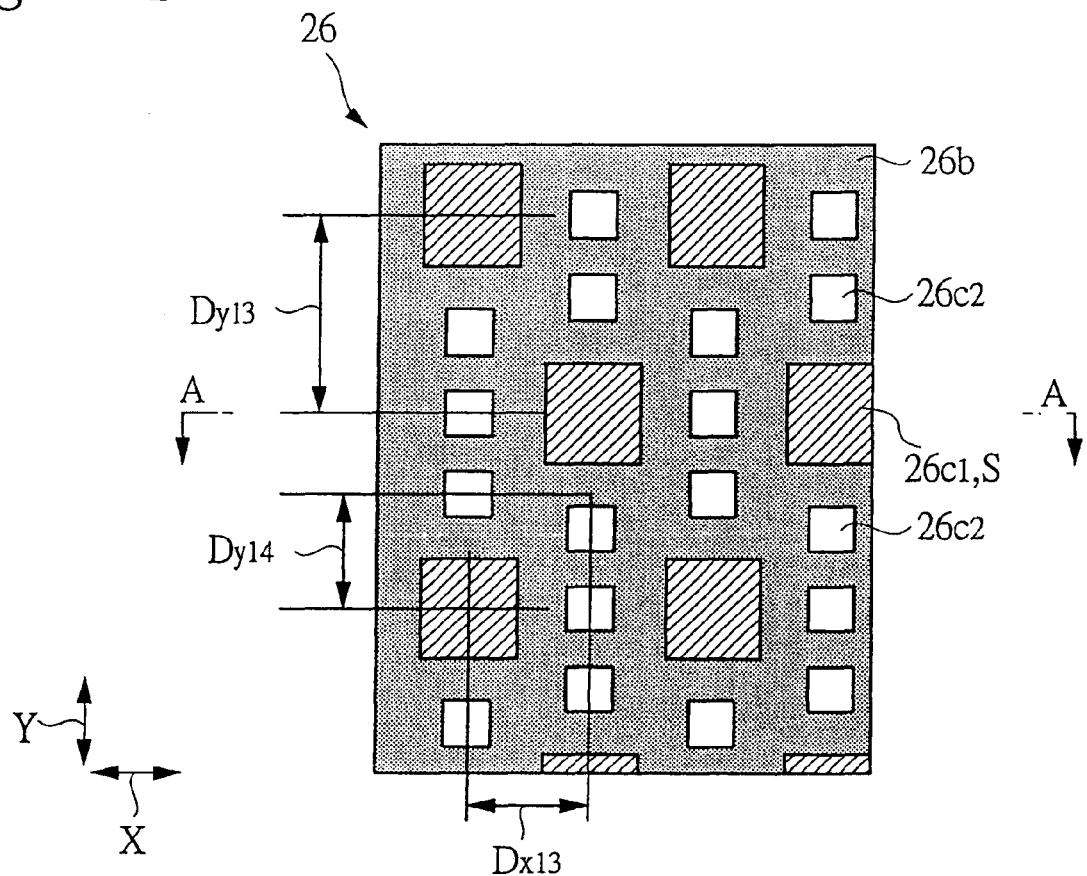
FIG. 47A is a plane view of an essential portion of a photomask that the inventors have considered.
Figure 47B:
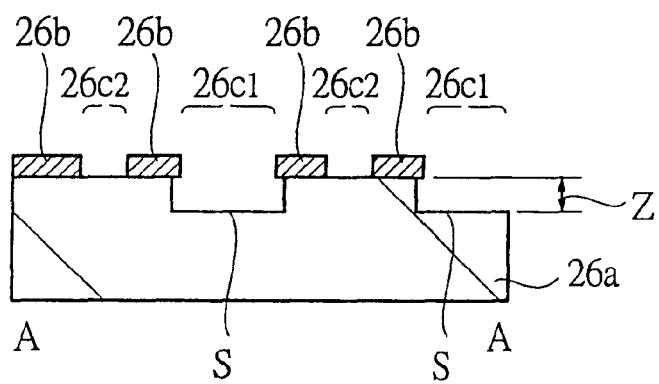
FIG. 47B is a cross-sectional view taken along A—A line of FIG. 47A.

Further, as shown in FIG. 47, there is another method to layout such that four auxiliary light transferring patterns 26c2 are arranged in above, below, right and left sides of each main light transferring pattern 26c1 at equal distances therefrom. In this case, this is a layout in which each auxiliary light transferring pattern 26c2 is disposed around the main light transferring pattern 26c1 having a pitch of 140 nm in the Y direction. However, in this case, since the plane dimension of each auxiliary light transferring pattern 26c2 is set to a rectangular pattern of 100×100 nm (converted to wafer size), a space between the auxiliary light transferring patterns 26c2 is as extremely small as 40 nm (converted to wafer size). Therefore, it is very difficult to produce the mask.

Now, as shown in FIGS. 45A and 45B, in the mask pattern 28B of the present embodiment, the auxiliary light transferring patterns 26c2 are disposed such that a distance from a center of each main light transferring pattern 26c1 to that of each auxiliary light transferring pattern 26c2 thereabout becomes substantially equal. That is, the auxiliary light transferring patterns 26c2 are disposed such that the center of each auxiliary light transferring pattern 26c2 is located at a corner of a hexagon whose center coincides with the center of each main light transferring pattern 26c1. The respective auxiliary light transferring patterns 26c2 around each main light transferring pattern 26c1 are disposed symmetrically in right-left and up-down sides relative to both the X and Y axes which passing the center of each main light transferring pattern 26c1.

From another point of view, this can be seen as follows. That is, each auxiliary light transferring pattern 26c2 is not disposed on the Y axis (axis based on the first direction) passing through the center of each main light transferring pattern 26c1, but is not disposed on an X axis (axis base on the second direction) passing through the center of each main light transferring pattern 26c1, and is disposed at such a position as to be separated in upper and lower sides from the X axis relative to the Y direction and to become symmetrical by regarding the X axis as a center line.

Figure 48:
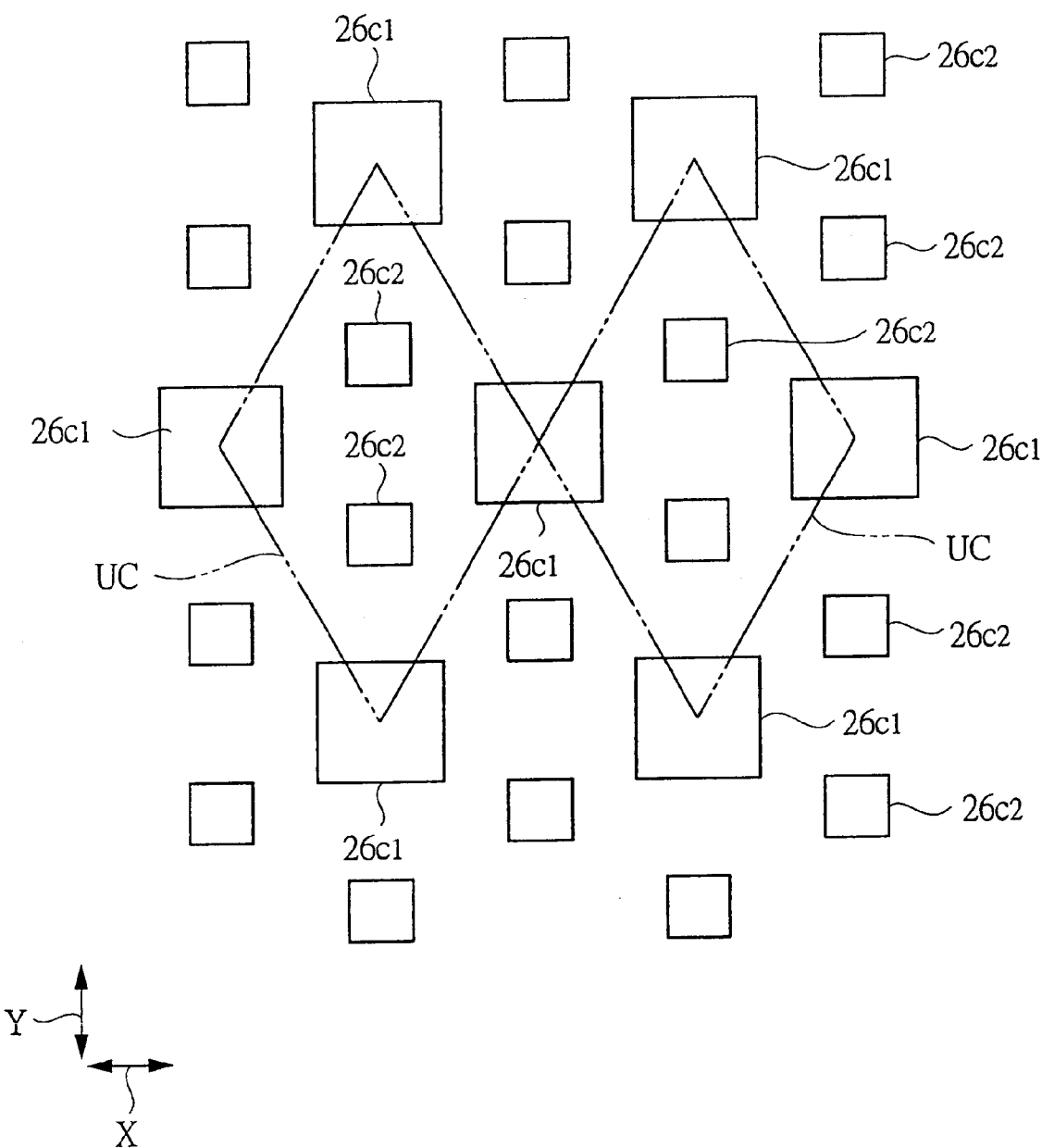
FIG. 48 is an explanatory view of the mask pattern shown in FIG. 45.

Further, from still another point of view, this can be seen as follows. That is, as shown at two dots and dash line of FIG. 48, such unit cells UC as to contain two auxiliary light transferring patterns 26c2 can be imaged. The two auxiliary light transferring patterns 26c2 in each unit cell UC are disposed on the Y axis passing through each center of the two main light transferring patterns 26c1 and 26c1 arranged along the Y direction. And, the two auxiliary light transferring patterns 26c2 are not disposed on the X axis passing through the center of each of the two main light transferring patterns 26c1 and 26c1, but are disposed to become symmetric by regarding the X axis as a center line.

In the layout of such a mask pattern 28B, a projection optical image on the wafer 1W (substrate 1) relative to each main light transferring pattern 26c1 can be made substantially circular. And, in the upper and lower positions of a region between adjacent active regions L extending in the longitudinal direction of FIG. 1, deformation of the photoresist pattern can be suppressed to a small degree.

Figure 49:
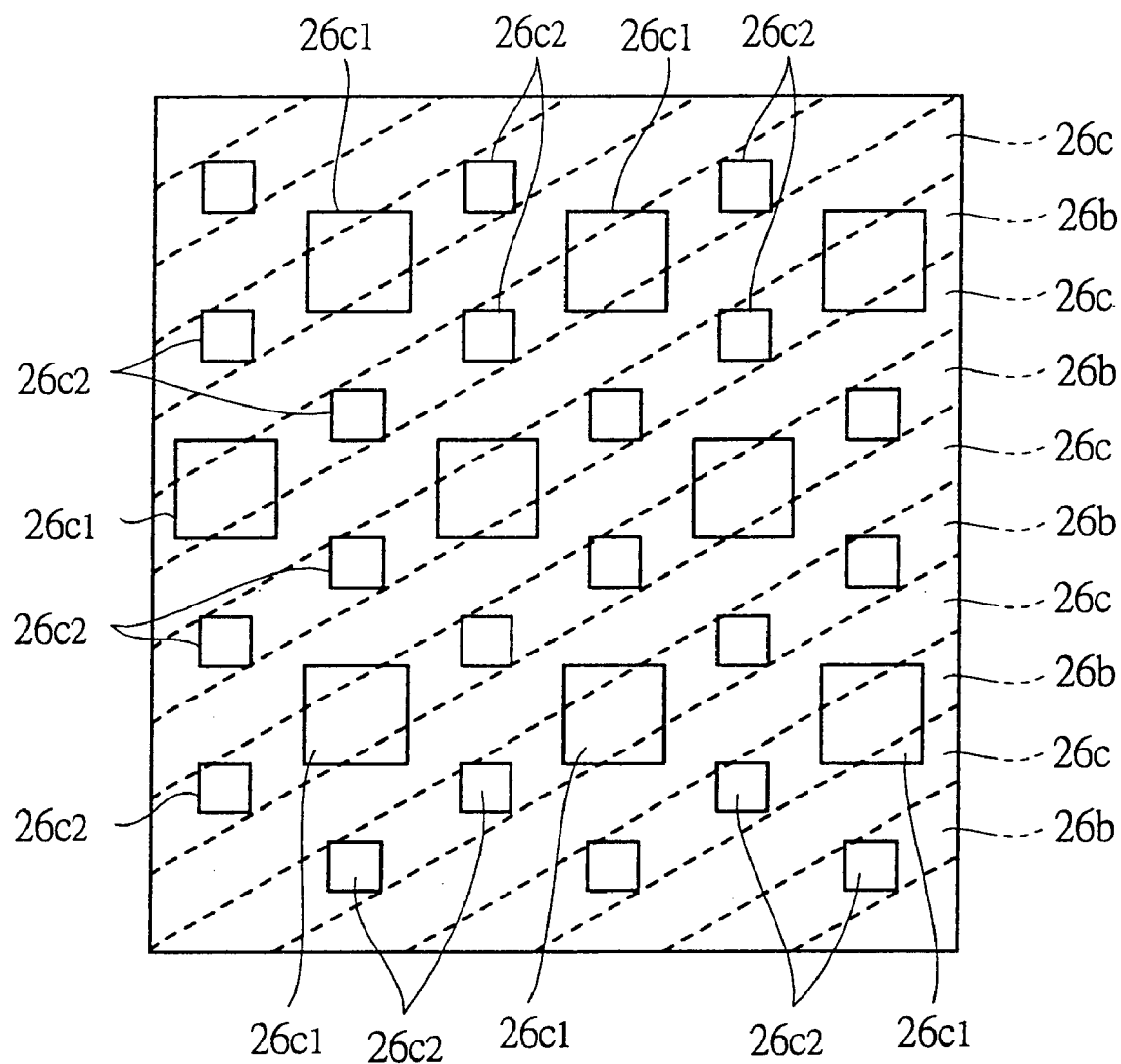
FIG. 49 is an explanatory view showing a state of superposition of both mask patterns shown in FIGS. 41 and 45.

FIG. 49 shows a state in which data of the first mask pattern 28A and data of the second mask pattern 28B are superposed. One dot lines show the first mask pattern 28A, and solid lines show the second mask pattern 28B. The main light transferring patterns 26c1 and the auxiliary light transferring patterns 26c2 of the second mask pattern 28B are arranged on the light shield patterns 26b of the first mask pattern 28A.

Next, a technique concerning the multiple-exposure treatment will be explained.

Figure 50:
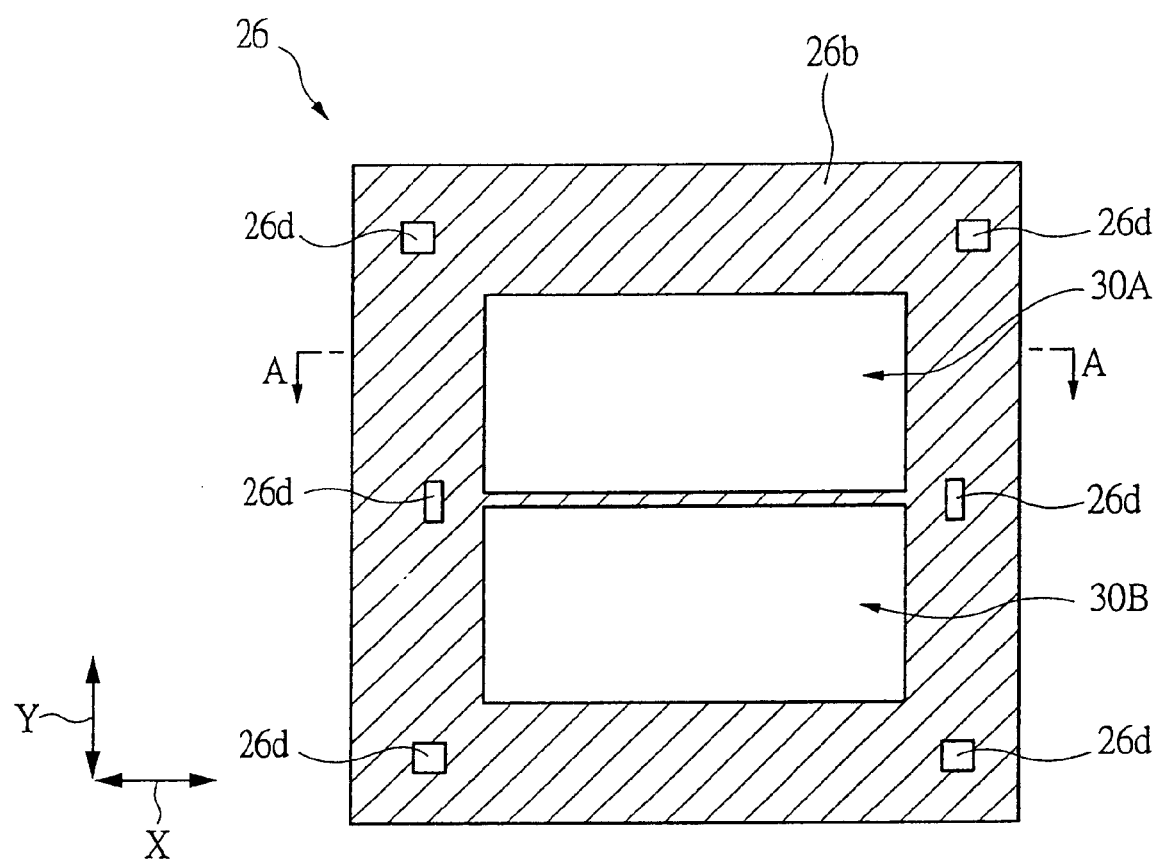
FIG. 50 is a plan view of the entire photomask used in the manufacturing process of the semiconductor integrated circuit device of the present embodiment.

First, in the present embodiment, FIG. 50 shows a plan view of the entire mask for transferring each active region. Here, a case in which two transfer regions 30A and 30B, for example, are disposed on a main surface (the same surface) of one mask 26 is illustrated. Each of the transfer regions 30A and 30B is formed, for example, like a plane rectangular, and is disposed such that long sides thereof are in parallel to each other at a predetermined distance therebetween. Each of the transfer regions 30A and 30B corresponds to a region, for example, for transferring one semiconductor chip. This mask production is suitable for such a structure that a plane dimension of the semiconductor chip is small and two semiconductor chip transfer regions can be disposed in one mask.

The first mask pattern 38A shown in FIG. 41 is disposed in a memory cell region of the transfer region 30A, and the second mask pattern 38B shown in FIG. 45 is disposed in a memory cell region of the transfer region 30B. in the multiple-exposure treatment, the first mask pattern 28A of the transfer region 30A and the second mask pattern 28B of the transfer region 30B are precisely positioned and transferred onto a positive type photoresist film on the wafer 1W (substrate 1). The longitudinal dimension of each active region L (each photoresist pattern RL) can be optimized by mainly adjusting a dimension of the second mask pattern 28B or exposure amount used during exposure of the second mask pattern 28B on the wafer 1W. Due to this, a desired dimension of each photoresist pattern can be obtained.

Since the mask patterns being outside the memory cell region are not transferred by normal exposure but by the multiple exposure, the mask patterns are disposed in the transfer region 30A. The mask patterns being outside the memory cell region may be transferred by multiple exposure. In the above-mentioned transfer regions 30A and 30B, patterns such as mark patterns used for superposition, mark patterns used for inspecting superposition, and mask patterns used for inspecting electric characteristics which do not constitute an actual integrated circuit, are also included in addition to patterns constituting the actual integrated circuit. In the light shield regions around the transfer regions 30A and 30B, a portion of a mask substrate 26a is exposed, and other light transferring patterns 26d such as alignment marks and measuring marks and the like are formed. These light transferring patterns 26d are such regions as to transfer no photoresist film thereon, or to be hidden by masking blades that shield exposure light illuminated at exposure.

Next, a concrete example of the multiple-exposure treatment will be explained. There is a method in which, first, in the state that each pattern of the transfer region 30A is masked (light-shielded) as not exposed, each pattern of the transfer region 30B is exposed on the positive type photoresist film of the main surface of the wafer 1W (substrate 1), and then in the state that each pattern of the transfer region 30B is masked (light shielded) as not exposed, each pattern of the transfer region 30A is superposed on each pattern of the transfer region 30B which has already been transferred (latent-imaged) on the positive type photoresist film of the wafer 1W and exposed.

And, as another method, there is a method in which plane dimensions of the transfer region 30A and the transfer region 30B are set to be equal to each other, the transfer regions 30A and 30B are collectively transferred on the positive type photoresist film of the wafer 1W, and then the mask 26 is moved along the Y direction to the dimension (width) of each Y direction side of the respective transfer regions 30A and 30B, and each pattern is exposed in a state of superposition of the exposure shots on half thereof.

In the former method, the respective transfer regions 30A and 30B can be exposed with optimal exposure amount and under optimal optical condition. On the other hand, in the latter method, since the exposure amount and the optical condition of both the transfer regions 30A and 30B are the same, it is necessary to optimize the mask pattern. But, the latter method is advantageous in terms of throughput in comparison with the former method.

In the above-mentioned example, a case in which the first and second mask patterns 28A and 28B are disposed on one mask 26 has explained, but the present invention is not limited thereto, and there is a method, for example, in which the multiple-exposure is performed by using two masks. That is, there is a method in which the first and second mask patterns 28A and 28B are disposed on separated masks, respectively, and the multiple-exposure is performed while the masks are exchanged. In this case, since the exposure is performed after the masks are replaced, it is possible to increase the shot size up to the maximum exposure field of the exposure apparatus similarly to the normal exposure. Further, since the exposure condition can be set to be optimal value for each pattern, it is possible to excellently set exposure margins or exposure conditions. This method is especially suitable for the case where the plane dimension of the semiconductor chip is large and two semiconductor chip transfer regions can not be disposed on one mask.

After completion of the multiple-exposure treatment, a series of processing such as normal developing processing and cleaning and drying processing is carried out, and thereby the photoresist pattern RL as shown in FIG. 40 is formed.

Figure 51A:
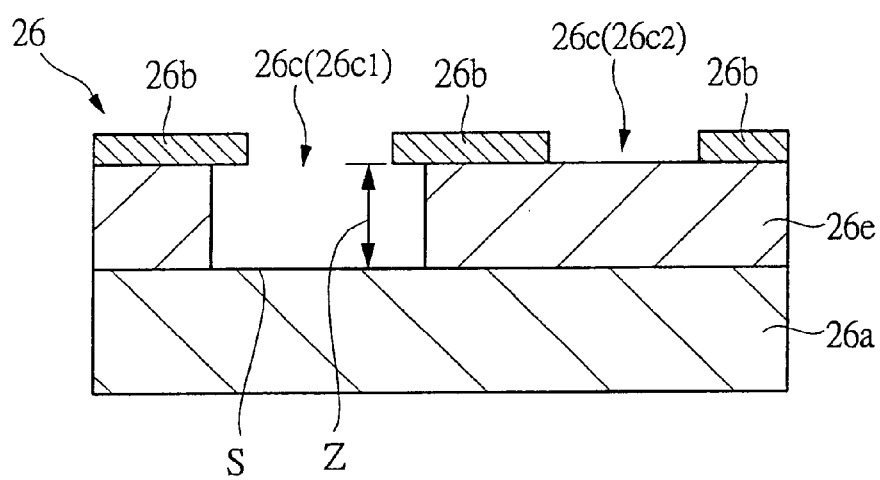
FIG. 51A is a cross-sectional view of an essential portion of the photomask showing modifications of the phase shift mask.

In the above-mentioned example, the case has explained where the phase shifter S is the trench shifter (fine visor type trench shifter), but the present invention is not limited thereto. For example, as shown in FIG. 51A, the shifter may be the above-mentioned on-substrate thin film trench shifter. In this case, a shifter film 26e is formed on the surface of the mask substrate 26a. The shifter film 26e is formed to have a thickness (as satisfying the above-mentioned equation Z) suitable for the purpose of functioning as the phase shifter, and, for example, is formed of SOG (spin on glass) or the like having light permeating rate and index of refraction, which are the same as or similar to those of the mask substrate 26a. A trench forming the phase shifter S is formed by removing the shifter film 26e of a predetermined light transferring pattern 26c (corresponding to the main light transferring pattern 26c1) exposed from each light shield pattern 26b until a surface of the mask substrate 26a is exposed. In this case, when the trench for the phase shifter S is formed, etching selection ratio between the mask substrate 26a and the shifter film 26e is set higher such that etching speed of the shifter film 26e becomes faster than that of the mask substrate 26a. That is, the trench for the phase shifter S is formed by using the mask substrate 26a as an etching stopper. This results in extremely high precise formation of depth (i.e., thickness of the shifter film 26e) and flatness of the bottom surface of the trench. Therefore, since the phase difference of the transferring light can be largely reduced or eliminated, it is possible to largely enhance the dimensional precision of each photoresist pattern to be transferred on the wafer 1W (substrate 1).

Figure 51B:
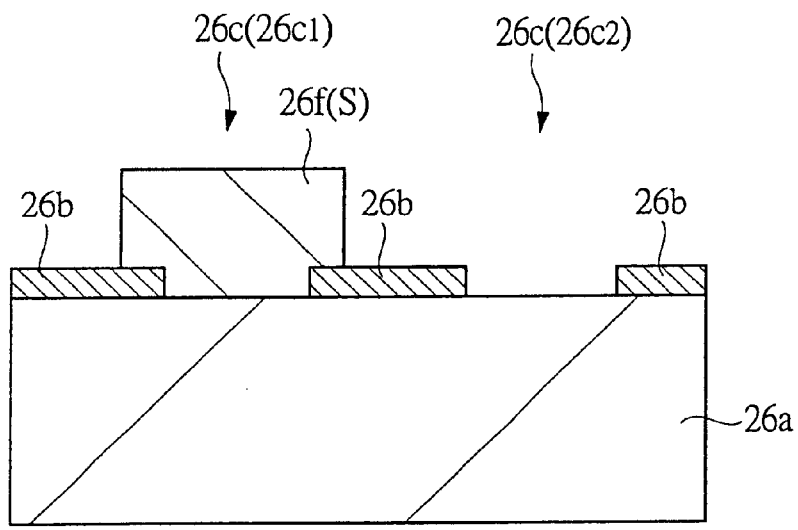
FIG. 51B is a cross-sectional view of an essential portion of the photomask showing modifications of the phase shift mask.

Further, as shown in FIG. 51B, a transparent film 26f can be used as the phase shifter S instead of the trench. In this case, a thickness of the transparent film 26f can be expressed by the equation Z about depth of the trench for the above-mentioned phase shifter S.

Next, an exposure technique for forming a photoresist pattern used in forming each pattern of the contact holes 10a and 10b shown in FIG. 11 and the like, will be explained. A minimum arrangement pitch is, for example, about 260 nm, and a minimum design dimension is, for example, about 170 nm.

Figure 11:
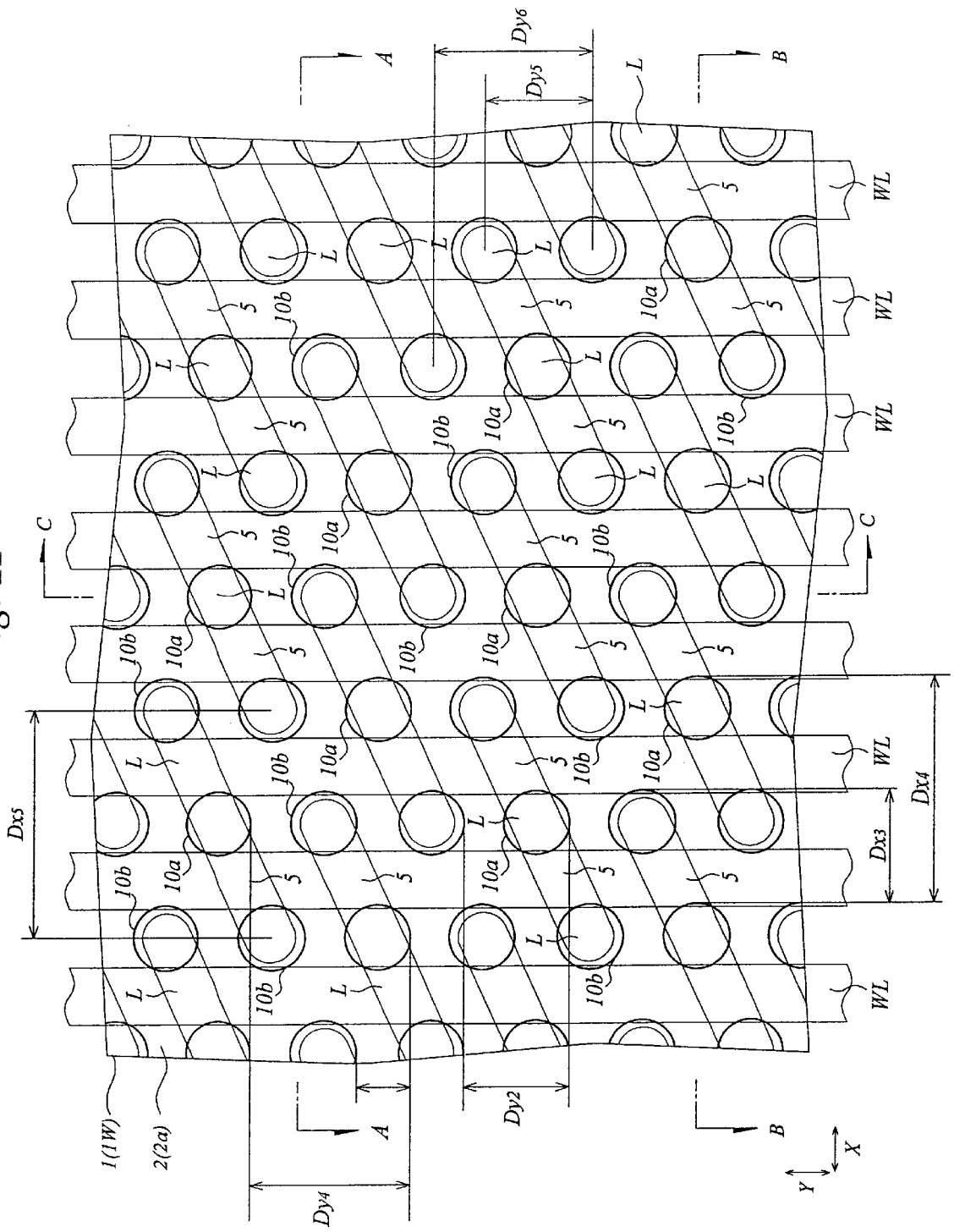
FIG. 11 is a plan view of an essential portion in the manufacturing process of the semiconductor integrated circuit device, which is subsequent to FIGS. 8 to 10.
Figure 12:
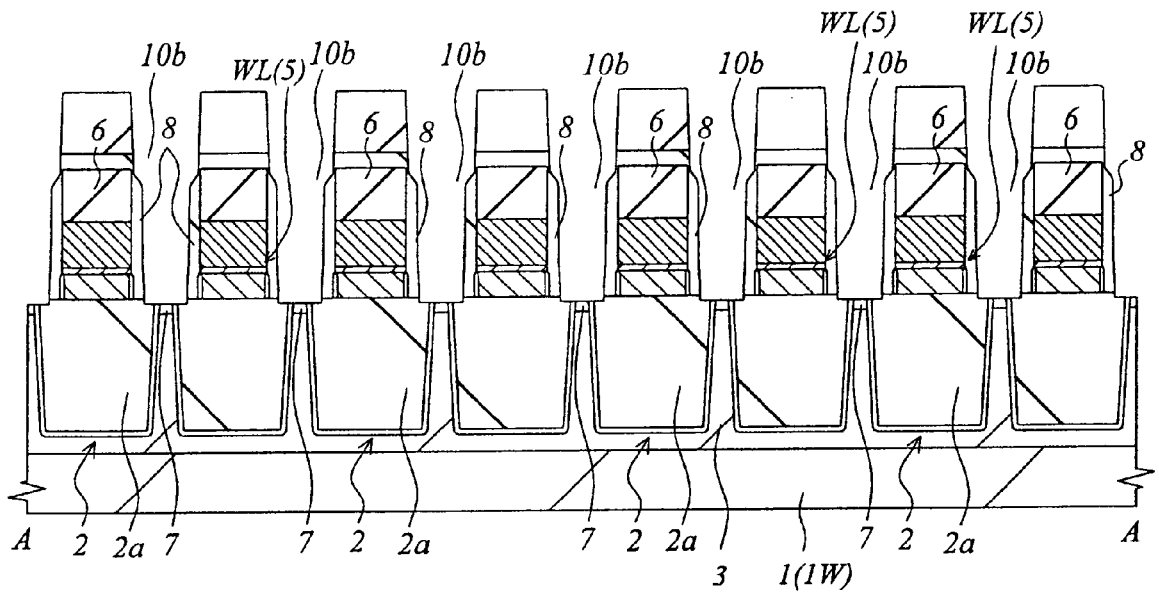
FIG. 12 is a cross-sectional view taken along A—A line of FIG. 11.
Figure 13:
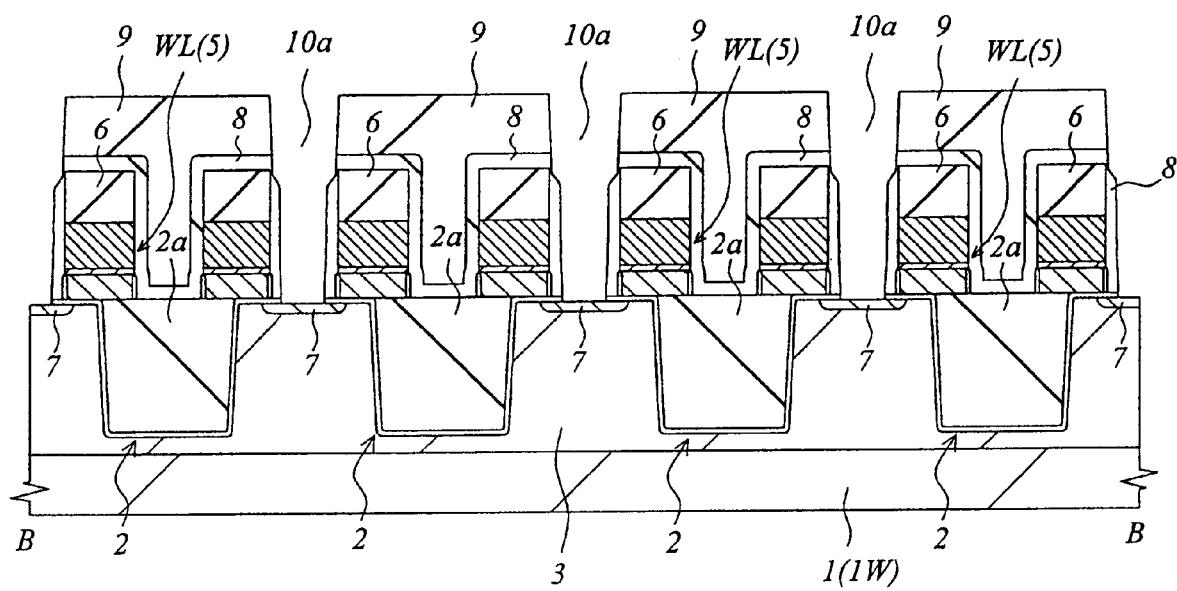
FIG. 13 is a cross-sectional view taken along B—B line of FIG. 11.
Figure 14:
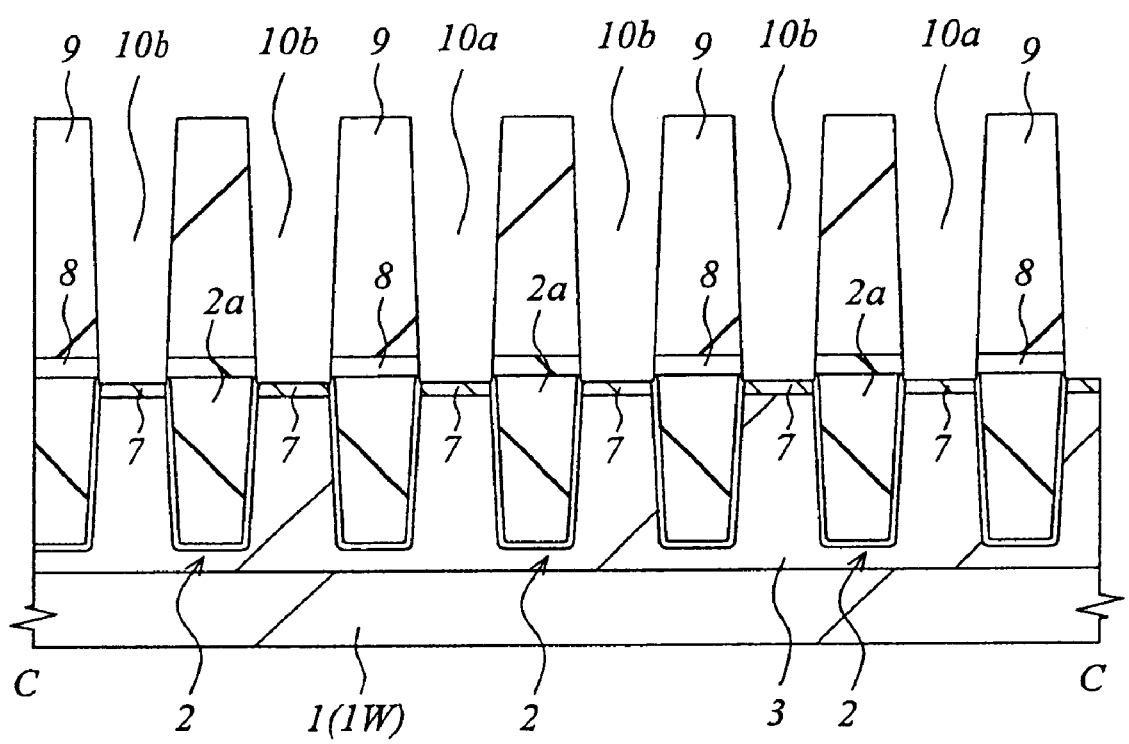
FIG. 14 is a cross-sectional view taken along C—C line of FIG. 11.
Figure 52A:
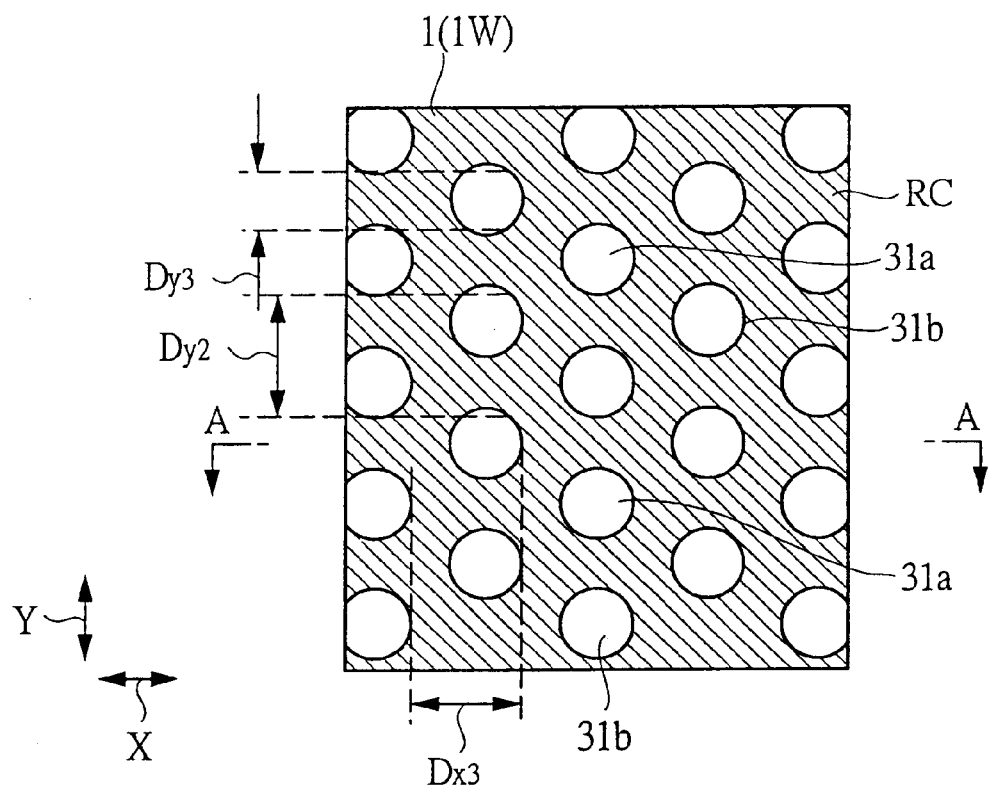
Figure 52B:
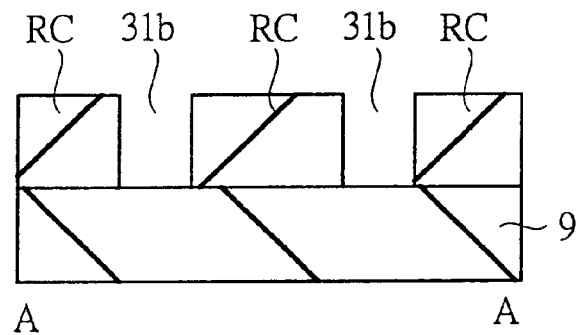
FIG. 52B is a cross-sectional view taken along A—A line of FIG. 52A.

FIG. 52A is a plan view of an essential portion of a photoresist pattern RC for forming the contact holes 10a and 10b shown in FIG. 11 and the like. FIG. 52B is a cross-sectional view taken along line A—A of FIG. 52A. Although FIG. 52A is the plan view, the photoresist pattern RC is hatched so as to easily see the drawing.

As shown in FIG. 52A, apertures 31a and 31b (portions in which the contact holes 10a and 10b are formed) of the photoresist pattern RC are densely arranged like a honeycomb. An arrangement pitch Dx3 is, for example, about 260 nm, and an arrangement pitch Dy2 is, for example, 280 nm, and respective patterns are deviated to 140 nm (=Dy2) per row. In order to transfer such patterns disposed densely, it is necessary to use a Levenson type phase shift mask. However, in the pattern arrangement shown in FIG. 52A, it is impossible to dispose such phase shifters that all the phase differences between the closest patterns become 180 degrees. Therefore, it is necessary to divide the mask pattern into two and transfer the patterns by multiple-exposure.

Accordingly, in the present embodiment, even when the photoresist pattern for forming the patterns of the contact holes 10a and 10b shown in FIG. 11 is formed, a multiple-exposure method is employed in which the positive type photoresist film is used as a photoresist film, and a plurality of mask patterns are superposed on the same position of the positive type photoresist film of the wafer 1W (substrate 1) and exposed.

The contact holes 10a and 10b are separated such that a first pattern group has a dimension and a mask pattern layout capable of using a technique of the Levenson type phase shift mask, and a second pattern group has another pattern other than a pattern included in the first pattern group. More specifically, for example, the first pattern group has defined as a pattern group of contact hole 10b used for the information storage capacity element, and the second pattern group has defined as the contact hole 10a used for the data lines.

Figure 53A:
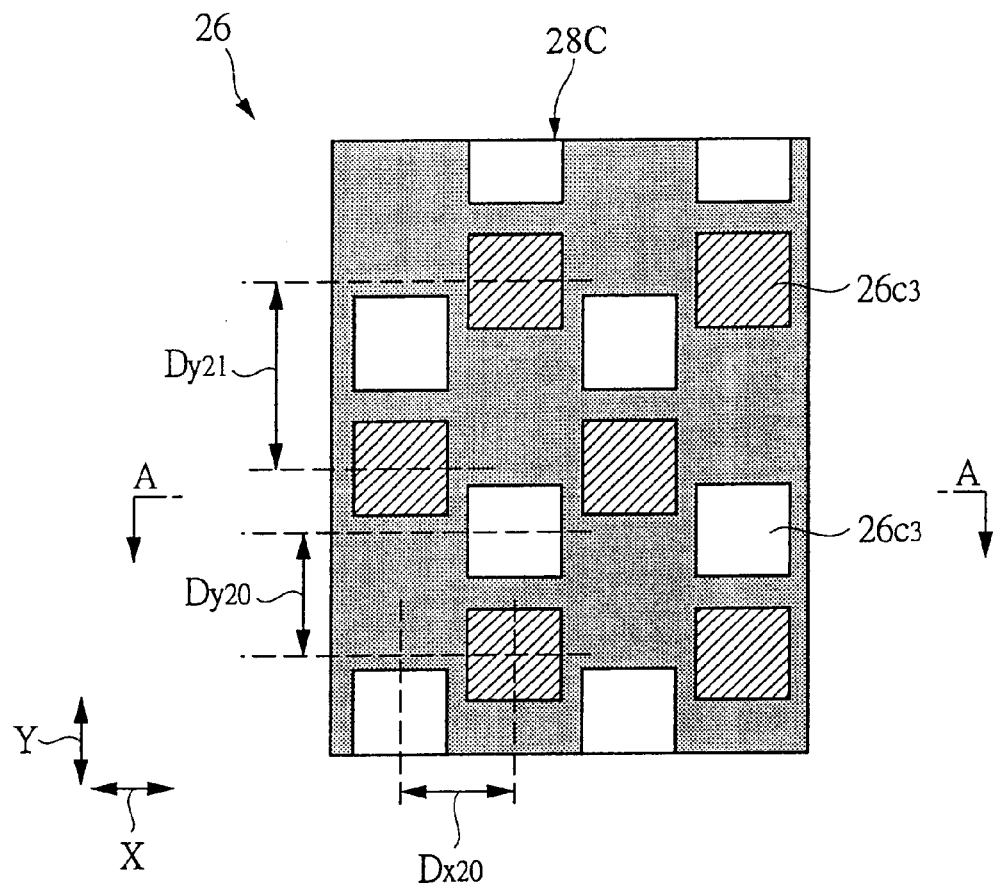
Figure 53B:
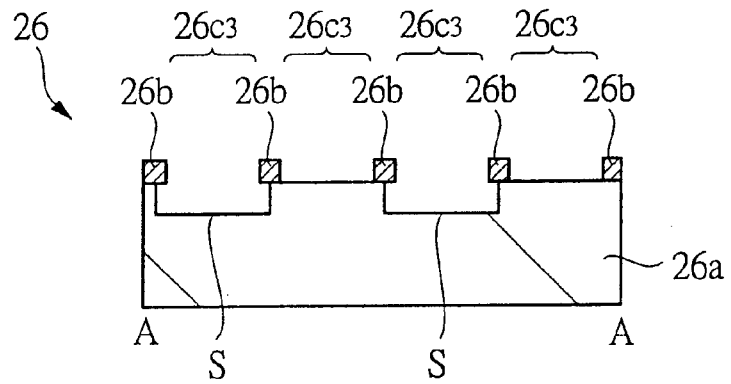
FIG. 53B is a sectional view taken along A—A line of FIG. 53A.

FIGS. 53A and 53B show a first mask pattern 28C of the mask 26 for forming a photoresist pattern for forming the above-mentioned contact holes. FIG. 53A is a plan view of an essential portion of thereof, and FIG. 53B is a cross-sectional view taken along line A—A of FIG. 53A.

The first mask pattern 28C is a pattern for exposing a pattern group of the contact hole 10b for the information storage capacity element, and has, for example, a plurality of light transferring patterns 26c3 formed like a plane square. A plane dimension of each light transferring pattern 26c3 is, for example, about 200×200 nm. The phase shifter S is disposed in any one of adjacent light transferring patterns 26c3, and the phase of the light that passes through each adjacent light transferring pattern 26c3 has thereby a reversion of 180 degrees. Two respective light transferring patterns 26c3 and 26c3 which are disposed along the Y direction and through which phases of the respective transferring lights passing have reversions of 180 degrees are disposed along the X direction so as to be spaced the arrangement pitch Dy21 in the Y direction.

The arrangement pitch Dx20 between the light transferring patterns 26c3 and 26c3 adjacent to each other in the X direction is, for example, about 260 nm (converted to wafer size). The arrangement pitch Dy20 between the light transferring patterns 26c3 and 26c3 adjacent to each other in the Y direction is, for example, about 280 nm (converted to wafer size). The arrangement pitch between the light transferring patterns 26c3 which are adjacent to each other in the Y direction and whose the transferring light has the same phase is, for example, about 420 nm (converted to wafer size). And, respective structures of the light shield pattern 26b and the phase shifter S described in this case are the same as those described above, so that explanation thereof will be omitted.

FIG. 54 schematically shows a case in which only the first mask pattern 28C is exposed on the positive type photoresist film. Regions illuminated by exposure light are hollow, and other regions not illuminated by the exposure light are hatched. Since the photoresist film is positive type, if development treatment thereof is performed (in actual case, development treatment thereof is performed after the multiple exposure), the exposed regions (hollow regions) are removed. By using only the above-mentioned mask pattern 28C, a photoresist pattern R (i.e., a photoresist pattern for forming the first hole pattern) which has only apertures 31b for the contact hole 10b for the information storage capacity element is formed, and the apertures 31a for the contact hole 10a for each data line can not be formed therein. Therefore, it is necessary to prepare a second mask pattern for forming the contact hole 10a for each data line and to superpose the pattern and perform exposure thereof. An arrangement pitch Dx21 between the apertures 31a and 31b adjacent to each other in the X direction is, for example, about 520 nm (converted to wafer size) whose value is twice larger than that the above-mentioned arrangement pitch Dx20.

The present embodiment uses the same pattern as the second mask pattern 28B shown in FIG. 45A, as the second mask pattern for forming the contact hole 10a for the data line.

In the case where a normal mask is used as the second mask pattern, the second mask pattern has a mask pattern layout in which only each main light transferring pattern 26c1 of the second mask pattern 28B shown in FIG. 45A is disposed. If the projection optical image using the second mask pattern on the wafer 1W (substrate 1) is compared with the projection optical image using the second mask pattern 28B shown in FIG. 45, the latter can have better phase shift effect than the former and better optical image having more excellent shape and a dimensional precision.

Figure 55:
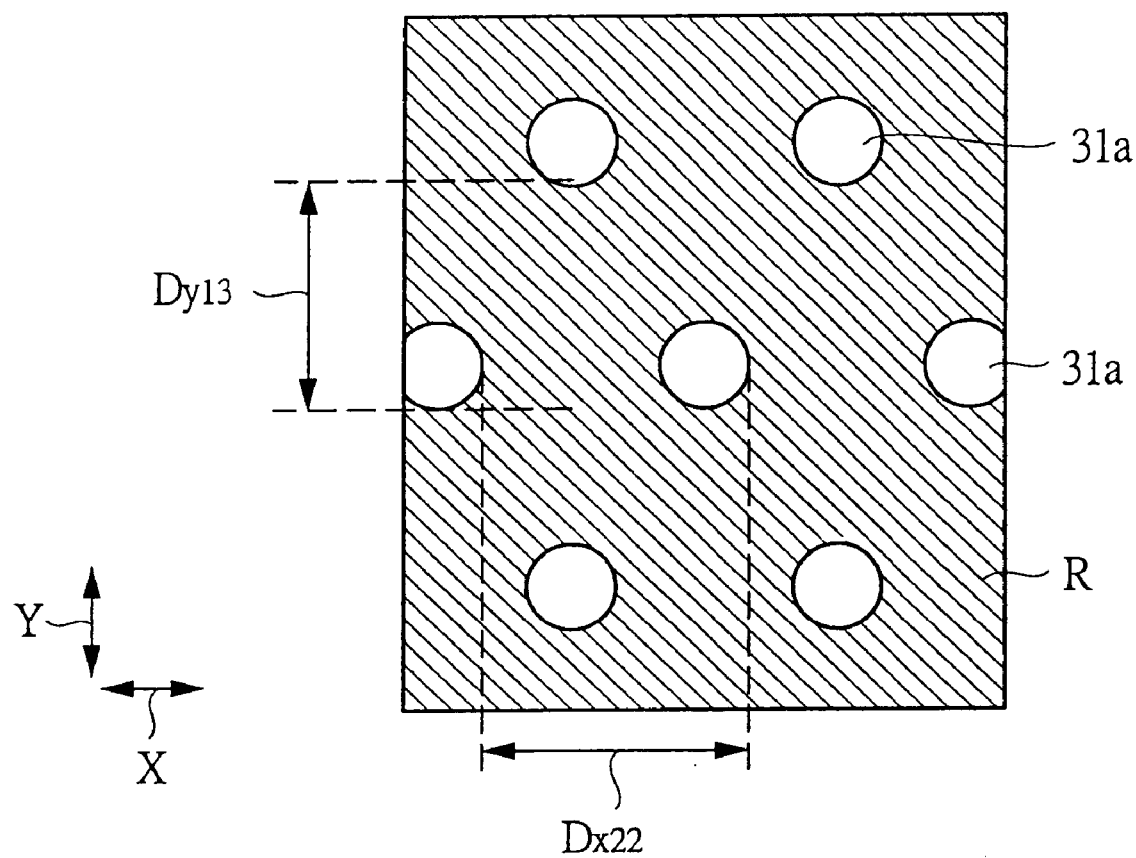
FIG. 55 is a plan view of an essential portion of the photoresist pattern schematically showing a case where only the second mask pattern shown in FIG. 45 is exposed onto a positive photoresist film.

FIG. 55 schematically shows a case in which only the second mask pattern 28B is exposed on the positive type photoresist film. Regions illuminated by exposure light are hollow, and other regions not illuminated by the exposure are hatched. Since the photoresist film is positive type, if development treatment thereof is performed (in actual case, development treatment thereof is performed after the multiple-exposure), the exposed regions (hollow regions) are removed. By using only the above-mentioned second mask pattern 28B, a photoresist pattern R (i.e., a photoresist pattern for forming the second hole pattern) which has only apertures 31a for the contact hole 10a for each data line is formed. An arrangement pitch Dx22 between the apertures 31a and 31a adjacent to each other in the X direction is, for example, about 520 nm (converted to wafer size) whose value is twice larger than the arrangement pitch Dx3.

Therefore, the first mask pattern 28C shown in FIG. 53A and the second mask pattern shown in FIG. 45A are superposed and exposed, and then, by performing the series of treatment such as development, cleaning, drying and the like, the photoresist pattern RC shown in FIG. 52 can be formed.

Figure 56:
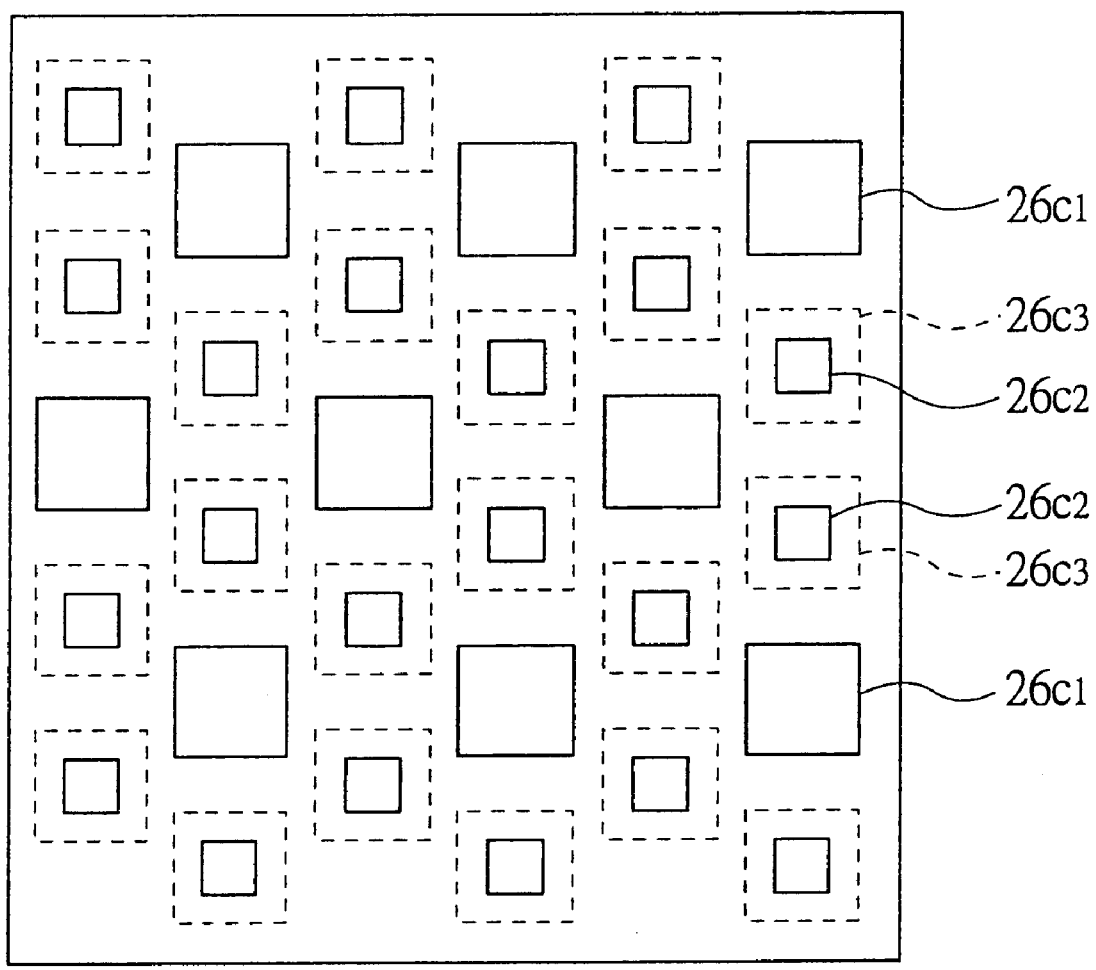
FIG. 56 is an explanatory view showing a state of superposition of both data of the first mask pattern shown in FIG. 53 and the second mask pattern shown in FIG. 45.

FIG. 56 shows the state that data of the first mask pattern 28C and data of the second mask pattern 28B are superposed. One dot lines show the first mask pattern 28C, and solid lines show the second mask pattern 28B. The light transferring pattern 26c3 of the first mask pattern 28A and the auxiliary light transferring pattern 26c2 of the second mask pattern 28B are superposed and disposed. That is, each auxiliary light transferring pattern 26c2 of the second mask pattern 28B is disposed in each light transferring pattern 26c3 of the first mask pattern 28A.

Therefore, in order to form the pattern data of the second mask pattern 28B shown in FIG. 45, the following procedure is performed, for example. Firstly, the pattern data is formed which disposes the light transferring patterns in accordance with the arrangements of the respective contact holes 10a and 10b. At this time, the contact holes 10a and 10b are laid out on other layers (data layers). The contact hole 10b corresponds to the mask pattern 28C of FIG. 53A, and the contact hole 10a corresponds to each light transferring pattern 26c1 of the mask pattern 26 of FIG. 47A. That is, the mask pattern 28c is laid out on a certain layer (data layer), and the mask pattern 26c1 is laid out on anther layer (data layer). And, the data of the first mask pattern 28C of FIG. 53 is calculated to obtain the size of each auxiliary light transferring pattern 26c2, and then both the data and the data disposing the light transferring pattern in accordance with the arrangement of the above-mentioned contact hole 10a are synthesized. By this method, the pattern data of the above-mentioned second mask pattern 28B is formed.

Divisional treatment of the mask pattern data, when the photoresist pattern for forming the contact holes 10a and 10b is exposed by a multi-exposing treatment, will be explained from a view point of the above-mentioned unit cell UC (see FIG. 48), for example, as follows. That is, the data is divided into both data of the light transferring pattern located at a vertex of the unit cell UC, and data of the light transferring pattern disposed in the unit cell UC. The data of the light transferring pattern located at the vertex of the unit cell UC is regarded as data of the light transferring patterns 26c1 transferred on the wafer of the second mask pattern 28B. The data of the light transferring patterns included in the unit cell UC is regarded as data of the first mask pattern 28C.

In the multiple-exposure treatment using such first and second mask patterns 28C and 28B, the entire structure of the mask (see FIG. 50) and method of the multiple-exposure treatment are the same as those described above, and thus explanation thereof will be omitted.

Next, in the manufacturing process of the DRAM, masks used in an exposure treatment other than the treatments described above, will be explained.

Figure 57A:
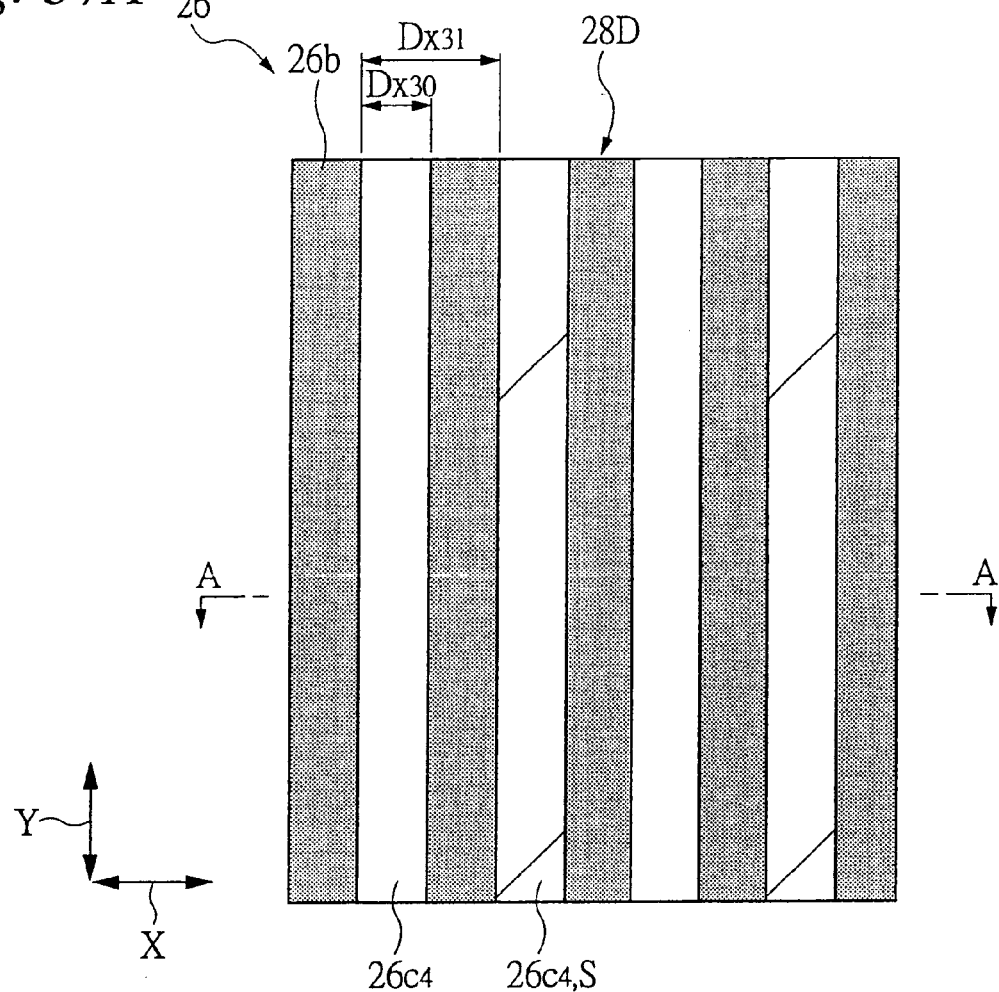
Figure 57B:
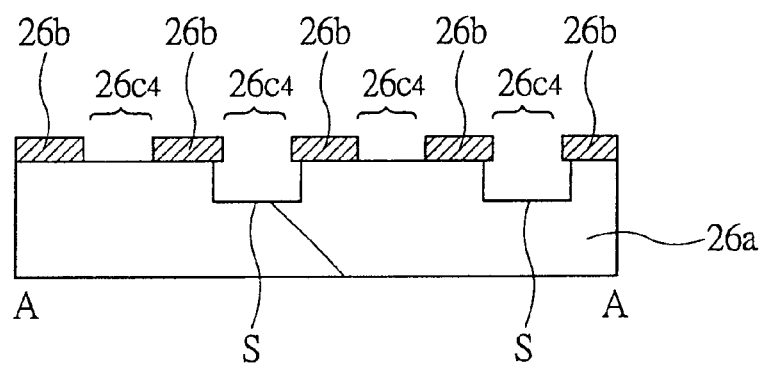
FIG. 57B is a sectional view taken along A—A line of FIG. 57A.

FIG. 57A is a plan view of an essential portion of the mask 26 used at formation of the word line WL (gate electrode 5) shown in FIG. 5 and the like described above, and FIG. 57B is a cross-sectional view taken along line A—A of FIG. 57A. A Levenson type phase shift mask is used in this case. The mask pattern 28D has band-like light shield patterns 26b and light transferring patterns 26c4 extending in the Y direction of FIG. 57A. And, the phase shifter S is disposed in one of the light transferring patterns 26c4 and 26c4 adjacent to each other. A wide dimension Dx30 of each light transferring pattern 26c4 is, for example, about 130 nm (converted to wafer size). A total wide dimension Dx31 of both the light transferring pattern 26c4 and the light shield pattern 26b is, for example, about 260 nm (converted to wafer size). The exposure apparatus and the exposure conditions are the same as those explained in FIG. 38. A negative type resist film is used as a photoresist film.

Figure 58A:
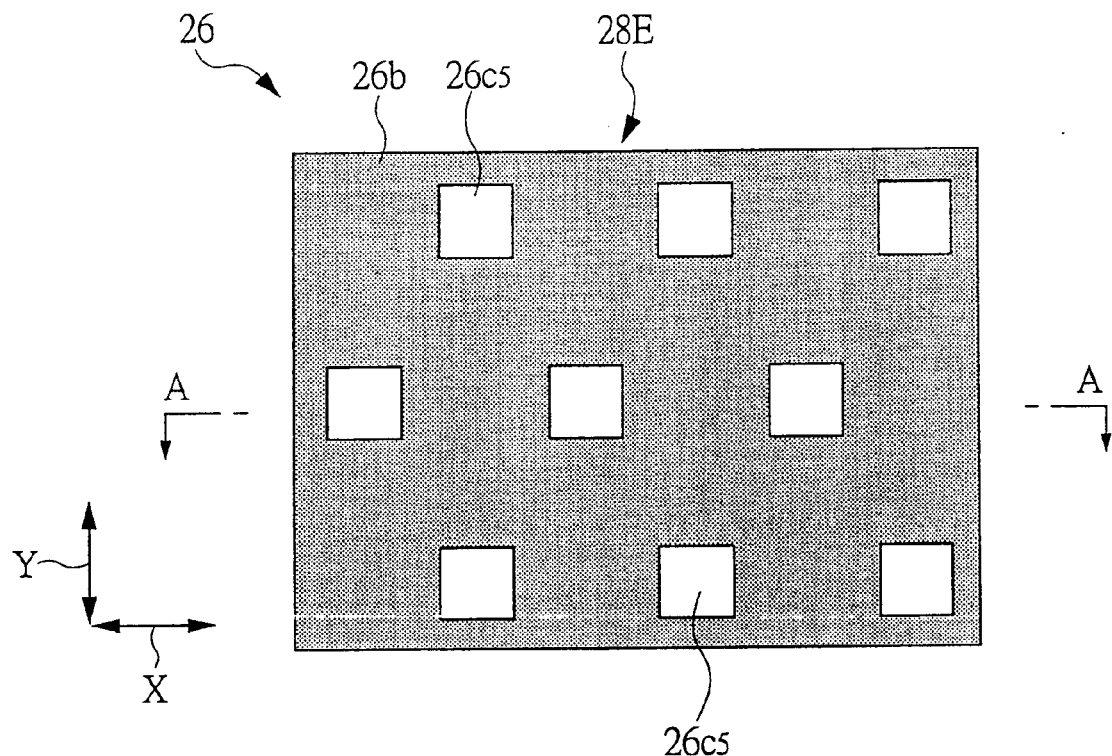
Figure 58B:
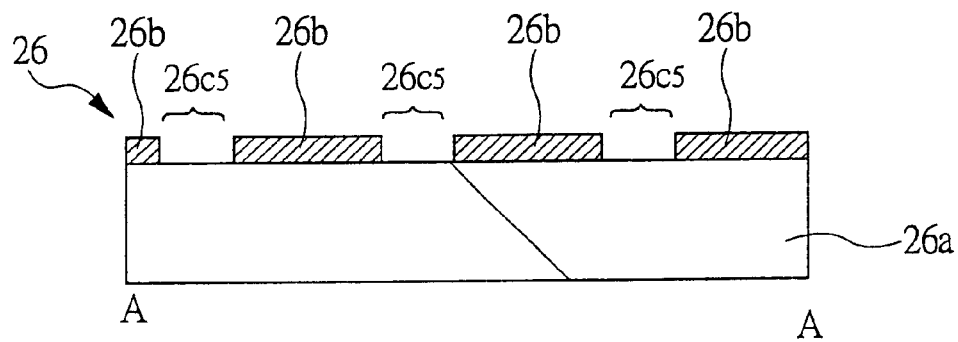
FIG. 58B is a cross-sectional view taken along A—A line of FIG. 58A.

Next, FIG. 58A is a plan view of an essential portion of the mask 26 used at formation of the through holes 13 for the data lines shown in FIG. 17 and the like described above, and FIG. 58B is a cross-sectional view taken along line A—A of FIG. 58A. A halftone type phase shift mask is used in this case. This mask pattern 28E has a plurality of light transferring patterns 26c5, for example, formed like a plane square. A plane dimension of each light transferring pattern 26c5 is, for example, about 220×220 nm (converted to wafer size). The exposure apparatus is the same as one explained in FIG. 38, and, for example, the exposure optical conditions satisfies NA=0.68 and σ=0.30. A positive type resist film is used as a photoresist film.

Figure 59A:
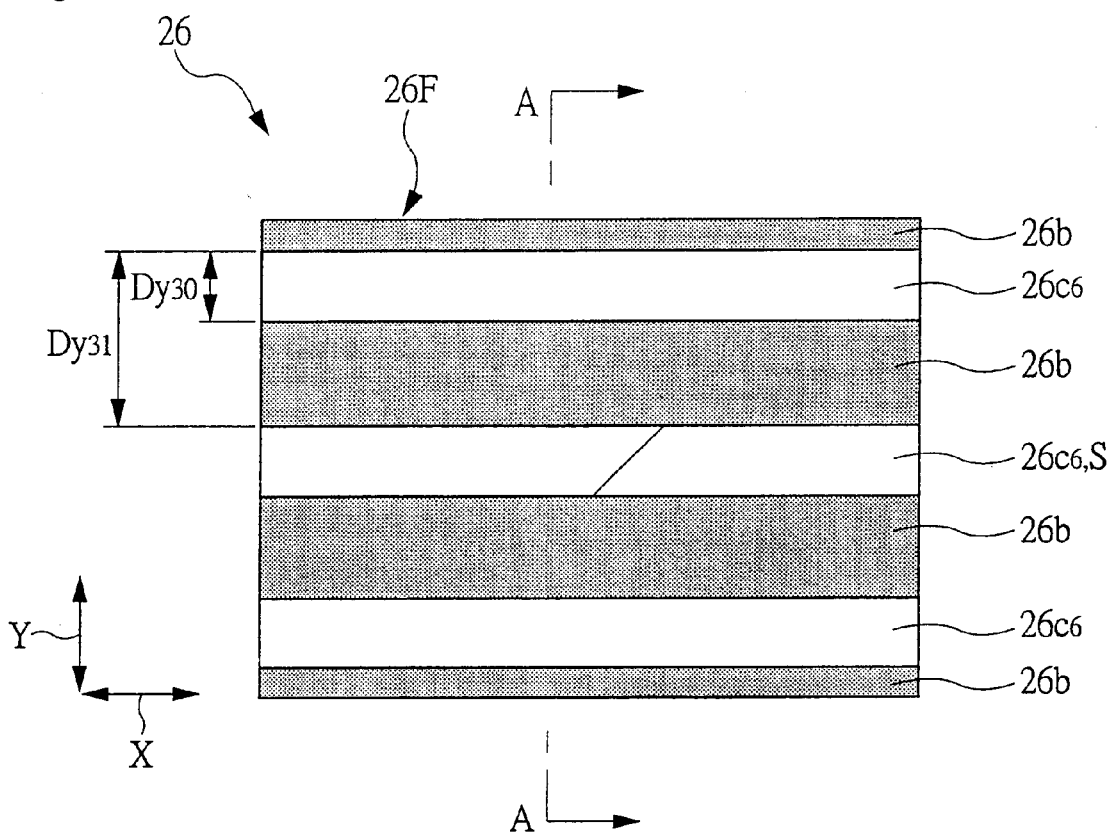
Figure 59B:
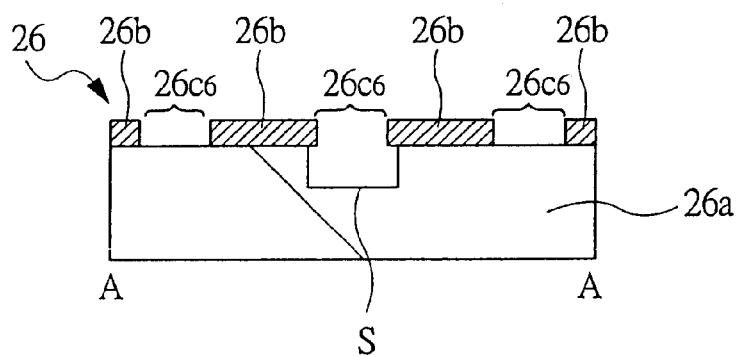
FIG. 59B is a cross-sectional view taken along A—A line of FIG. 59A.

FIG. 59A is a plan view of an essential portion of the mask 26 used at formation of the data lines DL shown in FIG. 21 and the like described above, and FIG. 59B is a cross-sectional view taken along line A—A of FIG. 59A. A Levenson type phase shift mask is used in this case. This mask pattern 28F has band-like light shield patterns 26b and light transferring patterns 26c6 extending in the X direction of FIG. 57A. And, the phase shifter S is disposed in any one of the light transferring patterns 26c6 and 26c6 adjacent to each other. A wide dimension Dx30 of each light transferring pattern 26c6 is, for example, about 170 nm (converted to wafer size), and a total wide dimension Dx31 of the light transferring pattern 26c6 and the light shield pattern 26b is, for example, about 420 nm (converted to wafer size). The exposure apparatus and the exposure conditions are the same as those explained in FIG. 38. A negative type resist film is used as a photoresist film.

Figure 60A:
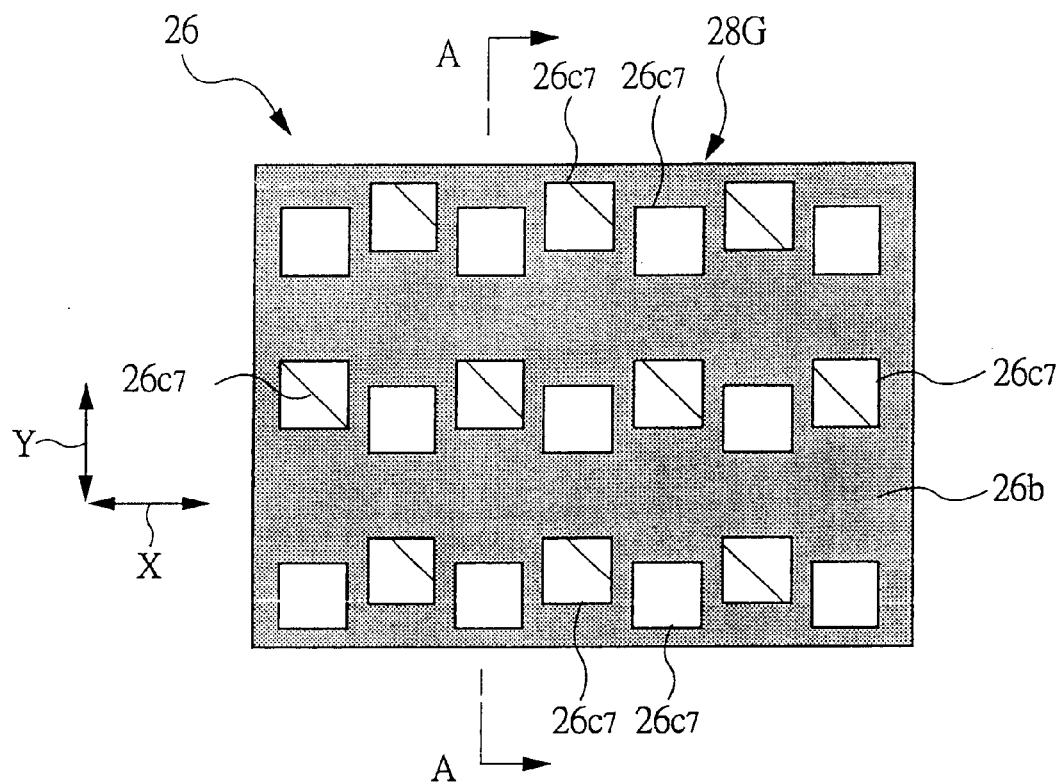
Figure 60B:
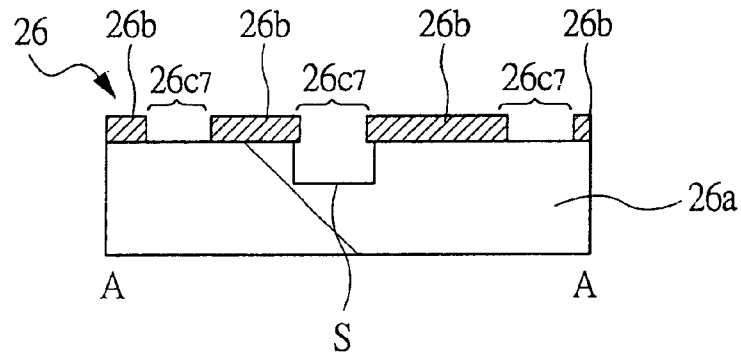
FIG. 60B is a cross-sectional view taken along A—A line of FIG. 60A

Next, FIG. 60A is a plan view of an essential portion of the mask 26 used at formation of the through holes 17 for the information storage capacity element shown in FIG. 25 and the like described above, and FIG. 60B is a cross-sectional view taken along line A—A of FIG. 60A. A Levenson type phase shift mask is used in this case. This mask pattern 28G has a plurality of light transferring patterns 26c7, for example, formed like a plane square. A plane dimension of each light transferring pattern 26c7 is, for example, about 200×200 nm (converted to wafer size). The exposure apparatus is the same as one explained in FIG. 38, and, for example, the exposure optical conditions satisfies NA=0.68 and σ=0.30. A positive type resist film is used as a photoresist film.

Figure 61A:
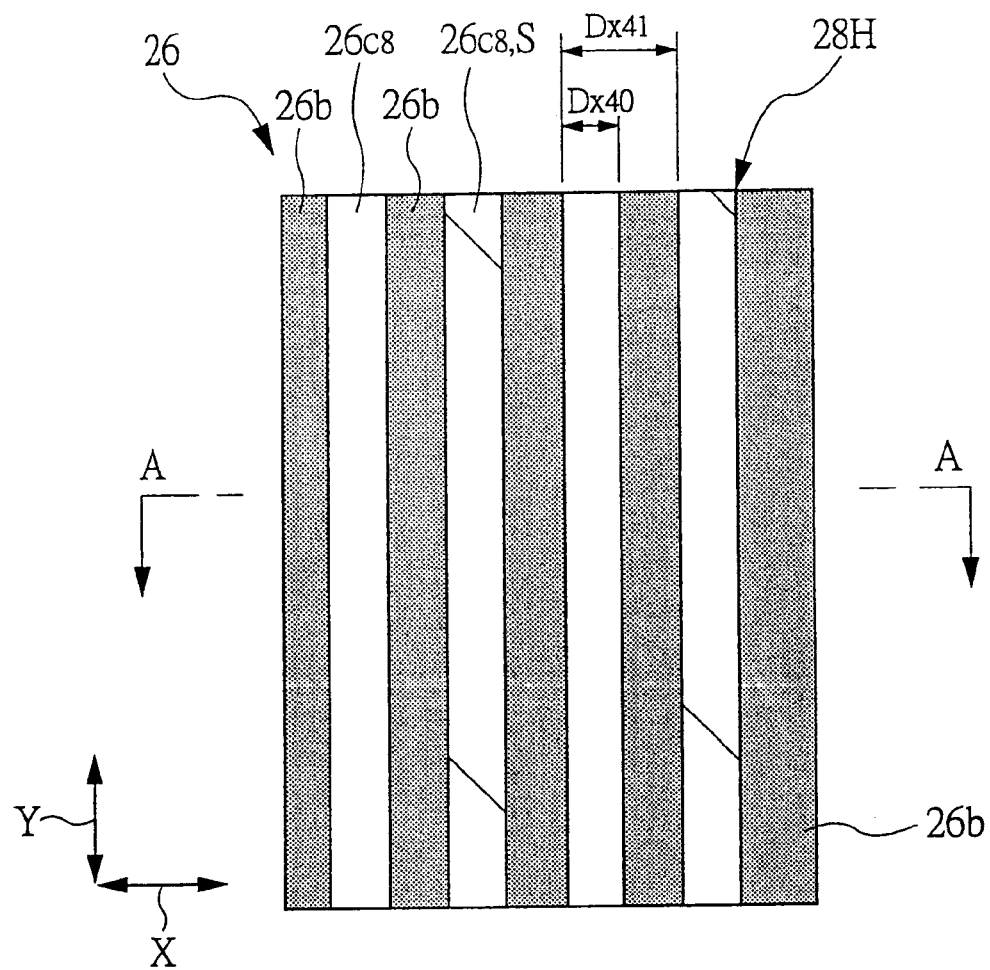
Figure 61B:
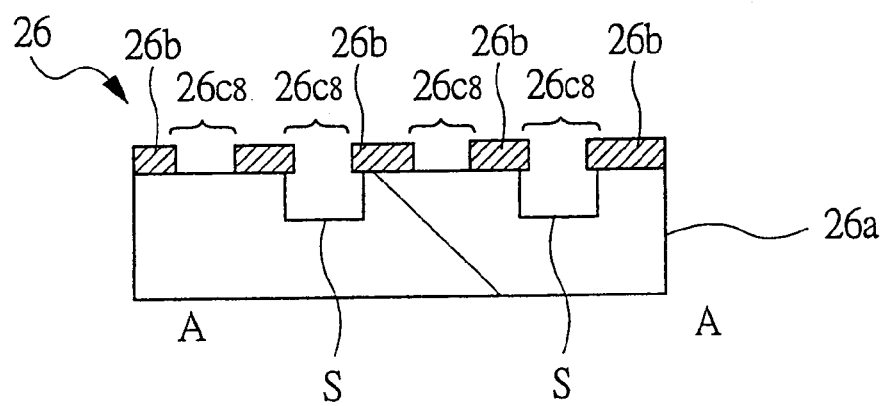
FIG. 61B is a cross-sectional view taken along A—A line of FIG. 61A.

Next, an exposure technique for forming the holes 23 (forming storage capacity patterns) shown in FIG. 34 and the like, will be explained. In this case, the above-mentioned multi-exposure treatment is performed. The first mask pattern is the same as one shown in FIG. 59. However, a wide dimension of each light transferring pattern 26c6 is, for example, about 150 nm (converted to wafer size). On the other hand, FIGS. 61A and 61B show a second pattern 28H. FIG. 61A is a plan view of an essential portion thereof, and FIG. 61B is a cross-sectional view taken along line A—A of FIG. 61A. In this second mask pattern 28H, a technique of the Levenson type phase shift mask is used. The mask pattern 28H has band-like light shield patterns 26b and light transferring patterns 26c8 extending in the Y direction of FIG. 61A. The phase shifter S is disposed in any one of the light transferring patterns 26c8 and 26c8 adjacent to each other. A wide dimension Dx50 of each light transferring pattern 26c8 is, for example, about 130 nm (converted to wafer size), and a total wide dimension Dx41 of the light transferring pattern 26c8 and the light shield pattern 26b is, for example, about 260 nm (converted to wafer size). The exposure apparatus is the same as one explained in FIG. 38, and the exposure optical conditions satisfies NA=0.68 and σ=0.30. A negative type resist film is used as a photoresist film.

Typical effects of this present embodiment will be described as follows.

(1) One semiconductor integrated circuit pattern finely disposed is divided into a plurality of mask patterns, and the plurality of mask patterns is superposed and then exposed. Therefore, by transferring the semiconductor integrated circuit pattern described above onto the wafer, it is possible to transfer the densely disposed semiconductor integrated circuit pattern with sufficient process tolerance.

(2) According to the above-mentioned (1), it is possible to enhance the performance of the semiconductor integrated circuit device.

(3) According to the above-mentioned (1), it is possible to enhance the throughput of production of the semiconductor integrated circuit device.

(4) According to the above-mentioned (3), it is possible to reduce the producing cost of the semiconductor integrated circuit device.

(5) One semiconductor integrated circuit pattern finely disposed is divided into a plurality of mask patterns, and the plurality of mask patterns is superposed and then exposed. Therefore, by transferring the semiconductor integrated circuit pattern described above onto the wafer, it is easy to dispose the phase shifter or the auxiliary light transferring pattern, so that it is possible to easily design and product the mask pattern.

As described above, the invention contrived by the present inventors has been concretely explained on the basis of the embodiments, but the present invention is not limited to the above-mentioned embodiments, and, needless to say, various modifications may be made without departing from the gist thereof.

For example, the present invention has described a case of applying the present invention to the manufacturing method of the DRAM having the cylindrical information storage capacity element, but is not limited thereto. And, the structure of the information storage capacity element can variously be changed.

Furthermore, deformed illumination or the like may be used at the multiple-exposure treatment of above-mentioned embodiments.

As described above, the invention mainly contrived by the inventors has described, which is applied to the DRAM used in the background field of the invention, and the invention is not limited thereto, and the invention may also be applied to a semiconductor integrated circuit device having a memory circuit such as an SRAM (Static Random Access Memory) or flush memory (EEPROM: Electric Erasable Programmable Read Only Memory), a semiconductor integrated circuit device having a logic circuit such as a microprocessor, or a semiconductor integrated circuit device of a mixed type in which the memory circuit and the logic circuit are provided on the same semiconductor substrate.

Following Advantages

Of the inventions disclosed in the present application, effects obtained by typical inventions are described as follows.

(1) A dense pattern is divided into a plurality of mask patterns capable of disposing phase shifters, and the mask patterns are multiple-exposed, and a predetermined pattern is thereby transferred on a semiconductor substrate. Due to this, it is possible to transfer the densely disposed semiconductor integrated circuit pattern with sufficient process tolerance.

(2) A dense pattern is divided into a plurality of mask patterns capable of disposing phase shifters, and the mask patterns are multiple-exposed, and a predetermined pattern is thereby transferred on a semiconductor substrate. Due to this, it is possible to enhance transfer characteristics of the fine and high dense semiconductor integrated circuit pattern.

(3) A dense pattern is divided into a plurality of mask patterns capable of disposing phase shifters, and the mask patterns are multiple-exposed, and a predetermined pattern is thereby transferred on a semiconductor substrate. Due to this, it is possible to achieve the finer and high-density tendencies of the semiconductor integrated circuit pattern.

What is claimed is:

1. A manufacturing method of a semiconductor integrated circuit device comprising the steps of:

(a) depositing a positive type photoresist film on a semiconductor substrate;

(b) exposing a first mask pattern on said positive type photoresist film;

(c) exposing a second mask pattern on said positive type photoresist film so as to be superposed on said first mask pattern;

(d) performing development treatment relative to said positive type resist film after said steps (b) and (c) and thereby forming a photoresist pattern comprising a positive type photoresist pattern on said semiconductor substrate; and (e) performing etching treatment relative to said semiconductor substrate by using said photoresist pattern as a mask and thereby transferring a transferred pattern on said semiconductor substrate, wherein said first mask pattern has a pattern for transferring a line pattern; and wherein said second mask pattern has a plurality of unit cells arranged regularly; and wherein said second mask pattern has:

a plurality of main light transferring patterns for separating said line pattern;

a plurality of auxiliary light transferring patterns disposed such that a distance between each of said main light transferring patterns and each of said auxiliary light transferring patterns becomes the same in a periphery thereof, and formed at such a dimension as not to be transferred on said positive type photoresist film; and a phase shifter disposed in any one of said main light transferring patterns and said auxiliary light transferring patterns and generating a phase difference in a transferring light.

2. The manufacturing method of a semiconductor integrated circuit device according to claim 1, wherein said first mask pattern has:

a plurality of light shield patterns respectively formed like a line;

a pair of light transferring patterns disposed such as to sandwich the plurality of light shield patterns therebetween; and a phase shifter disposed in any one of said pair of light transferring patterns and generating a phase difference in a transferring light.

3. The manufacturing method of a semiconductor integrated circuit device according to claim 1, wherein said auxiliary light transferring patterns arranged around each of said main light transferring patterns are disposed at respective corner portions of a hexagon whose center coincides with a center of each of said main light transferring patterns.

4. The manufacturing method of a semiconductor integrated circuit device according to claim 1,
wherein said auxiliary light transferring patterns arranged around each of said main light transferring patterns are disposed on an axis extending in a first direction passing through a center of each of said main light transferring patterns, and are not disposed on an axis extending in a second direction vertically intersecting relative to said first direction, and are symmetrically disposed relative to the axis extending in said second direction and being regarded as a center line.

5. The manufacturing method of a semiconductor integrated circuit device according to claim 1,
wherein a pitch between said main light transferring patterns adjacent to each other along an axis extending in a first direction is longer than a pitch between said main light transferring patterns adjacent to each other along an axis extending in a second direction vertically intersecting relative to said first direction passing through a center of each of said main light transferring patterns.

6. The manufacturing method of a semiconductor integrated circuit device according to claim 5,
wherein said pitch between said main light transferring patterns adjacent to each other along the axis extending in said second direction is a closest pitch, and
said closest pitch is within a range of $0.66/(\lambda/NA)$ to $0.9/(\lambda/NA)$ converted to a dimension of said semiconductor substrate, where a wavelength of exposure light used in said exposure treatment is $\lambda$ and the numerical aperture of an optical lens of an exposure apparatus is NA.

7. The manufacturing method of a semiconductor integrated circuit device according to claim 1, further comprising a step of performing said exposure treatment by using a photomask forming said first and second mask patterns on the same mask substrate.

8. The manufacturing method of a semiconductor integrated circuit device according to claim 7,
wherein both exposure treatment using said first mask pattern and exposure treatment using said second mask pattern are used as scanning exposure treatment.

9. The manufacturing method of a semiconductor integrated circuit device according to claim 1,
wherein a condition of the exposure treatment using said first mask pattern is the same as a condition of the exposure treatment using said second mask pattern.

10. The manufacturing method of a semiconductor integrated circuit device according to claim 1,
wherein said step (b) performs exposure treatment by using a first photomask on which said first mask pattern is formed, and
wherein said step (c) performs exposure treatment by using a second photomask which is different from said first photomask and on which said second mask pattern is formed.

11. The manufacturing method of a semiconductor integrated circuit device according to claim 10,
wherein both exposure treatment using said first mask pattern and exposure treatment using said second mask pattern are used as scanning exposure treatment.

12. The manufacturing method of a semiconductor integrated circuit device according to claim 1,
wherein said transferred pattern is a pattern provided in an active region of a DRAM.

13. The manufacturing method of a semiconductor integrated circuit device according to claim 12,
wherein an adjacent interval between adjacent patterns disposed in a longitudinal direction of the pattern of said active region is set to be such a dimension that one word line of said DRAM is disposed.

14. The manufacturing method of a semiconductor integrated circuit device according to claim 12,
wherein a longitudinal direction of the pattern of said active region is inclined relative to a longitudinal direction of a word line of said DRAM.

15. The manufacturing method of a semiconductor integrated circuit device according to claim 14, further comprising a step of being laid out after the pattern of said active region is divided into a plurality of rectangular patterns capable of being transferred by one shot of energy beam at the time of laying out the pattern of said active region to a drawing pattern.

16. A manufacturing method of a semiconductor integrated circuit device comprising the steps of:
(a) depositing a positive type photoresist film on a semiconductor substrate;
(b) exposing a first mask pattern on said positive type photoresist film;
(c) exposing a second mask pattern on said positive type photoresist film so as to be superposed on said first mask pattern;
(d) performing development treatment relative to said positive type resist film after said steps (b) and (c) and thereby forming a photoresist pattern comprising a positive type photoresist pattern on said semiconductor substrate; and
(e) performing etching treatment relative to said semiconductor substrate by using said photoresist pattern as a mask and thereby transferring a transferred pattern on said semiconductor substrate,
wherein said first mask pattern has a pattern for transferring a line pattern;
wherein said second mask pattern has a plurality of unit cells arranged regularly; and
wherein each of said plurality of unit cells arranged regularly has:
two main light transferring patterns whose centers are disposed on an axis extending in a first direction;
two main light transferring patterns whose centers are disposed on an axis extending in a second direction intersecting vertically relative to said first direction;
two auxiliary light transferring patterns which are disposed on the axis extending in said first direction and are not disposed on the axis extending in said second direction and being regarded as a center line; and
a phase shifter disposed in any one of said main light transferring pattern and said auxiliary light transferring pattern and generating a phase difference in a transmission light.

17. The manufacturing method of a semiconductor integrated circuit device according to claim 16,
wherein said second mask pattern has:
a plurality of light shield patterns respectively formed like a line;
a pair of light transferring patterns disposed such as to sandwich the plurality of light shield patterns therebetween; and a phase shifter disposed in any one of said pair of light transferring patterns and generating a phase difference in a transferring light.

18. The manufacturing method of a semiconductor integrated circuit device according to claim 16,
wherein a pitch between the main light transferring patterns adjacent to each other along an axis extending in a first direction passing through each of said main light transferring patterns is longer than a pitch between the main light transferring patterns adjacent to each other along an axis extending in a second direction vertically intersecting relative to said first direction passing through a center of each of said main light transferring patterns.

19. The manufacturing method of a semiconductor integrated circuit device according to claim 18,
wherein said pitch between said main light transferring patterns adjacent to each other along the axis extending in said second direction is a closest pitch, and
wherein said closest pitch is within a range of $0.66/(\lambda/NA)$ to $0.9/(\lambda/NA)$ converted to a dimension of said semiconductor substrate, where a wavelength of exposure light used in said exposure treatment is $\lambda$ and the numerical aperture of an optical lens of an exposure apparatus is NA.

20. The manufacturing method of a semiconductor integrated circuit device according to claim 16, further comprising a step of performing said exposure treatment by using a photomask forming said first and second mask patterns on the same mask substrate.

21. The manufacturing method of a semiconductor integrated circuit device according to claim 20,
wherein both exposure treatment using said first mask pattern and exposure treatment using said second mask pattern are used as scanning exposure treatment.

22. The manufacturing method of a semiconductor integrated circuit device according to claim 16,
wherein a condition of the exposure treatment using said first mask pattern is the same as a condition of the exposure treatment using said second mask pattern.

23. The manufacturing method of a semiconductor integrated circuit device according to claim 16,
wherein said step (b) performs exposure treatment by using a first photomask on which said first mask pattern is formed, and
wherein said step (c) performs exposure treatment by using a second photomask which is different from said first photomask and on which said second mask pattern is formed.

24. The manufacturing method of a semiconductor integrated circuit device according to claim 23,
wherein both exposure treatment using said first mask pattern and exposure treatment using said second mask pattern are used as scanning exposure treatment.

25. The manufacturing method of a semiconductor integrated circuit device according to claim 16,
wherein said transferred pattern is a pattern provided in an active region of a DRAM.

26. The manufacturing method of a semiconductor integrated circuit device according to claim 25,
wherein an adjacent interval between adjacent patterns disposed in a longitudinal direction of the pattern of said active region is set to be such a dimension that one word line of said DRAM is disposed.

27. The manufacturing method of a semiconductor integrated circuit device according to claim 25,
wherein a longitudinal direction of the pattern of said active region is inclined relative to a longitudinal direction of a word line of said DRAM.

28. The manufacturing method of a semiconductor integrated circuit device according to claim 27, further comprising a step of being laid out after the pattern of said active region is divided into a plurality of rectangular patterns capable of being transferred by one shot of energy beam at the time of laying out the pattern of said active region to a drawing pattern.

29. A manufacturing method of a semiconductor integrated circuit device comprising the steps of:
(a) depositing a positive type photoresist film on a semiconductor substrate;
(b) exposing a first mask pattern on said positive type photoresist film;
(c) exposing a second mask pattern on said positive type photoresist film so as to be superposed on said first mask pattern;
(d) performing development treatment relative to said positive type resist film after said steps (b) and (c) and thereby forming a photoresist pattern comprising a positive type photoresist pattern on said semiconductor substrate; and
(e) performing etching treatment relative to said semiconductor substrate by using said photoresist pattern as a mask and thereby transferring a hole pattern on an insulative film of said semiconductor substrate,
wherein said first mask pattern has a pattern for transferring a first hole pattern of said hole pattern; and
wherein said second mask pattern has:
a plurality of main light transferring patterns for transferring a second hole pattern of said hole pattern;
a plurality of auxiliary light transferring patterns disposed such that a distance between each of said main light transferring patterns and each of said auxiliary light transferring patterns becomes the same in a periphery thereof, and formed at such a dimension as not to be transferred on said positive type photoresist film; and
a phase shifter disposed in any one of said main light transferring patterns and said auxiliary light transferring patterns and generating a phase difference in a transferring light.

30. The manufacturing method of a semiconductor integrated circuit device according to claim 29,
wherein said first mask pattern has:
a plurality of light shield patterns for transferring said first hole pattern;
a light shield pattern disposed between said plurality of light transferring patterns; and
a phase shifter disposed in any one of said light transferring patterns adjacent to each other and sandwiching said light shield pattern therebetween and generating a phase difference in a transmission light.

31. The manufacturing method of a semiconductor integrated circuit device according to claim 29,
wherein said auxiliary light transferring patterns arranged around each of said main light transferring patterns in said second mask pattern are disposed at respective corner portions of a hexagon whose center coincides with a center of each of said main light transferring patterns.

32. The manufacturing method of a semiconductor integrated circuit device according to claim 29,
wherein said auxiliary light transferring patterns arranged around each of said main light transferring patterns in said second mask pattern are disposed on an axis extending in a first direction passing through a center of each of said main light transferring patterns, and are not disposed on an axis extending in a second direction vertically intersecting relative to said first direction, and are symmetrically disposed relative to the axis extending in said second direction and being regarded as a center line.

33. The manufacturing method of a semiconductor integrated circuit device according to claim 29, wherein a pitch between said main light transferring patterns adjacent to each other along an axis extending in a first direction is longer than a pitch between said main light transferring patterns adjacent to each other along an axis extending in a second direction vertically intersecting relative to said first direction passing through a center of each of said main light transferring patterns.

34. The manufacturing method of a semiconductor integrated circuit device according to claim 33, wherein said pitch between said main light transferring patterns adjacent to each other along the axis extending in said second direction is a closest pitch, and wherein said closest pitch is within a range of $0.66/(\lambda/NA)$ to $0.9/(\lambda/NA)$ converted to a dimension of said semiconductor substrate, where a wavelength of exposure light used in said exposure treatment is $\lambda$ and the numerical aperture of an optical lens of an exposure apparatus is NA.

35. The manufacturing method of a semiconductor integrated circuit device according to claim 29, further comprising a step of performing said exposure treatment by using a photomask forming said first and second mask patterns on the same mask substrate.

36. The manufacturing method of a semiconductor integrated circuit device according to claim 35, wherein both exposure treatment using said first mask pattern and exposure treatment using said second mask pattern are used as scanning exposure treatment.

37. The manufacturing method of a semiconductor integrated circuit device according to claim 29, wherein a condition of the exposure treatment using said first mask pattern is the same as a condition of the exposure treatment using said second mask pattern.

38. The manufacturing method of a semiconductor integrated circuit device according to claim 29, wherein said step (b) performs exposure treatment by using a first photomask on which said first mask pattern is formed, and wherein said step (c) performs exposure treatment by using a second photomask which is different from said first photomask and on which said second mask pattern is formed.

39. The manufacturing method of a semiconductor integrated circuit device according to claim 38, wherein both exposure treatment using said first mask pattern and exposure treatment using said second mask pattern are used as scanning exposure treatment.

40. The manufacturing method of a semiconductor integrated circuit device according to claim 29, wherein an in-hole wiring connected to an information storage capacity element of a DRAM is formed in the first hole pattern of said hole patterns, and wherein an in-hole wiring connected to a data line of the DRAM is formed in second first hole pattern of said hole patterns.

41. A manufacturing method of a semiconductor integrated circuit device comprising the steps of:

(a) depositing a positive type photoresist film on a semiconductor substrate;

(b) exposing a first mask pattern on said positive type photoresist film;

(c) exposing a second mask pattern on said positive type photoresist film so as to be superposed on said first mask pattern;

(d) performing development treatment relative to said positive type resist film after said steps (b) and (c) and thereby forming a photoresist pattern comprising a positive type photoresist pattern on said semiconductor substrate; and (e) performing etching treatment relative to said semiconductor substrate by using said photoresist pattern as a mask and thereby transferring a transferred pattern on said semiconductor substrate, wherein said first mask pattern has a pattern for transferring a line pattern;

wherein said second mask pattern has a plurality of unit cells arranged regularly; and wherein each of said plurality of unit cells has:

two main light transferring patterns each of which is a pattern transferring a second hole pattern of said hole pattern and whose centers are disposed on an axis extending in a first direction;

two main light transferring patterns each of which is a pattern transferring the second hole pattern of said hole pattern and whose centers are disposed on an axis extending in a second direction intersecting vertically relative to said first direction;

two auxiliary light transferring patterns which are disposed on the axis extending in said first direction and are not disposed on the axis extending in said second direction and are symmetrically disposed relative to the axis extending in said second direction and being regarded as a center line; and a phase shifter disposed in any one of said main light transferring pattern and said auxiliary light transferring pattern and generating a phase difference in a transmission light.

42. The manufacturing method of a semiconductor integrated circuit device according to claim 41, wherein said first mask pattern has:

a plurality of light shield patterns for transferring said first hole pattern;

a light shield pattern disposed between said plurality of light transferring patterns; and a phase shifter disposed in any one of said light transferring patterns adjacent to each other and sandwiching said light shield pattern therebetween and generating a phase difference in a transmission light.

* * * * *